US 7,656,612 B2

(12) United States Patent
Sasaki et al.

(10) Patent No.: US 7,656,612 B2
(45) Date of Patent: Feb. 2, 2010

(54) MAGNETIC HEAD HAVING A PATTERNED POLE LAYER

(75) Inventors: Yoshitaka Sasaki, Milpitas, CA (US); Kazuo Ishizaki, Milpitas, CA (US); Hiroyuki Itoh, Milpitas, CA (US)

(73) Assignee: Headway Technologies, Inc., Milpitas, CA (US)

( * ) Notice: Subject to any disclaimer, the term of this patent is extended or adjusted under 35 U.S.C. 154(b) by 583 days.

(21) Appl. No.: 11/443,048

(22) Filed: May 31, 2006

(65) Prior Publication Data

US 2007/0279802 A1    Dec. 6, 2007

(51) Int. Cl.
*G11B 5/127*    (2006.01)
(52) U.S. Cl. .................................. 360/125.14
(58) Field of Classification Search .............. 360/125.1, 360/125.14, 125.2, 125.47, 125.52, 125.6, 360/125.65
See application file for complete search history.

(56) References Cited

U.S. PATENT DOCUMENTS

| | | | |
|---|---|---|---|
| 4,656,546 A | 4/1987 | Mallory | |
| 6,441,995 B1* | 8/2002 | Sasaki | 360/125.65 |
| 6,504,675 B1 | 1/2003 | Shukh et al. | |
| 6,510,024 B2* | 1/2003 | Otsuka et al. | 360/125.5 |
| 6,742,241 B1 | 6/2004 | Sasaki | |
| 7,141,357 B2 | 11/2006 | Sasaki et al. | |
| 2005/0162778 A1 | 7/2005 | Kimura et al. | |
| 2006/0002014 A1 | 1/2006 | Sasaki et al. | |

FOREIGN PATENT DOCUMENTS

| | | |
|---|---|---|
| JP | A-2001-023115 | 1/2001 |
| JP | A-2005-216361 | 8/2005 |
| JP | A-2005-243209 | 9/2005 |

* cited by examiner

*Primary Examiner*—A. J. Heinz
(74) *Attorney, Agent, or Firm*—Oliff & Berridge, PLC

(57) ABSTRACT

The system includes a magnetic head which faces a recording medium. The magnetic head has a coil which generates magnetic fields. The magnetic head also has a pole layer which is formed using a pattern. The pole layer allows magnetic flux generated by the coil to write data onto the recording medium. The pole layer generates a write magnetic field for writing data onto the recording medium.

A photomask is used to form the magnetic head. The photomask includes three regions. The first region has such a perimeter that a projection image thereof is shaped along a perimeter of an ideal shape of the top surface of the pole layer, and the second region touches the first region's perimeter. The third region suppresses deviation of the pole layer from its desired shape which may be caused by the effect of light reflected while the photoresist layer is exposed.

4 Claims, 33 Drawing Sheets

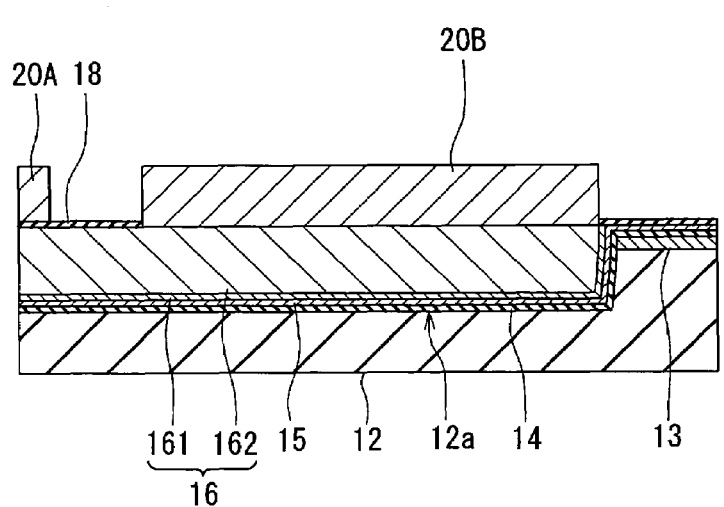
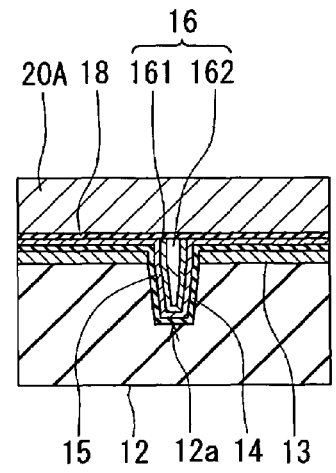
FIG. 15A  FIG. 15B
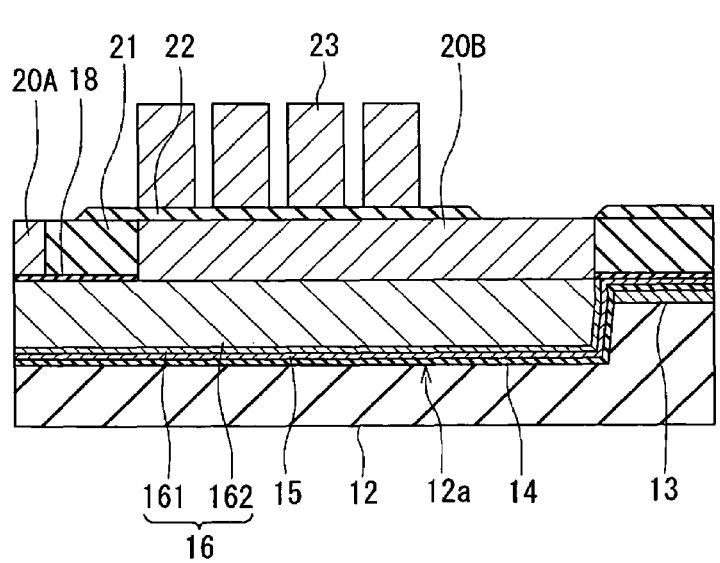
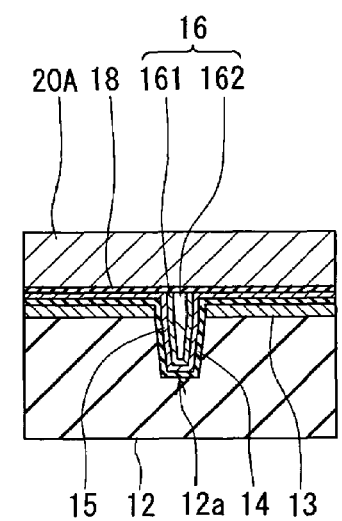
FIG. 16A  FIG. 16B

MAGNETIC HEAD HAVING A PATTERNED POLE LAYER

BACKGROUND OF THE INVENTION

1. Field of the Invention

The present invention relates to a magnetic head that is used for writing data on a recording medium and a method of manufacturing such a magnetic head, and to a method of forming a patterned layer.

2. Description of the Related Art

The recording systems of magnetic read/write devices include a longitudinal magnetic recording system wherein signals are magnetized in the direction along the surface of the recording medium (the longitudinal direction) and a perpendicular magnetic recording system wherein signals are magnetized in the direction orthogonal to the surface of the recording medium. It is known that the perpendicular magnetic recording system is harder to be affected by thermal fluctuation of the recording medium and capable of implementing higher linear recording density, compared with the longitudinal magnetic recording system.

Like magnetic heads for longitudinal magnetic recording, magnetic heads for perpendicular magnetic recording typically used have a structure in which a reproducing (read) head having a magnetoresistive element (that may be hereinafter called an MR element) for reading and a recording (write) head having an induction-type electromagnetic transducer for writing are stacked on a substrate. The write head comprises a pole layer that produces a magnetic field in the direction perpendicular to the surface of the recording medium. The pole layer incorporates a track width defining portion and a wide portion, for example. The track width defining portion has an end located in a medium facing surface that faces toward the recording medium. The wide portion is coupled to the other end of the track width defining portion and has a width greater than the width of the track width defining portion. The track width defining portion has a nearly uniform width.

For the perpendicular magnetic recording system, it is an improvement in recording medium and an improvement in write head that mainly contributes to an improvement in recording density. It is a reduction in track width and an improvement in write characteristics that is particularly required for the write head to achieve higher recording density. On the other hand, if the track width is reduced, the write characteristics, such as an overwrite property that is a parameter indicating an overwriting capability, are degraded. It is therefore required to achieve better write characteristics as the track width is reduced. Here, the length of the track width defining portion taken in the direction orthogonal to the medium facing surface is called a neck height. The smaller the neck height, the better is the overwrite property.

A magnetic head used for a magnetic disk drive such as a hard disk drive is typically provided in a slider. The slider has a medium facing surface that faces toward a recording medium. The medium facing surface has an air-inflow-side end and an air-outflow-side end. The slider slightly flies over the surface of the recording medium by means of the airflow that comes from the air-inflow-side end into the space between the medium facing surface and the recording medium. The magnetic head is typically disposed near the air-outflow-side end of the medium facing surface of the slider. In a magnetic disk drive the magnetic head is aligned through the use of a rotary actuator, for example. In this case, the magnetic head moves over the recording medium along a circular orbit centered on the center of rotation of the rotary actuator. In such a magnetic disk drive, a tilt called a skew of the magnetic head is created with respect to the tangent of the circular track, in accordance with the position of the magnetic head across the tracks.

In a magnetic disk drive of the perpendicular magnetic recording system that exhibits a better capability of writing on a recording medium than the longitudinal magnetic recording system, in particular, if the above-mentioned skew is created, problems arise, such as a phenomenon in which data stored on an adjacent track is erased when data is written on a specific track (that is hereinafter called adjacent track erase) or unwanted writing is performed between adjacent two tracks. To achieve higher recording density, it is required to suppress adjacent track erasing. Unwanted writing between adjacent two tracks affects detection of servo signals for alignment of the magnetic head and the signal-to-noise ratio of a read signal.

A technique is known for preventing the problems resulting from the skew as described above, as disclosed in U.S. Pat. No. 6,504,675 B1 and U.S. Patent Application Publication No. US2006/0002014 A1, for example. According to this technique, the end face of the pole layer located in the medium facing surface is made to have a shape in which the side located backward along the direction of travel of the recording medium (that is, the side located closer to the air inflow end of the slider) is shorter than the opposite side.

As a magnetic head for perpendicular magnetic recording, a magnetic head comprising the pole layer and a shield is also known, as disclosed in U.S. Pat. No. 4,656,546 and U.S. Patent Application Publication No. US2006/0002014 A1, for example. In the medium facing surface of this magnetic head, an end face of the shield is located forward of the end face of the pole layer along the direction of travel of the recording medium with a specific small space therebetween. Such a magnetic head will be hereinafter called a shield-type head. In the shield-type head the shield has a function of preventing a magnetic flux from reaching the recording medium, the flux being generated from the end face of the pole layer and extending in directions except the direction orthogonal to the surface of the recording medium. In addition, the shield has a function of returning a magnetic flux that has been generated from the end face of the pole layer and has magnetized the recording medium. The shield-type head achieves a further improvement in linear recording density.

Typically, the pole layer is patterned through the use of photolithography. For example, to form the pole layer by frame plating, a frame made of a photoresist layer patterned by photolithography is formed, and the pole layer is formed in this frame by plating. After forming the pole layer by frame plating in such a manner, the track width is reduced in some cases by etching both side portions of the track width defining portion through dry etching such as ion beam etching. When the pole layer is formed by patterning a magnetic layer by etching, an etching mask made of a photoresist layer patterned by photolithography is formed on the magnetic layer, and the magnetic layer is selectively etched using the mask to form the pole layer.

In the course of manufacturing process of magnetic heads, a number of magnetic head elements to be the magnetic heads are formed in a single substrate (wafer). The substrate in which the magnetic head elements are formed is cut such that the surface to be the medium facing surfaces appears. This surface is then polished to form the medium facing surfaces.

When the pole layer is patterned through the use of photolithography as previously described, it is likely that the patterned resist layer goes out of a desired shape due to the effects of, for example, reflection of light off the base layer when the photoresist layer is exposed. Consequently, it is also likely that the pole layer goes out of a desired shape. In particular, it is likely that portions of the side portions of the pole layer near the boundary between the track width defining portion and the wide portion go out of desired shapes.

Reference is now made to FIG. 42 to describe a first problem resulting from a deviation of the pole layer from its desired shape. FIG. 42 illustrates an example of shape of the top surface of the pole layer. FIG. 42 illustrates a neighborhood of the boundary between a track width defining portion 201 and a wide portion 202 of the pole layer before the medium facing surface is formed. In FIG. 42 'ABS' indicates a region in which the medium facing surface is to be formed, 'TW' indicates the physical track width, and 'NH' indicates the neck height as designed.

When the pole layer is patterned through the use of photolithography, as previously described, it is likely that the pole layer goes out of a desired shape. As a result, particularly when the neck height NH is small, it is likely that the track width defining portion 201 forms a shape in which the width increases as the distance from the medium facing surface increases, as shown in FIG. 42.

When the track width defining portion 201 has a shape as shown in FIG. 42, the neck height is strictly the length between the region ABS and the point at which the width of the track width defining portion 201 starts to be greater than the width thereof taken in the region ABS. However, if the neck height is thus defined, it is difficult to precisely determine the neck height when the track width defining portion 201 has the shape as shown in FIG. 42. Therefore, the neck height is defined as will be described below when the track width defining portion 201 has the shape as shown in FIG. 42. In the top surface of the pole layer, the intersection point of imaginary lines L11 and L12 is defined as P. The imaginary line L11 passes through the intersection point of the region ABS and the side portion of the track width defining portion 201, and extends in the direction orthogonal to the region ABS. The imaginary line L12 extends from a straight line portion of the side portion of the wide portion 202 connected to the side portion of the portion 201 and extends in the direction in which the straight line portion extends. The distance between the region ABS and the intersection point P is defined as the neck height. The neck height as thus defined is nearly equal to the neck height NH as designed.

When the track width defining portion 201 has the shape as shown in FIG. 42, if the location of the medium facing surface goes out of a desired location and the neck height then goes out of a desired value, there is a possibility that the physical track width TW is out of a desired value, too.

An example of method of manufacturing magnetic heads will now be described. First, components of a plurality of magnetic heads are formed on a single substrate to fabricate a magnetic head substructure in which a plurality of rows of pre-head portions that will be the magnetic heads later are aligned. Next, the magnetic head substructure is cut to fabricate a head aggregate including a single row of the pre-head portions. Next, a surface formed in the head aggregate by cutting the magnetic head substructure is polished (lapped) to form the medium facing surfaces of the pre-head portions that the head aggregate includes. Next, flying rails are formed in the medium facing surfaces. Next, the head aggregate is cut so that the pre-head portions are separated from one another, and the magnetic heads are thereby formed.

An example of method of forming the medium facing surfaces by lapping the head aggregate will now be described. In the method the head aggregate is lapped so that the MR heights of a plurality of pre-head portions are made equal while the resistances of a plurality of MR elements that the head aggregate includes are detected. The MR height is the length of each of the MR elements taken in the direction orthogonal to the medium facing surface.

According to the method of forming the medium facing surfaces as described above, it is possible to form the medium facing surfaces so that the MR heights are of a desired value. As a result, according to the method, a portion of each medium facing surface at which an end of the MR element is exposed is placed at a desired location. Furthermore, if the angle formed between the medium facing surface and the top surface of the substrate is 90 degrees, a portion of the medium facing surface at which an end face of the track width defining portion is exposed is placed at a desired location, too. As a result, the neck height is of a desired value, too.

In prior art, however, the angle formed between the medium facing surface and the top surface of the substrate is other than 90 degrees in some cases. This is caused by a misalignment between the head aggregate and a jig that supports the head aggregate when the aggregate is lapped. If the angle formed between the medium facing surface and the top surface of the substrate is other than 90 degrees, the portion of the medium facing surface at which the end face of the track width defining portion is exposed is placed at a location other than the desired location even though the portion of the medium facing surface at which the end of the MR element is exposed is placed at the desired location. As a result, the neck height is of a value other than the desired value. In FIG. 42 the range indicated with numeral 203 shows a range of variations in location of the portion of the medium facing surface at which the end face of the track width defining portion is exposed.

As previously described, if the neck height is of a value other than the desired value, the physical track width is of a value other than the desired value, too. As thus described, the problem is that there are some cases in prior art in which the portion of the medium facing surface at which the end face of the track width defining portion is exposed is placed at a location other than the desired location, and the physical track width is of a value other than the desired value, accordingly. As a result, the yield of magnetic heads is reduced. The smaller the desired neck height, the more noticeable is this problem.

A second problem resulting from a deviation of the pole layer from its desired shape will now be described. In a region near the boundary between adjacent ones of the tracks of the recording medium, magnetic signals written on each of the tracks are weakened by the effect of magnetic signals written on each of the adjacent ones of the tracks. One of write characteristics of a magnetic head is a signal-to-noise ratio (that may be hereinafter referred to as an SN ratio) obtained in a state in which magnetic signals are written on a plurality of adjacent tracks. The smaller the width of the above-mentioned region near the boundary between adjacent ones of the tracks in which the magnetic signals are weakened, the greater is the SN ratio. On the contrary, the greater the width of this region, the smaller is the SN ratio.

The physical track width of the magnetic head is defined by the width of the end face of the track width defining portion located in the medium facing surface. Typically, the effective track width corresponding to the width of the region in which magnetic signals are actually written on the recording medium is greater than the physical track width. Here, the greater the difference between the effective track width and the physical track width, the greater is the above-mentioned region near the boundary between adjacent ones of the tracks in which the magnetic signals are weakened. The above-mentioned SN ratio is thereby reduced.

The difference between the effective track width and the physical track width greatly varies depending on the shape of the pole layer. In particular, if the shape of the track width defining portion 201 is such one that the width increases as the distance from the medium facing surface increases as shown in FIG. 42, the difference between the effective track width and the physical track width increases, and the above-mentioned SN ratio is thereby reduced. This is the second problem resulting from a deviation of the pole layer from its desired shape. This problem becomes more noticeable, too, as the desired neck height is reduced.

A method called optical proximity correction (hereinafter referred to as OPC) has been known as a method of making the shape of a resist layer patterned by photolithography closer to a desired one. For the OPC, a photomask used for exposing an unpatterned resist layer is such one that the shape of the boundary between a translucent portion and a light-tight portion is adjusted. However, even though the OPC is employed in prior art, it is difficult to form the shapes of the portions of the side portions of the pole layer near the boundary between the track width defining portion and the wide portion with higher precision.

OBJECTS AND SUMMARY OF THE INVENTION

It is a first object of the invention to provide a magnetic head incorporating a pole layer which is shaped with higher precision and to provide a method of manufacturing such a magnetic head.

It is a second object of the invention to provide a method of forming a patterned layer that is capable of forming a patterned layer shaped with higher precision.

A magnetic head of the invention comprises: a medium facing surface that faces toward a recording medium; a coil for generating a magnetic field corresponding to data to be written on the recording medium; and a pole layer having an end face located in the medium facing surface, allowing a magnetic flux corresponding to the field generated by the coil to pass therethrough, and generating a write magnetic field for writing the data on the recording medium.

The pole layer has a first surface and a second surface that face toward opposite directions. The first surface has a first edge and a second edge that extend in a direction intersecting the medium facing surface. The space between the first and second edges in the medium facing surface defines the track width. The first edge includes: a first curved portion; and a first straight portion that is contiguous to the first curved portion and is located farther from the medium facing surface than the first curved portion. The second edge includes: a second curved portion; and a second straight portion that is contiguous to the second curved portion and is located farther from the medium facing surface than the second curved portion. The space between the first and second curved portions and the space between the first and second straight portions increase as the distance from the medium facing surface increases.

In the invention it is assumed that: an imaginary straight line that passes through an intersection point of the first edge and the medium facing surface and extends in the direction orthogonal to the medium facing surface is defined as L1; an imaginary straight line that passes through an intersection point of the second edge and the medium facing surface and extends in the direction orthogonal to the medium facing surface is defined as L2; an imaginary straight line that extends from the first straight portion toward the medium facing surface in the direction along the first straight portion is defined as L3; an imaginary straight line that extends from the second straight portion toward the medium facing surface in the direction along the second straight portion is defined as L4; an intersection point of the straight lines L1 and L3 is defined as P1; an intersection point of the straight lines L2 and L4 is defined as P2; and an imaginary straight line that passes through the points P1 and P2 is defined as L5.

The straight line L5 is located parallel to the medium facing surface on the first surface. The first curved portion is off the straight lines L1 and L3 so as to intersect the straight line L5 at a point along an extension of a line segment connecting the point P1 to the point P2. The second curved portion is off the straight lines L2 and L4 so as to intersect the straight line L5 at a point along the extension of the line segment connecting the point P1 to the point P2. The distance from the straight line L5 to a connecting point between the first curved portion and the first straight portion and the distance from the straight line L5 to a connecting point between the second curved portion and the second straight portion each fall within a range of 10 to 50 nm inclusive.

Here, it is assumed that an ideal shape of the first surface is such a shape that the first edge extends along the straight lines L1 and L3 so as to pass through the point P1, and the second edge extends along the straight lines L2 and L4 so as to pass through the point P2. In the magnetic head of the invention, in the first surface, the distance from the straight line L5 to the connecting point between the first curved portion and the first straight portion and the distance from the straight line L5 to the connecting point between the second curved portion and the second straight portion each fall within a range of 10 to 50 nm inclusive. This means that the shape of the first surface of the magnetic head of the invention is close to the above-mentioned ideal shape.

In the magnetic head of the invention, the first edge may further include a third straight portion that connects the first curved portion to the medium facing surface, and the second edge may further include a fourth straight portion that connects the second curved portion to the medium facing surface. Each of an angle formed by the third straight portion with respect to the straight line L1 and an angle formed by the fourth straight portion with respect to the straight line L2 is 5 degrees or smaller. In this case, the distance from the straight line L5 to the medium facing surface may fall within a range of 10 to 200 nm inclusive. In addition, each of the distance from the medium facing surface to a connecting point between the first curved portion and the third straight portion and the distance from the medium facing surface to a connecting point between the second curved portion and the fourth straight portion may fall within a range of 10 to 190 nm inclusive.

In the magnetic head of the invention, the first edge may further include a fifth straight portion that is contiguous to the first straight portion and located farther from the medium facing surface than the first straight portion, and the second edge may further include a sixth straight portion that is contiguous to the second straight portion and located farther from the medium facing surface than the second straight portion. In this case, an angle formed by the first straight portion with respect to the direction orthogonal to the medium facing surface is greater than an angle formed by the fifth straight portion with respect to the direction orthogonal to the medium facing surface, and an angle formed by the second straight portion with respect to the direction orthogonal to the medium facing surface is greater than an angle formed by the sixth straight portion with respect to the direction orthogonal to the medium facing surface.

In the magnetic head of the invention, the write magnetic field generated by the pole layer may be one used for writing data on the recording medium by means of a perpendicular magnetic recording system.

A magnetic head manufactured by a method of manufacturing a magnetic head of the invention comprises: a medium facing surface that faces toward a recording medium; a coil for generating a magnetic field corresponding to data to be written on the recording medium; and a pole layer having an end face located in the medium facing surface, allowing a magnetic flux corresponding to the field generated by the coil to pass therethrough, and generating a write magnetic field for writing the data on the recording medium.

The pole layer has a first surface and a second surface that face toward opposite directions. The first surface has a first edge and a second edge that extend in a direction intersecting the medium facing surface. The space between the first and second edges in the medium facing surface defines the track width. The first edge includes a first straight portion that is located away from the medium facing surface. The second edge includes a second straight portion that is located away from the medium facing surface. The space between the first and second straight portions increases as the distance from the medium facing surface increases.

In the invention it is assumed that: an imaginary straight line that passes through an intersection point of the first edge and the medium facing surface and extends in a direction orthogonal to the medium facing surface is defined as L1; an imaginary straight line that passes through an intersection point of the second edge and the medium facing surface and extends in the direction orthogonal to the medium facing surface is defined as L2; an imaginary straight line extends from the first straight portion toward the medium facing surface in a direction along the first straight portion is defined as L3; an imaginary straight line that extends from the second straight portion toward the medium facing surface in a direction along the second straight portion is defined as L4; an intersection point of the straight lines L1 and L3 is defined as P1; an intersection point of the straight lines L2 and L4 is defined as P2; and an imaginary straight line that passes through the points P1 and P2 is defined as L5. The straight line L5 is located parallel to the medium facing surface on the first surface.

The method of manufacturing the magnetic head of the invention comprises the steps of: forming a photoresist layer unpatterned; selectively exposing through the use of a photomask the photoresist layer unpatterned; forming a pattern for forming the pole layer by developing the photoresist layer after the exposure; forming the pole layer through the use of the pattern; and forming the coil.

The photomask includes: a first region having such a perimeter that part of a projection image thereof is shaped along the first and second straight portions of the first surface of the pole layer to be formed; a second region touching the perimeter of the first region and located outside the first region; and a third region located inside the first region without touching the perimeter of the first region. Each of the second and third regions has a property different from that of the first region with regard to a property of allowing light for exposure to pass or intercepting light for exposure.

According to the method of manufacturing the magnetic head of the invention, the photomask includes the third region so that it is possible to precisely form the pattern for forming the pole layer.

In the method of the invention, the photoresist layer may be of positive type, the first region may have a property of allowing light for exposure to pass, and each of the second and third regions may have a property of intercepting light for exposure. Alternatively, the photoresist layer may be of negative type, the first region may have a property of intercepting light for exposure, and each of the second and third regions may have a property of allowing light for exposure to pass.

In the method of the invention, the second region may have a plurality of portions whose projection images are to protrude inward from locations of the first and second edges of the first surface of the pole layer to be formed.

In the magnetic head manufactured by the method of the invention, the first edge may further include a first curved portion that is contiguous to the first straight portion and located closer to the medium facing surface than the first straight portion, and the second edge may further include a second curved portion that is contiguous to the second straight portion and is located closer to the medium facing surface than the second straight portion. In this case, the space between the first and second curved portions increases as the distance from the medium facing surface increases. The first curved portion is off the straight lines L1 and L3 so as to intersect the straight line L5 at a point along an extension of a line segment connecting the point P1 to the point P2. The second curved portion is off the straight lines L2 and L4 so as to intersect the straight line L5 at a point along the extension of the line segment connecting the point P1 to the point P2. The distance from the straight line L5 to a connecting point between the first curved portion and the first straight portion and the distance from the straight line L5 to a connecting point between the second curved portion and the second straight portion each fall within a range of 10 to 50 nm inclusive.

The first edge may further include a third straight portion that connects the first curved portion to the medium facing surface, and the second edge may further include a fourth straight portion that connects the second curved portion to the medium facing surface. Each of an angle formed by the third straight portion with respect to the straight line L1 and an angle formed by the fourth straight portion with respect to the straight line L2 is 5 degrees or smaller. In this case, the distance from the straight line L5 to the medium facing surface may fall within a range of 10 to 200 nm inclusive. Each of the distance from the medium facing surface to a connecting point between the first curved portion and the third straight portion and the distance from the medium facing surface to a connecting point between the second curved portion and the fourth straight portion may fall within a range of 10 to 190 nm inclusive.

The first edge may further include a fifth straight portion that is contiguous to the first straight portion and located farther from the medium facing surface than the first straight portion, and the second edge may further include a sixth straight portion that is contiguous to the second straight portion and located farther from the medium facing surface than the second straight portion. In this case, an angle formed by the first straight portion with respect to the direction orthogonal to the medium facing surface is greater than an angle formed by the fifth straight portion with respect to the direction orthogonal to the medium facing surface, and an angle formed by the second straight portion with respect to the direction orthogonal to the medium facing surface is greater than an angle formed by the sixth straight portion with respect to the direction orthogonal to the medium facing surface.

In the method of the invention, the third region may have a portion whose projection image is to be located in a region between locations of the first and second straight portions of the first surface of the pole layer to be formed.

The write magnetic field generated by the pole layer may be one used for writing data on the recording medium by means of a perpendicular magnetic recording system.

A method of forming a patterned layer of the invention comprises the steps of: forming a photoresist layer unpatterned; selectively exposing through the use of a photomask the photoresist layer unpatterned; forming a pattern for forming the patterned layer by developing the photoresist layer after the exposure; and forming the patterned layer through the use of the pattern.

The photomask includes: a first region having such a perimeter that part of a projection image thereof is shaped along part of a perimeter of the patterned layer to be formed; a second region touching the perimeter of the first region and located outside the first region; and a third region located inside the first region without touching the perimeter of the first region. Each of the second and third regions has a property different from that of the first region with regard to a property of allowing light for exposure to pass or intercepting light for exposure.

According to the method of forming the patterned layer of the invention, the photomask includes the third region so that it is possible to precisely form the pattern for forming the patterned layer.

In the method of forming the patterned layer of the invention, the photoresist layer may be of positive type, the first region may have a property of allowing light for exposure to pass, and each of the second and third regions may have a property of intercepting light for exposure. Alternatively, the photoresist layer may be of negative type, the first region may have a property of intercepting light for exposure, and each of the second and third regions may have a property of allowing light for exposure to pass.

In the method of forming the patterned layer of the invention, the second region may have a portion whose projection image is to protrude inward from a location of the perimeter of the patterned layer to be formed.

In the magnetic head of the invention, in the first surface of the pole layer, the distance from the straight line L5 to the connecting point between the first curved portion and the first straight portion and the distance from the straight line L5 to the connecting point between the second curved portion and the second straight portion each fall within a range of 10 to 50 nm inclusive. As a result, according to the invention, it is possible to implement a magnetic head incorporating the pole layer shaped with higher precision in which the first surface has a nearly ideal shape.

According to the method of manufacturing the magnetic head of the invention, the photomask includes the third region so that it is possible to precisely form the pattern for forming the pole layer. It is thereby possible to manufacture the magnetic head incorporating the pole layer shaped with higher precision.

According to the method of forming the patterned layer of the invention, the photomask includes the third region so that it is possible to precisely form the pattern for forming the patterned layer. It is thereby possible to form the patterned layer shaped with higher precision.

Other and further objects, features and advantages of the invention will appear more fully from the following description.

BRIEF DESCRIPTION OF THE DRAWINGS

FIG. 15A and FIG. 15B are views for illustrating a step that follows the step shown in FIG. 14A and FIG. 14B.

FIG. 16A and FIG. 16B are views for illustrating a step that follows the step shown in FIG. 15A and FIG. 15B.

DETAILED DESCRIPTION OF THE PREFERRED EMBODIMENTS

First Embodiment

Figure 1:
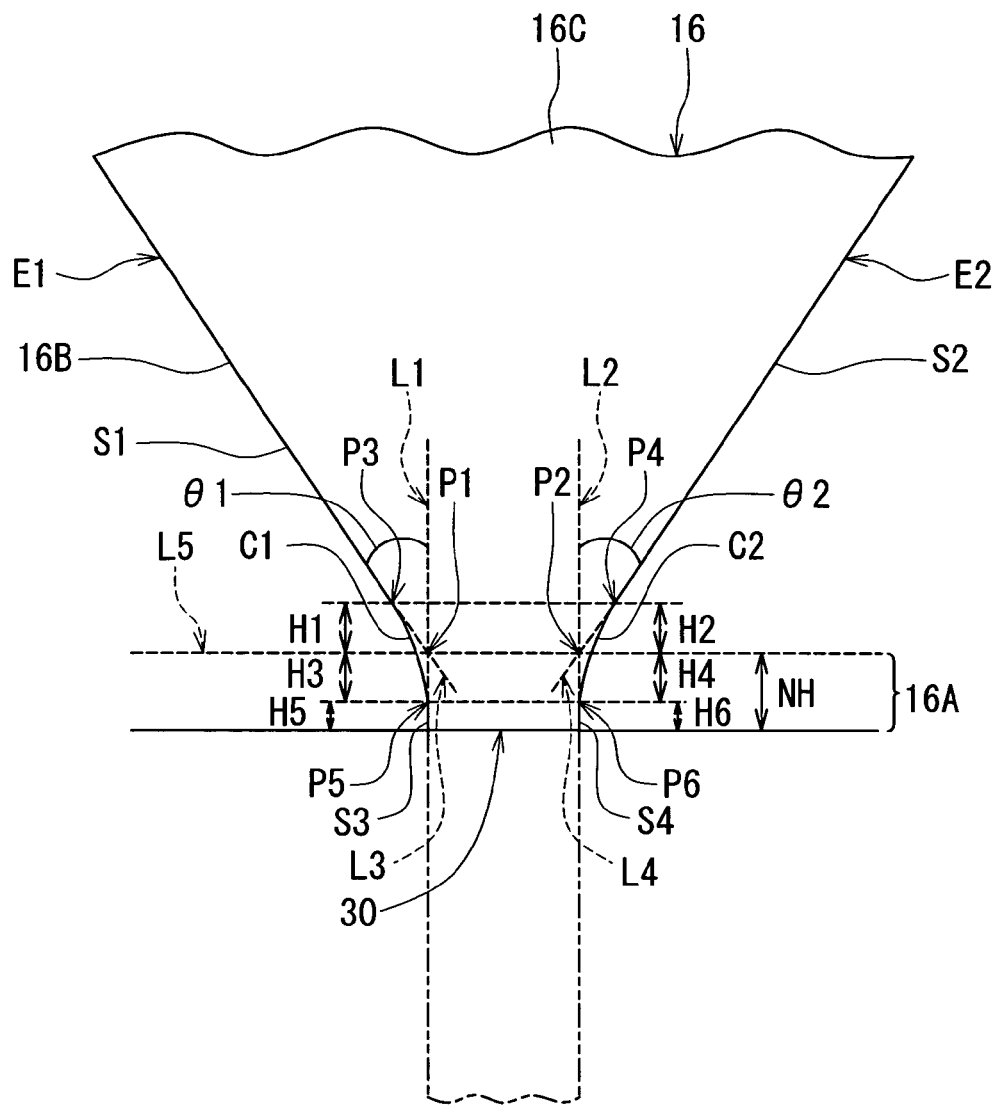
FIG. 1 is a top view illustrating a portion of a pole layer of a magnetic head of a first embodiment of the invention.
Figure 2:
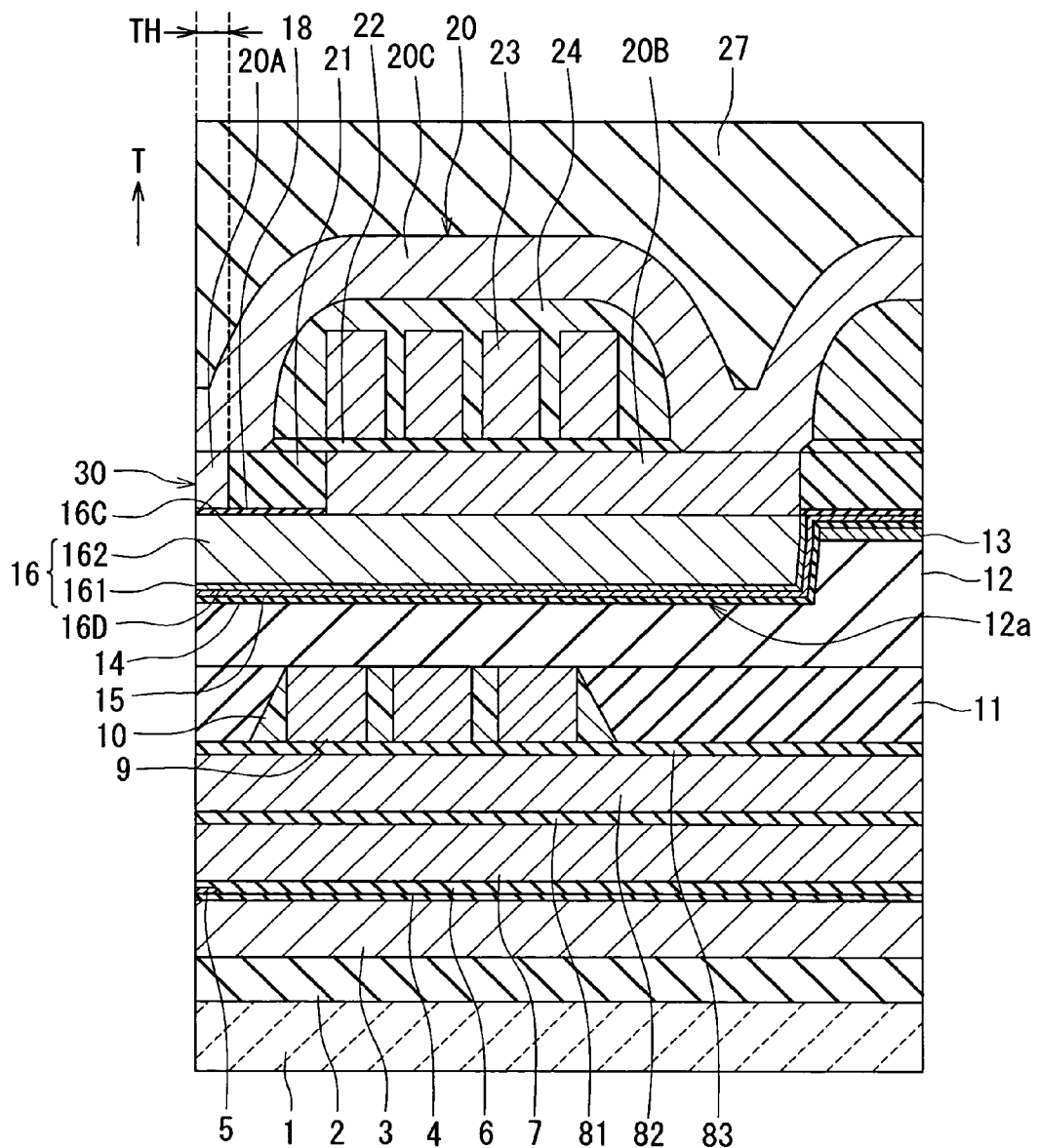
FIG. 2 is a cross-sectional view illustrating the configuration of the magnetic head of the first embodiment of the invention.
Figure 3:
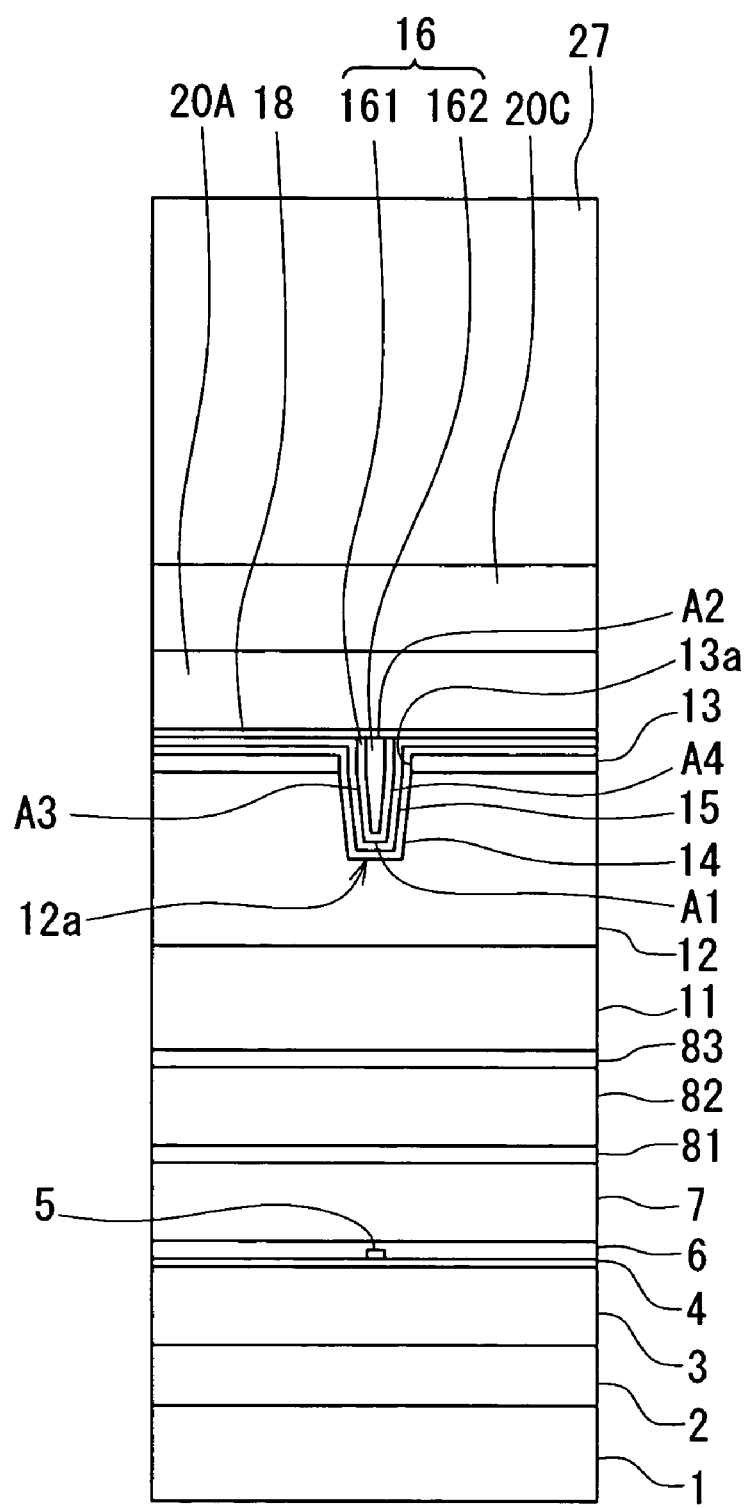
FIG. 3 is a front view of the medium facing surface of the magnetic head of the first embodiment of the invention.
Figure 4:
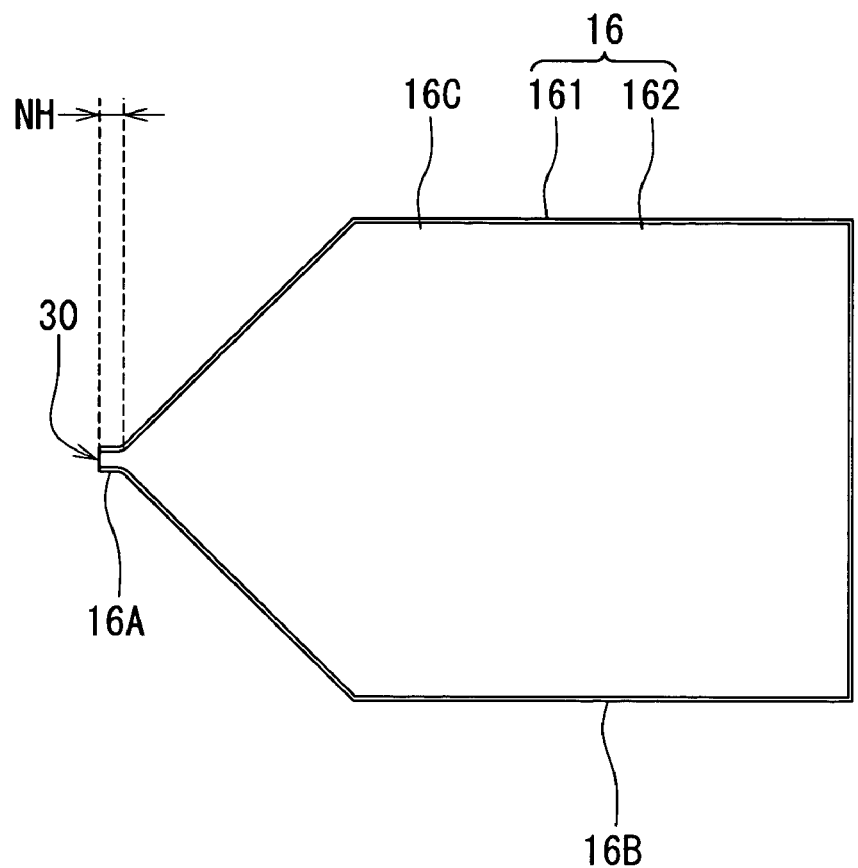
FIG. 4 is a top view of the pole layer of the magnetic head of the first embodiment of the invention.

Preferred embodiments of the invention will now be described in detail with reference to the accompanying drawings. Reference is first made to FIG. 1 to FIG. 4 to describe the configuration of a magnetic head of a first embodiment of the invention. The magnetic head of the first embodiment is a magnetic head for perpendicular magnetic recording. FIG. 1 is a top view illustrating a portion of a pole layer of the magnetic head of the first embodiment. FIG. 2 is a cross-sectional view illustrating the configuration of the magnetic head of the embodiment. FIG. 2 illustrates a cross section orthogonal to the medium facing surface and a surface of a substrate. The arrow indicated with T in FIG. 2 shows the direction of travel of a recording medium. FIG. 3 is a front view of the medium facing surface of the magnetic head of the embodiment. FIG. 4 is a top view of the pole layer of the magnetic head of the embodiment.

As shown in FIG. 2 and FIG. 3, the magnetic head for perpendicular magnetic recording (hereinafter simply called the magnetic head) of the embodiment comprises: a substrate 1 made of a ceramic such as aluminum oxide and titanium carbide ($Al_2O_3$—TiC); an insulating layer 2 made of an insulating material such as alumina ($Al_2O_3$) and disposed on the substrate 1; a bottom shield layer 3 made of a magnetic material and disposed on the insulating layer 2; a bottom shield gap film 4 that is an insulating film disposed on the bottom shield layer 3; a magnetoresistive (MR) element 5 as a read element disposed on the bottom shield gap film 4; a top shield gap film 6 that is an insulating film disposed on the MR element 5; and a first top shield layer 7 made of a magnetic material and disposed on the top shield gap film 6.

The MR element 5 has an end that is located in the medium facing surface 30 that faces toward a recording medium. The MR element 5 may be an element made of a magneto-sensitive film that exhibits a magnetoresistive effect, such as an anisotropic magnetoresistive (AMR) element, a giant magnetoresistive (GMR) element, or a tunnel magnetoresistive (TMR) element. The GMR element may be of a current-in-plane (CIP) type wherein a current used for detecting magnetic signals is fed in the direction nearly parallel to the plane of each layer making up the GMR element, or may be of a current-perpendicular-to-plane (CPP) type wherein a current used for detecting magnetic signals is fed in the direction nearly perpendicular to the plane of each layer making up the GMR element.

The magnetic head further comprises a nonmagnetic layer 81 and a second top shield layer 82 that are disposed on the first top shield layer 7 one by one. The nonmagnetic layer 81 is made of a nonmagnetic material such as alumina. The second top shield layer 82 is made of a magnetic material. The portions from the bottom shield layer 3 to the second top shield layer 82 make up a read head.

The magnetic head further comprises: an insulating layer 83 made of an insulating material and disposed on the second top shield layer 82; a coil 9 disposed on the insulating layer 83; an insulating layer 10 made of an insulating material and disposed around the coil 9 and in the space between the respective adjacent turns of the coil 9; and an insulating layer 11 made of an insulating material and disposed around the insulating layer 10. The coil 9 is flat-whorl-shaped. The coil 9 and the insulating layers 10 and 11 have flattened top surfaces. The insulating layers 83 and 11 are made of alumina, for example. The insulating layer 10 is made of photoresist, for example. The coil 9 is made of a conductive material such as copper.

The magnetic head further comprises an encasing layer 12 made of a nonmagnetic material and disposed on the flattened top surfaces of the coil 9 and the insulating layers 10 and 11. The encasing layer 12 has a groove 12a that opens in the top surface thereof and that accommodates a pole layer described later. The encasing layer 12 may be made of an insulating material such as alumina, silicon oxide ($SiO_x$), or silicon oxynitride (SiON), or a nonmagnetic metal material such as Ru, Ta, Mo, Ti, W, NiCu, NiB or NiPd.

The magnetic head further comprises a nonmagnetic metal layer 13 made of a nonmagnetic metal material and disposed on the top surface of the encasing layer 12. The nonmagnetic metal layer 13 has an opening 13a that penetrates, and the edge of the opening 13a is located directly above the edge of the groove 12a in the top surface of the encasing layer 12. The nonmagnetic metal layer 13 may be made of any of Ta, Mo, W, Ti, Ru, Rh, Re, Pt, Pd, Ir, NiCr, NiP, NiPd, NiB, $WSi_2$, $TaSi_2$, $TiSi_2$, TiN, and TiW, for example.

The magnetic head further comprises a nonmagnetic film 14, a polishing stopper layer 15 and the pole layer 16 that are disposed in the groove 12a of the encasing layer 12 and in the opening 13a of the nonmagnetic metal layer 13. The nonmagnetic film 14 is disposed to touch the surface of the groove 12a. The pole layer 16 is disposed apart from the surface of the groove 12a. The polishing stopper layer 15 is disposed between the nonmagnetic film 14 and the pole layer 16. The polishing stopper layer 15 also functions as a seed layer used for forming the pole layer 16 by plating. The pole layer 16 incorporates: a first layer 161 located closer to the surface of the groove 12a; and a second layer 162 located farther from the surface of the groove 12a. The first layer 161 may be omitted, however.

The nonmagnetic film 14 is made of a nonmagnetic material. The material of the nonmagnetic film 14 may be an insulating material or a semiconductor material, for example. The insulating material as the material of the nonmagnetic film 14 may be any of alumina, silicon oxide ($SiO_x$), and silicon oxynitride (SiON). The semiconductor material as the material of the nonmagnetic film 14 may be polycrystalline silicon or amorphous silicon.

The polishing stopper layer 15 is made of a nonmagnetic conductive material. The material of the polishing stopper layer 15 may be the same as that of the nonmagnetic metal layer 13.

Each of the first layer 161 and the second layer 162 is made of a magnetic metal material. The first layer 161 may be made of any of CoFeN, CoNiFe, NiFe, and CoFe, for example. The second layer 162 may be made of any of NiFe, CoNiFe and CoFe, for example.

The magnetic head further comprises a gap layer 18 made of a nonmagnetic material and disposed on portions of the top surfaces of the polishing stopper layer 15 and the pole layer 16. The gap layer 18 has an opening located at a distance from the medium facing surface 30. The gap layer 18 may be made of an insulating material such as alumina or a nonmagnetic metal material such as Ru, NiCu, Ta, W, NiB or NiPd.

The magnetic head further comprises a shield layer 20. The shield layer 20 has: a first layer 20A disposed adjacent to the gap layer 18; a yoke layer 20B disposed on a portion of the pole layer 16 where the opening of the gap layer 18 is formed; and a second layer 20C disposed to couple the first layer 20A to the yoke layer 20B. Each of the first layer 20A and the second layer 20C has an end face located in the medium facing surface 30. The first layer 20A, the yoke layer 20B and the second layer 20C are each made of a magnetic material. These layers 20A to 20C may be made of any of CoFeN, CoNiFe, NiFe and CoFe, for example.

The magnetic head further comprises a nonmagnetic layer 21 made of a nonmagnetic material and disposed around the first layer 20A and the yoke layer 20B. The nonmagnetic layer 21 is made of an inorganic insulating material such as alumina or coating glass, for example. Alternatively, the nonmagnetic layer 21 may be made up of a layer of a nonmagnetic metal material and a layer of an insulating material disposed thereon. In this case, the nonmagnetic metal material may be a refractory metal such as Ta, Mo, Nb, W, Cr, Ru, or Cu.

The magnetic head further comprises: an insulating layer 22 disposed on regions of the top surfaces of the yoke layer 20B and the nonmagnetic layer 21 in which a coil 23 described later is disposed; the coil 23 disposed on the insulating layer 22; and an insulating layer 24 disposed around the coil 23 and in the space between the respective adjacent turns of the coil 23. The insulating layer 22 is made of alumina, for example. The coil 23 is flat-whorl-shaped. The second layer 20C includes a portion located on a side of at least part of the coil 23 covered with the insulating layer 24, the side being opposite to the pole layer 16. The coil 23 is made of a conductive material such as copper. The insulating layer 24 is made of photoresist, for example.

The portions from the coil 9 to the second layer 20C of the shield layer 20 make up a write head. The magnetic head further comprises a protection layer 27 made of a nonmagnetic material and formed to cover the shield layer 20. The protection layer 27 is made of an inorganic insulating material such as alumina.

As described so far, the magnetic head of the embodiment comprises the medium facing surface 30 that faces toward a recording medium, the read head, and the write head. The read head and the write head are stacked on the substrate 1. The read head is located backward along the direction T of travel of the recording medium (that is, located closer to the air inflow end of the slider). The write head is located forward along the direction T of travel of the recording medium (that is, located closer to the air outflow end of the slider).

The read head comprises the MR element 5 as the read element, and the bottom shield layer 3 and the top shield layer 7 for shielding the MR element 5. Portions of the bottom shield layer 3 and the top shield layer 7 that are located on a side of the medium facing surface 30 are opposed to each other, the MR element 5 being placed between these portions. The read head further comprises: the bottom shield gap film 4 disposed between the MR element 5 and the bottom shield layer 3; and the top shield gap film 6 disposed between the MR element 5 and the top shield layer 7.

The write head comprises the coil 9, the encasing layer 12, the nonmagnetic metal layer 13, the nonmagnetic film 14, the polishing stopper layer 15, the pole layer 16, the gap layer 18, the shield layer 20, the nonmagnetic layer 21, the coil 23, and the insulating layer 24. The coils 9 and 23 generate a magnetic field corresponding to data to be written on the recording medium. The insulating layer 24 is disposed around the coil 23 and in the space between the respective adjacent turns of the coil 23. The coil 9 is not a component requisite for the write head and may be omitted. The nonmagnetic film 14 may be omitted.

The pole layer 16 has an end face located in the medium facing surface 30. The pole layer 16 allows a magnetic flux corresponding to the field generated by the coil 23 to pass therethrough and generates a write magnetic field for writing the data on the medium by means of the perpendicular magnetic recording system. The gap layer 18 is disposed on the polishing stopper layer 15 and the pole layer 16.

The shield layer 20 has an end face located in the medium facing surface 30, and has a portion located away from the medium facing surface 30 and coupled to the pole layer 16.

In the medium facing surface 30, the end face of the shield layer 20 is disposed forward of the end face of the pole layer 16 along the direction T of travel of the recording medium with a specific space created by the thickness of the gap layer 18. The thickness of the gap layer 18 falls within a range of 30 to 60 nm inclusive, for example. At least part of the coil 23 is disposed between the pole layer 16 and the shield layer 20 and insulated from the pole layer 16 and the shield layer 20.

The pole layer 16 is disposed in the groove 12a of the encasing layer 12 and in the opening 13a of the nonmagnetic metal layer 13 with the nonmagnetic film 14 and the polishing stopper layer 15 disposed between the pole layer 16 and each of the groove 12a and the opening 13a. The nonmagnetic film 14 has a thickness that falls within a range of 10 to 40 nm inclusive, for example. However, the thickness of the nonmagnetic film 14 is not limited to this range but may be of any other value, depending on the track width. The polishing stopper layer 15 has a thickness that falls within a range of 30 to 100 nm inclusive, for example.

The pole layer 16 incorporates: the first layer 161 located closer to the surface of the groove 12a; and the second layer 162 located farther from the surface of the groove 12a. The first layer 161 has a thickness that falls within a range of 0 to 100 nm inclusive, for example. The first layer 161 having a thickness of 0 nm means that the first layer 161 is not provided. The pole layer 16 has a first surface (top surface) 16C and a second surface (bottom surface) 16D that face toward opposite directions.

The shield layer 20 has: the first layer 20A disposed adjacent to the gap layer 18 and having the end face located in the medium facing surface 30; the yoke layer 20B disposed on the portion of the pole layer 16 where the opening of the gap layer 18 is formed; and the second layer 20C disposed to couple the first layer 20A to the yoke layer 20B. The coil 23 is located farther from the pole layer 16 than the surface of the first layer 20A farther from the pole layer 16.

The end face of the first layer 20A located in the medium facing surface 30 has a width equal to or greater than the track width. The maximum width of the second layer 20C is equal to or greater than the maximum width of the first layer 20A.

Throat height TH is the distance between the medium facing surface 30 and one of two points that is closer to the medium facing surface 30, wherein one of the two points is the one at which the space between the pole layer 16 and the shield layer 20 starts to increase when seen from the medium facing surface 30, and the other of the points is the one at which the gap layer 18 first bends when seen from the medium facing surface 30. In the embodiment, the throat height TH is the distance between the medium facing surface 30 and the point at which the space between the pole layer 16 and the shield layer 20 starts to increase when seen from the medium facing surface 30. The throat height TH is equal to the length of a portion of the first layer 20A that faces toward the pole layer 16 with the gap layer 18 disposed in between, the length being taken in the direction orthogonal to the medium facing surface 30. The throat height TH falls within a range of 0.05 to 0.3 μm inclusive, for example.

Reference is now made to FIG. 4 to describe the overall shape of the pole layer 16 in detail. As shown in FIG. 4, the pole layer 16 incorporates a track width defining portion 16A and a wide portion 16B. The track width defining portion 16A has the end face located in the medium facing surface 30. The wide portion 16B is located farther from the medium facing surface 30 than the track width defining portion 16A and has a width greater than the width of the track width defining portion 16A. For example, the wide portion 16B gradually increases in width as the distance from the medium facing surface 30 increases and then maintains a specific width to the end of the wide portion 16B. Here, the length of the track width defining portion 16A taken in the direction orthogonal to the medium facing surface 30 is called a neck height NH. The definitions of the track width defining portion 16A, the wide portion 16B and the neck height NH of the embodiment will be described in detail later.

As shown in FIG. 3, the end face of the pole layer 16 located in the medium facing surface 30 has: a first side A1 closest to the substrate 1; a second side A2 adjacent to the gap layer 18; a third side A3 connecting an end of the first side A1 to an end of the second side A2; and a fourth side A4 connecting the other end of the first side A1 to the other end of the second side A2. The second side A2 defines the track width. The width of the end face of the pole layer 16 located in the medium facing surface 30 decreases as the distance from the first side A1 decreases. Each of the third side A3 and the fourth side A4 forms an angle that falls within a range of 5 to 15 degrees inclusive, for example, with respect to the direction orthogonal to the top surface of the substrate 1. The length of the second side A2, that is, the track width, falls within a range of 0.05 to 0.20 μm inclusive, for example. The thickness of the pole layer 16 falls within a range of 0.15 to 0.35 μm inclusive, for example.

Reference is now made to FIG. 5 to FIG. 9, FIG. 10A and FIG. 10B, FIG. 11, FIG. 12A to FIG. 17A, and FIG. 12B to FIG. 17B to describe a method of manufacturing the magnetic head of the embodiment. In the method of the embodiment, first, components of a plurality of magnetic heads are formed on a single substrate to fabricate a magnetic head substructure in which a plurality of rows of pre-head portions that will be the respective magnetic heads later are arranged. The steps of fabricating the magnetic head substructure will now be described, focusing on one of the pre-head portions.

In the step of fabricating the magnetic head substructure, as shown in FIG. 2, the insulating layer 2, the bottom shield layer 3 and the bottom shield gap film 4 are first formed one by one on the substrate 1. Next, the MR element 5 and leads (not shown) connected to the MR element 5 are formed on the bottom shield gap film 4. Next, the top shield gap film 6 is formed to cover the MR element 5 and the leads. Next, the top shield layer 7, the nonmagnetic layer 81, the second top shield layer 82, and the insulating layer 83 are formed one by one on the top shield gap film 6. Next, the coil 9 and the insulating layers 10 and 11 are formed on the insulating layer 83. Next, the top surfaces of the coil 9 and the insulating layers 10 and 11 are flattened by chemical mechanical polishing (hereinafter referred to as CMP), for example. In the following description, in the layered structure obtained in the course of manufacturing process of the magnetic head substructure, the region in which the medium facing surface 30 is to be formed is indicated as a region ABS.

Figure 5:
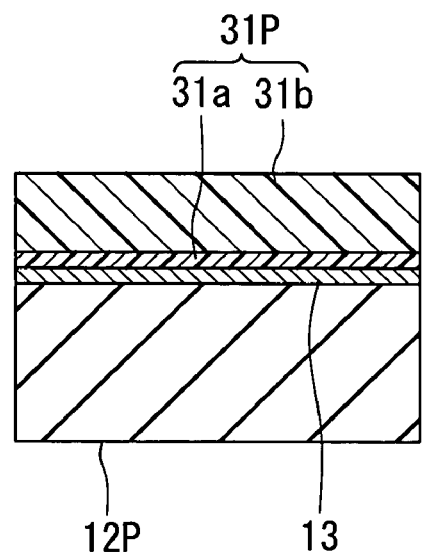
FIG. 5 is a cross-sectional view of a layered structure obtained in a step of a method of manufacturing the magnetic head of the first embodiment of the invention.

FIG. 5 illustrates the following step. FIG. 5 is a cross-sectional view illustrating a cross section taken in the region ABS of the layered structure obtained in the course of manufacturing process of the magnetic head substructure. In FIG. 5 the portions closer to the substrate 1 than the encasing layer 12 are omitted. In the step, first, a nonmagnetic layer 12P is formed on the flattened top surfaces of the coil 9 and the insulating layers 10 and 11. The groove 12a will be formed in the nonmagnetic layer 12P, and the nonmagnetic layer 12P will be thereby formed into the encasing layer 12 later. Next, the nonmagnetic metal layer 13 made of a nonmagnetic metal material is formed by sputtering, for example, on the nonmagnetic layer 12P. The nonmagnetic metal layer 13 has a thickness that falls within a range of 20 to 100 nm inclusive, for example.

Next, a two-layer resist layer 31P is formed on the nonmagnetic metal layer 13. The two-layer resist layer 31P has a lower layer 31a made of a material soluble in a developer and a photoresist layer 31b disposed on the lower layer 31a. At this point, the lower layer 31a and the photoresist layer 31b are not patterned yet. Alternatively, only the photoresist layer 31b may be formed in place of the two-layer resist layer 31P.

Figure 6:
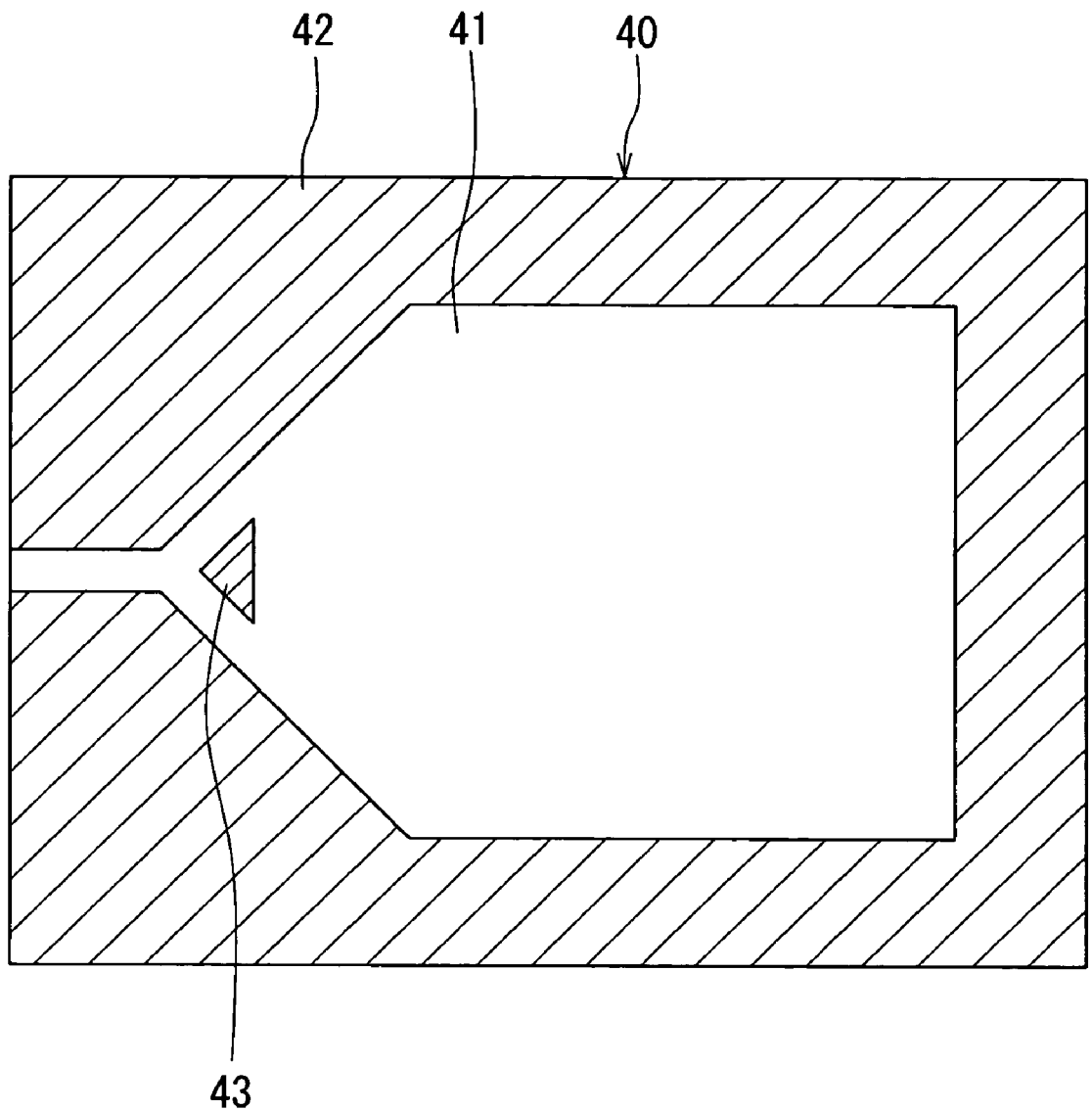
FIG. 6 is a top view of a photomask used in a step that follows the step shown in FIG. 5.

Next, the photoresist layer 31b unpatterned is selectively exposed using the photomask 40 shown in FIG. 6. FIG. 6 is a top view of the photomask 40. The photomask 40 includes a first region 41, a second region 42 and a third region 43. The first region 41 has such a perimeter that a portion of a projection image of the perimeter is shaped along a portion of an edge of the first surface 16C of the pole layer 16 to be formed. The second region 42 touches the perimeter of the first region 41 and is located outside the first region 41. The third region 43 is located inside the first region 41 without touching the perimeter of the first region 41. With regard to the property of allowing light for exposure to pass or intercepting light for exposure, each of the second region 42 and the third region 43 has a property different from that of the first region 41. Here, a case in which the photoresist layer 31b is positive will be described. In this case, the first region 41 has a property of allowing light for exposure to pass while each of the second region 42 and the third region 43 has a property of intercepting light for exposure. The shapes of the regions 41 to 43 will be described in detail later.

The entire photoresist layer 31b before exposure is insoluble in a developer. After exposure, a portion of the photoresist layer 31b at which light having passed through the first region 41 of the photomask 40 was applied during exposure becomes soluble in the developer while the other portion remains insoluble in the developer.

Figure 7:
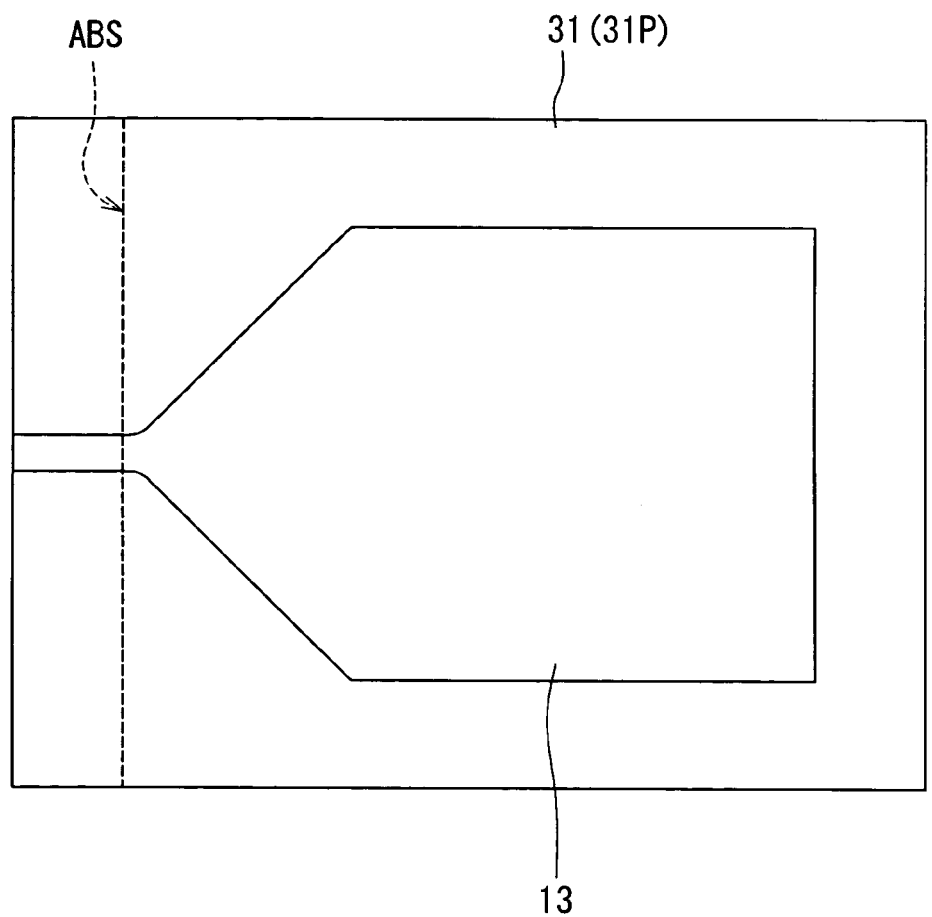
FIG. 7 is a top view of a layered structure obtained in a step that follows the step shown in FIG. 6.
Figure 8:
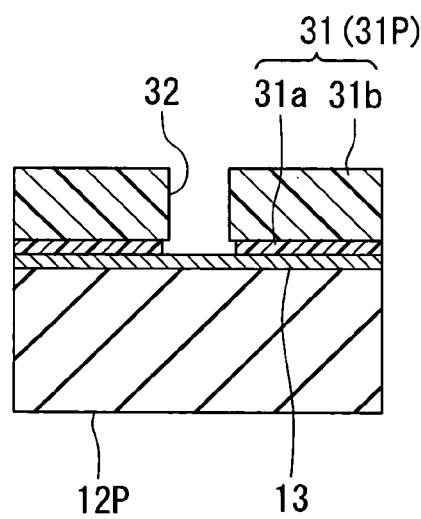
FIG. 8 is a cross-sectional view of the layered structure obtained in the step that follows the step shown in FIG. 6.

FIG. 7 and FIG. 8 illustrate the following step. FIG. 7 is a top view of the layered structure obtained in the course of manufacturing process of the magnetic head substructure. FIG. 8 is a cross-sectional view illustrating a cross section taken in the region ABS of the layered structure. In the step the photoresist layer 31b is developed using a developer. At this time, the portion of the photoresist layer 31b at which light having passed through the first region 41 was applied during the exposure using the photomask 40 is dissolved in the developer, and an opening is thereby formed in the photoresist layer 31b. Furthermore, a portion of the lower layer 31a exposed from the opening of the photoresist layer 31b is also dissolved in the developer, and an opening is thereby formed in the lower layer 31a, too. The opening of the lower layer 31a is slightly larger in dimension than the opening of the photoresist layer 31b. Consequently, as shown in FIG. 8, the two-layer resist layer 31P developed has a shape with an undercut.

A portion of the photoresist layer 31b which was not irradiated with light during exposure because of the existence of the third region 43 of the photomask 40 is not soluble in the developer when developed. This portion will be hereinafter called a remaining portion. It is required to remove the remaining portion and a portion of the lower layer 31a that remains below the remaining portion. These portions are removed in a manner that will now be described by way of example. The portion of the lower layer 31a that remains below the remaining portion becomes smaller than the remaining portion during development. It is therefore possible to easily remove the remaining portion and the portion of the lower layer 31a that remains below the remaining portion during development by using the developer flowing. If it is impossible to remove these portions by this method, second exposure may be performed using another photomask after the exposure step using the photomask 40. This second exposure is performed on the portion of the photoresist layer 31b that would be the remaining portion if the second exposure were not performed. The remaining portion will not be produced if the second exposure is performed. Since the second exposure is performed on the small region of the photoresist layer 31b, the shape of the two-layer resist layer 31P after development is hardly affected.

Even in the case where the photoresist layer 31b is only formed in place of the two-layer resist layer 31P, the remaining region is smaller than a projection image of the third region 43 of the photomask 40 due to the effect of light that has passed through the first region 41 of the photomask 40 and has been reflected off the nonmagnetic metal layer 13. It is therefore possible to remove the remaining portion by using the developer flowing in this case, too. If it is impossible to remove the remaining portion by this method, the above-mentioned second exposure may be performed.

The two-layer resist layer 31P developed becomes a pattern 31 for forming the pole layer 16. This pattern 31 has an opening 32 having a shape corresponding to the groove 12a that will be formed later.

Figure 9:
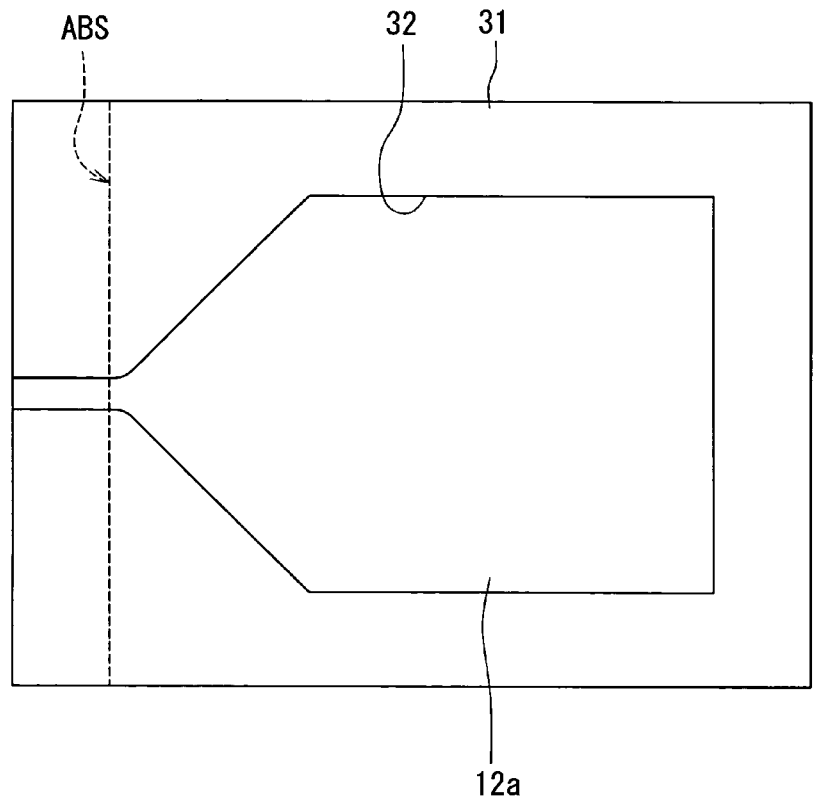
FIG. 9 is a top view of a layered structure obtained in a step that follows the step shown in FIG. 7 and FIG. 8.
Figures 10A, 10B:
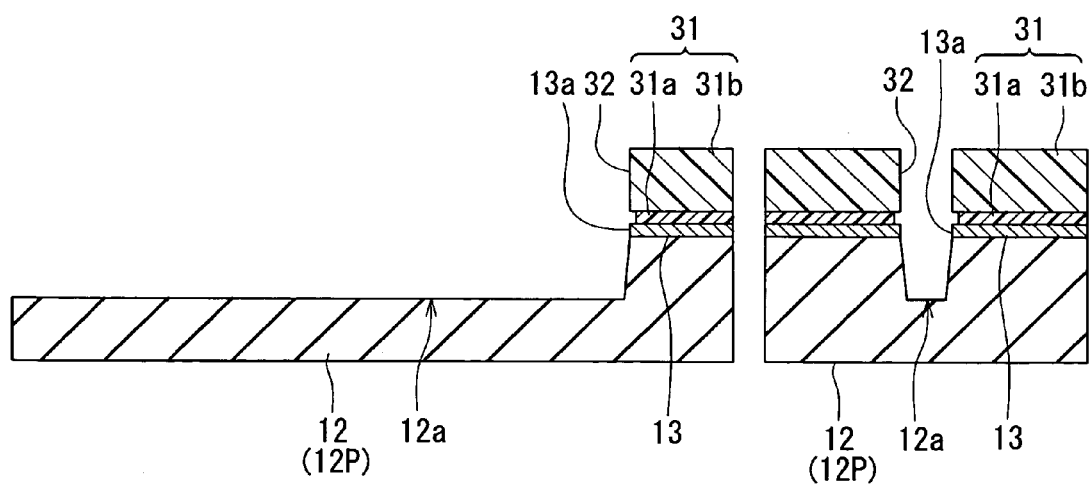
FIG. 10A and FIG. 10B are views for illustrating the step that follows the step shown in FIG. 7 and FIG. 8.

FIG. 9, FIG. 10A and FIG. 10B illustrate the following step. FIG. 9 is a top view of the layered structure obtained in the course of manufacturing process of the magnetic head substructure. FIG. 10A illustrates a cross section of the layered structure orthogonal to the region ABS and the substrate. FIG. 10B illustrates a cross section of the layered structure taken in the region ABS. In FIG. 10A and FIG. 10B the portions closer to the substrate 1 than the encasing layer 12 are omitted. In this step, first, the nonmagnetic metal layer 13 is selectively etched through the use of the pattern 31. The opening 13a that penetrates is thereby formed in the nonmagnetic metal layer 13. The opening 13a has a shape corresponding to the plane geometry of the pole layer 16 to be formed later. Furthermore, a portion of the nonmagnetic layer 12P exposed from the opening 13a of the nonmagnetic metal layer 13 is selectively etched so as to form the groove 12a in the nonmagnetic layer 12P. The pattern 31 is then removed. The nonmagnetic layer 12P is formed into the encasing layer 12 by forming the groove 12a therein. The edge of the opening 13a of the nonmagnetic metal layer 13 is located directly above the edge of the groove 12a located in the top surface of the encasing layer 12.

The etching of each of the nonmagnetic metal layer 13 and the nonmagnetic layer 12P is performed by reactive ion etching or ion beam etching, for example. The etching for forming the groove 12a in the nonmagnetic layer 12P is performed such that the walls of the groove 12a corresponding to both sides of the track width defining portion 16A of the pole layer 16 each form an angle that falls within a range of 5 to 15 degrees inclusive, for example, with respect to the direction orthogonal to the top surface of the substrate 1.

Figure 11:
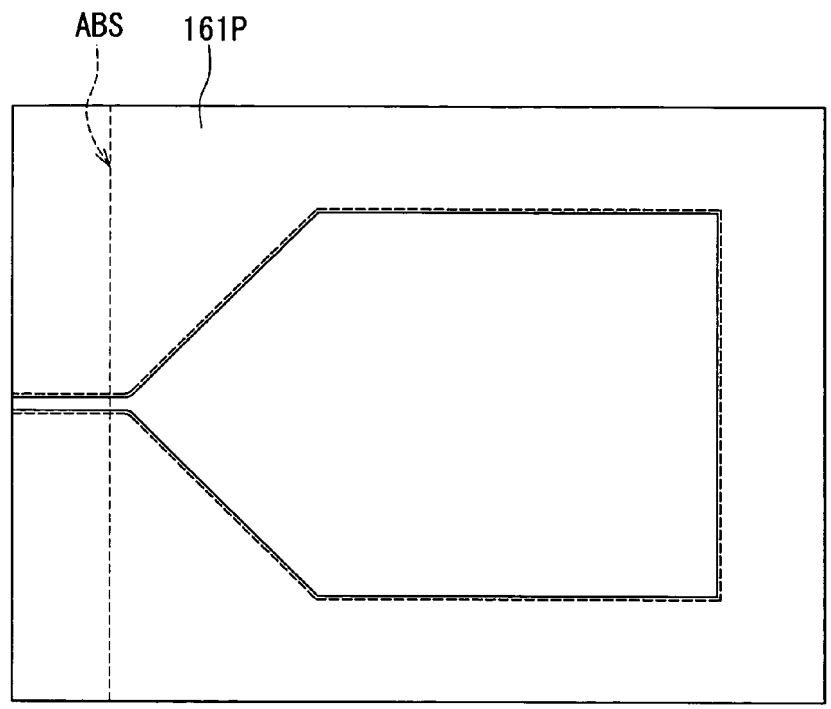
FIG. 11 is a top view of a layered structure obtained in a step that follows the step shown in FIG. 9, FIG. 10A and FIG. 10B.
Figures 12A, 12B:
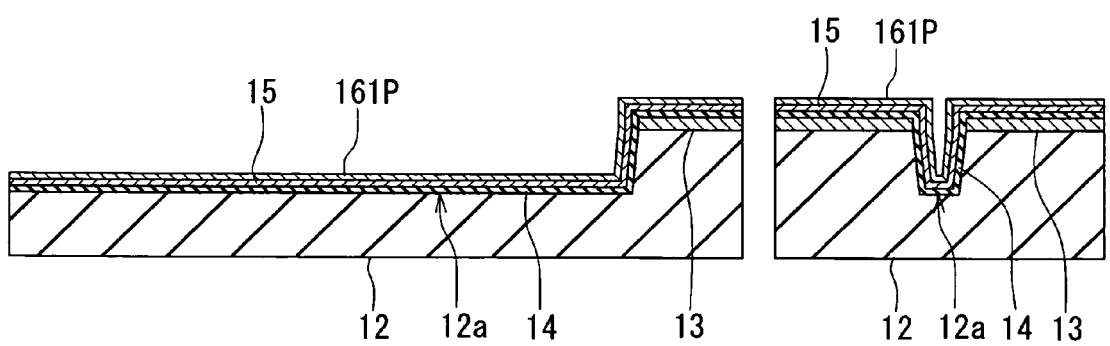
FIG. 12A and FIG. 12B are views for illustrating a step that follows the step shown in FIG. 9, FIG. 10A and FIG. 10B.

FIG. 11, FIG. 12A and FIG. 12B illustrate the following step. FIG. 11 is a top view of the layered structure obtained in the course of manufacturing process of the magnetic head substructure. FIG. 12A illustrates a cross section of the layered structure orthogonal to the region ABS and the substrate. FIG. 12B illustrates a cross section of the layered structure taken in the region ABS. In FIG. 12A and FIG. 12B the portions closer to the substrate 1 than the encasing layer 12 are omitted. In the step, first, the nonmagnetic film 14 is formed on the entire top surface of the layered structure. The nonmagnetic film 14 is formed in the opening 13a of the nonmagnetic metal layer 13 and in the groove 12a of the encasing layer 12, too. The nonmagnetic film 14 is formed by sputtering or chemical vapor deposition (hereinafter referred to as CVD), for example. It is possible to control the thickness of the nonmagnetic film 14 with precision. If CVD is employed to form the nonmagnetic film 14, it is preferred to employ a method called 'atomic layer CVD' (ALCVD) in which formation of a single atomic layer is repeated. In this case, it is possible to control the thickness of the nonmagnetic film 14 with higher precision. When ALCVD is employed to form the nonmagnetic film 14, it is preferable to use alumina, in particular, as the material of the nonmagnetic film 14. If a semiconductor material is used as the material of the nonmagnetic film 14, it is preferred to form the nonmagnetic film 14 by ALCVD at a low temperature (around 200° C.) or by low-pressure CVD at a low temperature. The semiconductor material as the material of the nonmagnetic film 14 is preferably undoped polycrystalline silicon or amorphous silicon.

Next, the polishing stopper layer 15 is formed on the entire top surface of the layered structure by sputtering or ALCVD, for example. The polishing stopper layer 15 is formed in the opening 13a of the nonmagnetic metal layer 13 and in the groove 12a of the encasing layer 12, too. The polishing stopper layer 15 indicates the level at which polishing of the polishing step to be performed later is stopped.

Next, a first magnetic layer 161P to be the first layer 161 of the pole layer 16 is formed on the entire top surface of the layered structure. The first magnetic layer 161P is formed by sputtering or ion beam deposition (hereinafter referred to as IBD), for example. If the first magnetic layer 161P is formed by sputtering, it is preferred to employ collimation sputtering or long throw sputtering. Since the first layer 161 may be omitted as previously mentioned, it is not necessarily required to form the first magnetic layer 161P.

Figures 13A, 13B:
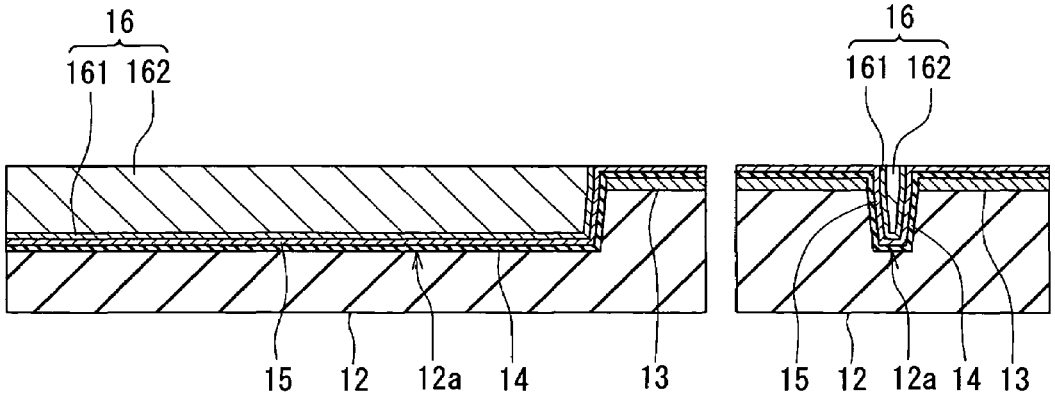
FIG. 13A and FIG. 13B are views for illustrating a step that follows the step shown in FIG. 11, FIG. 12A and FIG. 12B.

FIG. 13A and FIG. 13B illustrate the following step. FIG. 13A to FIG. 17A that will be referred to in the following description each illustrate a cross section of the layered structure obtained in the course of manufacturing process of the magnetic head substructure, the cross section being orthogonal to the region ABS and the substrate. FIG. 13B to FIG. 17B each illustrate a cross section of the layered structure taken in the region ABS. In FIG. 13A to FIG. 17A and FIG. 13B to FIG. 17B, the portions closer to the substrate 1 than the encasing layer 12 are omitted.

In the step shown in FIG. 13A and FIG. 13B, first, a second magnetic layer to be the second layer 162 of the pole layer 16 is formed on the first magnetic layer 161P. The second magnetic layer is formed such that the top surface thereof is located higher than the top surfaces of the nonmagnetic metal layer 13, the nonmagnetic film 14 and the polishing stopper layer 15. The second magnetic layer is formed by frame plating, for example. In this case, the first magnetic layer 161P is used as an electrode for plating. If the polishing stopper layer 15 is made of a conductive material, the layer 15 is used as an electrode for plating, too. The second magnetic layer may be formed by making a plating layer unpatterned and then patterning the plating layer through etching.

Next, a coating layer not shown made of alumina, for example, and having a thickness of 0.5 to 1.2 µm, for example, is formed on the entire top surface of the layered structure. Next, the coating layer, the second magnetic layer and the first magnetic layer 161P are polished by CMP, for example, so that the polishing stopper layer 15 is exposed, and the top surfaces of the polishing stopper layer 15, the first magnetic layer 161P and the second magnetic layer are thereby flattened. As a result, the first magnetic layer 161P and the second magnetic layer are formed into the first layer 161 and the second layer 162, respectively. If the coating layer, the second magnetic layer and the first magnetic layer 161P are polished by CMP, such a slurry is used that polishing is stopped when the polishing stopper layer 15 is exposed, such as an alumina-base slurry.

Figures 14A, 14B:
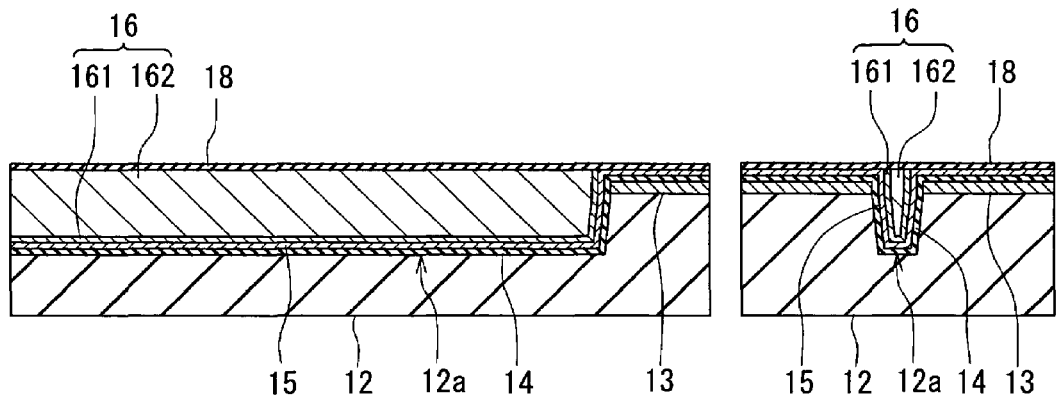
FIG. 14A and FIG. 14B are views for illustrating a step that follows the step shown in FIG. 13A and FIG. 13B.

Next, as shown in FIG. 14A and FIG. 14B, the gap layer 18 is formed by sputtering, for example, on the entire top surface of the layered structure. The gap layer 18 is formed by sputtering or CVD, for example. If the gap layer 18 is formed by CVD, it is preferred to employ ALCVD. If the gap layer 18 is formed by ALCVD, it is preferred that the gap layer 18 be made of alumina.

FIG. 15A and FIG. 15B illustrate the following step. In the step, first, a portion of the gap layer 18 away from the region ABS is selectively etched to form an opening in the gap layer 18. Next, the first layer 20A is formed on the gap layer 18, and the yoke layer 20B is formed on a portion of the pole layer 16 where the opening of the gap layer 18 is formed. The first layer 20A and the yoke layer 20B may be formed by frame plating or by making a magnetic layer through sputtering and then selectively etching the magnetic layer. Selective etching of the magnetic layer may be performed by, for example, making an alumina layer on the magnetic layer, making a mask on the alumina layer by frame plating, and etching the alumina layer and the magnetic layer using the mask.

FIG. 16A and FIG. 16B illustrate the following step. In the step, first, the nonmagnetic layer 21 is formed on the entire top surface of the layered structure. Next, the nonmagnetic layer 21 is polished by CMP, for example, so that the first layer 20A and the yoke layer 20B are exposed, and the top surfaces of the first layer 20A, the yoke layer 20B and the nonmagnetic layer 21 are flattened.

Next, the insulating layer 22 is formed on regions of the top surfaces of the yoke layer 20B and the nonmagnetic layer 21 in which the coil 23 will be disposed. Next, the coil 23 is formed by frame plating, for example, such that at least part of the coil 23 is disposed on the insulating layer 22.

Figures 17A, 17B:
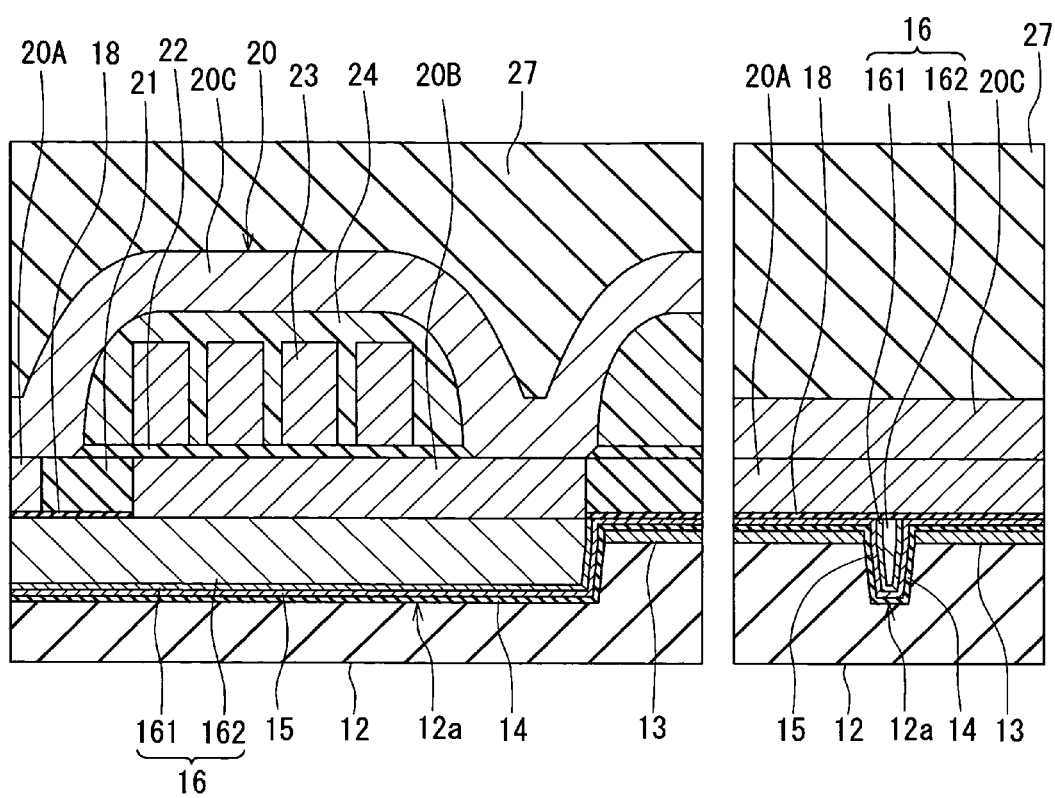
FIG. 17A and FIG. 17B are views for illustrating a step that follows the step shown in FIG. 16A and FIG. 16B.

FIG. 17A and FIG. 17B illustrate the following step. In the step, first, the insulating layer 24 made of photoresist, for example, is formed around the coil 23 and in the space between the respective adjacent turns of the coil 23. Next, the second layer 20C is formed by frame plating, for example, to complete the shield layer 20. Next, the protection layer 27 is formed to cover the entire top surface of the layered structure. Wiring and terminals are then formed on the protection layer 27 to complete the magnetic head substructure.

Next, in the method of manufacturing the magnetic head of the embodiment, the magnetic head substructure is cut to fabricate a head aggregate that includes a plurality of pre-head portions arranged in a row. Next, a surface of the head aggregate formed by cutting the magnetic head substructure is polished to form the medium facing surfaces of the pre-head portions that the head aggregate includes. Next, flying rails are formed on the medium facing surfaces. Next, the head aggregate is cut so that the pre-head portions are separated from one another to form the plurality of magnetic heads. In the step of forming the medium facing surfaces, the head aggregate is polished while detecting the resistance of each of the MR elements 5 that the head aggregate includes, so that MR heights in the plurality of pre-head portions are equal. The MR height is the length of the MR element 5 taken in the direction orthogonal to the medium facing surface.

Figures 18A, 18B:
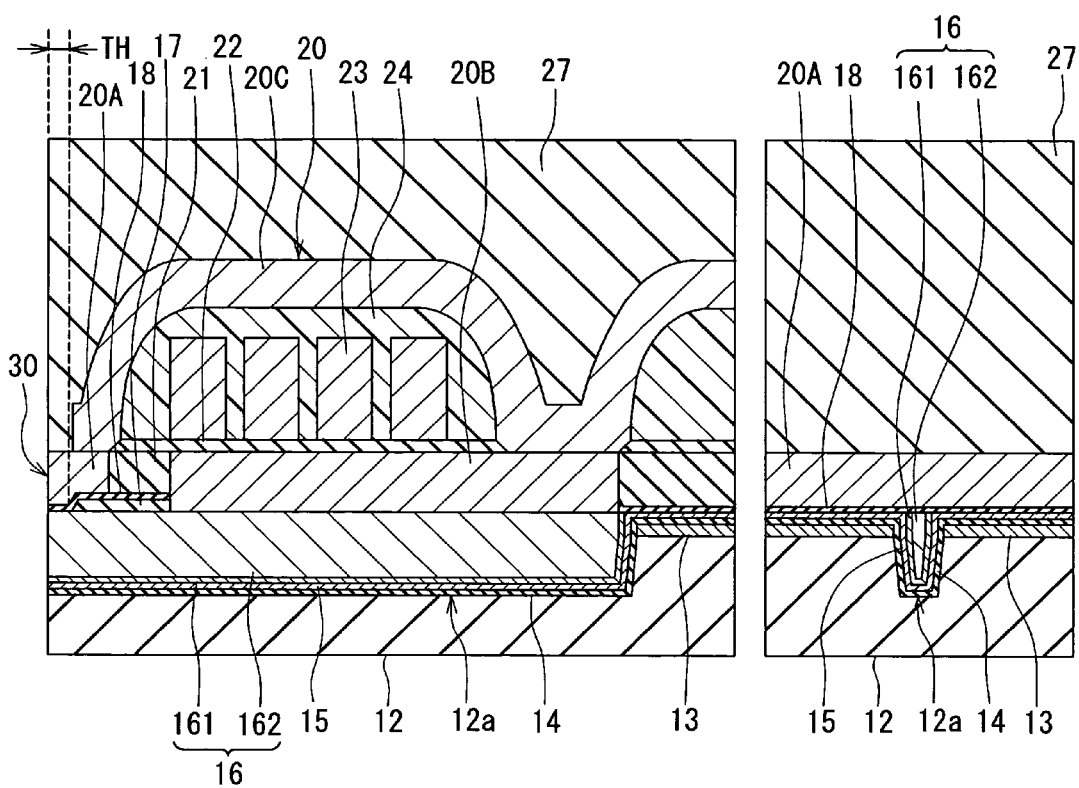
FIG. 18A and FIG. 18B are views for illustrating another example of the magnetic head of the first embodiment of the invention.

FIG. 18A and FIG. 18B illustrate another example of the magnetic head of the embodiment. FIG. 18A illustrates a cross section of the magnetic head orthogonal to the medium facing surface and a surface of the substrate. FIG. 18B illustrates a cross section of a portion of the magnetic head near the medium facing surface, the cross section being parallel to the medium facing surface. In FIG. 18A and FIG. 18B, the portions closer to the substrate 1 than the encasing layer 12 are omitted. In this example a nonmagnetic film 17 is disposed between the gap layer 18 and the top surfaces of the polishing stopper layer 15 and the pole layer 16. The nonmagnetic film 17 is made of a nonmagnetic material such as alumina. The nonmagnetic film 17 has an end closer to the medium facing surface 30 and this end is located at a distance from the medium facing surface 30. The nonmagnetic film 17 has a thickness of 0.1 to 0.3 µm, for example. The bottom surface of the first layer 20A bends to be opposed to the top surfaces of the pole layer 16 and the nonmagnetic film 17 with the gap layer 18 disposed in between. The gap layer 18 bends along the bottom surface of the first layer 20A, too. In this example, two points coincide with each other wherein one of the points is the one at which the space between the pole layer 16 and the shield layer 20 starts to increase when seen from the medium facing surface 30, and the other of the points is the one at which the gap layer 18 first bends when seen from the medium facing surface 30. The throat height TH is the distance between the medium facing surface 30 and these points. In this example the second layer 20C has an end closer to the medium facing surface 30 and this end is located at a distance from the medium facing surface 30.

The operation of the magnetic head of the embodiment will now be described. The magnetic head writes data on a recording medium by using the write head and reads data written on the recording medium by using the read head. In the write head the coil 23 generates a magnetic field that corresponds to the data to be written on the medium. The pole layer 16 and the shield layer 20 form a magnetic path through which a magnetic flux corresponding to the magnetic field generated by the coil 23 passes. The pole layer 16 allows the flux corresponding to the field generated by the coil 23 to pass and generates a write magnetic field used for writing the data on the medium by means of the perpendicular magnetic recording system. The shield layer 20 takes in a disturbance magnetic field applied from outside the magnetic head to the magnetic head. It is thereby possible to prevent erroneous writing on the recording medium caused by the disturbance magnetic field intensively taken in into the pole layer 16.

According to the embodiment, in the medium facing surface 30, the end face of the shield layer 20 is located forward of the end face of the pole layer 16 along the direction T of travel of the recording medium (that is, located closer to the air outflow end of the slider) with a specific small space created by the gap layer 18. The location of an end of the bit pattern written on the recording medium is determined by the location of the end of the pole layer 16 that is closer to the gap layer 18 and located in the medium facing surface 30. The shield layer 20 takes in a magnetic flux generated from the end face of the pole layer 16 located in the medium facing surface 30 and extending in directions except the direction orthogonal to the surface of the recording medium so as to prevent the flux from reaching the recording medium. It is thereby possible to prevent a direction of magnetization of the bit pattern already written on the medium from being changed due to the effect of the above-mentioned flux. According to the embodiment, an improvement in linear recording density is thus achieved.

According to the embodiment, as shown in FIG. 3, the end face of the pole layer 16 located in the medium facing surface 30 has a width that decreases as the distance from the first side A1 decreases. It is thereby possible to prevent the problems resulting from the skew.

According to the embodiment, the pole layer 16 is disposed in the groove 12a of the encasing layer 12 made of a nonmagnetic material with the nonmagnetic film 14 and the polishing stopper layer 15 disposed between the pole layer 16 and the groove 12a. Consequently, the pole layer 16 is smaller than the groove 12a in width. It is thereby possible to easily form the groove 12a and to easily reduce the width of the pole layer 16 and the width of the top surface of the track width defining portion 16A that defines the track width, in particular. As a result, according to the embodiment, it is possible to easily implement the track width that is smaller than the minimum track width that can be formed by photolithography and to control the track width with accuracy.

Reference is now made to FIG. 1 to describe the shape of the pole layer 16 of the embodiment in detail. As shown in FIG. 1, the first surface 16C of the pole layer 16 has a first edge E1 and a second edge E2 that extend in the direction intersecting the medium facing surface 30. The space between the first edge E1 and the second edge E2 in the medium facing surface 30 defines the track width. In the following description a curved portion means a portion that is curved in shape, and a straight portion means a straight-line-shaped portion. The first edge E1 includes a first curved portion C1 and a first straight portion S1 that is contiguous to the first curved portion C1 and located farther from the medium facing surface 30 than the first curved portion C1.

The second edge E2 includes a second curved portion C2 and a second straight portion S2 that is contiguous to the second curved portion C2 and located farther from the medium facing surface 30 than the second curved portion C2. The space between the first curved portion C1 and the second curved portion C2 and the space between the first straight portion S1 and the second straight portion S2 each increase as the distance from the medium facing surface 30 increases.

An angle formed by the first straight portion S1 with respect to the direction orthogonal to the medium facing surface 30 is defined as $\theta 1$ (wherein the angle is acute one). An angle formed by the second straight portion S2 with respect to the direction orthogonal to the medium facing surface 30 is defined as $\theta 2$ (wherein the angle is acute one). Each of the angles $\theta 1$ and $\theta 2$ preferably falls within a range of 25 to 60 degrees inclusive, and more preferably 30 to 45 degrees inclusive. It is preferred that the angles $\theta 1$ and $\theta 2$ be equal. Each of the angles $\theta 1$ and $\theta 2$ may be 30 or 45 degrees.

An angle formed by a tangent to the first curved portion C1 with respect to the direction orthogonal to the medium facing surface 30 (wherein the angle is acute one) is equal to or smaller than the angle $\theta 1$, and decreases as the distance from the medium facing surface 30 to the location of the contact point of the first curved portion C1 and the tangent decreases. Similarly, an angle formed by a tangent to the second curved portion C2 with respect to the direction orthogonal to the medium facing surface 30 (wherein the angle is acute one) is equal to or smaller than the angle $\theta 2$, and decreases as the distance from the medium facing surface 30 to the location of the contact point of the second curved portion C2 and the tangent decreases.

Here, an imaginary straight line that passes through the intersection point of the first edge E1 and the medium facing surface 30 and extends in the direction orthogonal to the medium facing surface 30 is defined as L1. An imaginary straight line that passes through the intersection point of the second edge E2 and the medium facing surface 30 and extends in the direction orthogonal to the medium facing surface 30 is defined as L2. An imaginary straight line that extends from the first straight portion S1 toward the medium facing surface 30 in the direction along the first straight portion S1 is defined as L3. An imaginary straight line that extends from the second straight portion S2 toward the medium facing surface 30 in the direction along the second straight portion S2 is defined as L4. The intersection point of the straight lines L1 and L3 is defined as P1. The intersection point of the straight lines L2 and L4 is defined as P2. An imaginary straight line that passes through the points P1 and P2 is defined as L5. The straight line L5 is located parallel to the medium facing surface 30 on the first surface 16C.

The first curved portion C1 is off the straight lines L1 and L3 so as to intersect the straight line L5 at a location along the extension of the line segment connecting the point P1 to the point P2. The second curved portion C2 is off the straight lines L2 and L4 so as to intersect the straight line L5 at a location along the extension of the line segment connecting the point P1 to the point P2. Distances H1 and H2 each fall within a range of 10 to 50 nm inclusive, where H1 is the distance from the straight line L5 to a connecting point P3 between the first curved portion C1 and the straight portion S1, and H2 is the distance from the straight line L5 to a connecting point P4 between the second curved portion C2 and the second straight portion S2.

It is preferred that the first edge E1 further include a third straight portion S3 that connects the first curved portion C1 to the medium facing surface 30. Similarly, it is preferred that the second edge E2 further include a fourth straight portion S4 that connects the second curved portion C2 to the medium facing surface 30. Each of the angle formed by the third straight portion S3 with respect to the straight line L1 (wherein the angle is acute one) and the angle formed by the fourth straight portion S4 with respect to the straight line L2 (wherein the angle is acute one) is 5 degrees or smaller. This means that the straight portions S3 and S4 are orthogonal or nearly orthogonal to the medium facing surface 30.

Here, in the first surface 16C, the distance from the straight line L5 to a connecting point P5 between the first curved portion C1 and the third straight portion S3 is defined as H3 while the distance from the straight line L5 to a connecting point P6 between the second curved portion C2 and the fourth straight portion S4 is defined as H4.

In the embodiment the distance from the straight line L5 to the medium facing surface 30 is defined as the neck height NH. The neck height NH preferably falls within a range of 10 to 200 nm inclusive. It is preferred that each of distances H5 and H6 fall within a range of 10 to 190 nm inclusive, where H5 is the distance from the medium facing surface 30 to the connecting point P5 between the first curved portion C1 and the third straight portion S3, and H6 is the distance from the medium facing surface 30 to the connecting point P6 between the second curved portion C2 and the fourth straight portion S4. In the embodiment such a configuration is possible that the third straight portion S3 and the fourth straight portion S4 are not provided while the first curved portion C1 and the second curved portion C2 extend from the medium facing surface 30. In this case, the neck height NH is equal to each of the distances H3 and H4.

In the embodiment the track width defining portion 16A is a portion of the pole layer 16 between the medium facing surface 30 and a cross section that passes through the straight line L5 and is parallel to the medium facing surface 30, and the wide portion 16B is the other portion of the pole layer 16.

The features of the pole layer 16 having the above-described shape will now be described. First, an ideal shape of the first surface 16C is such a shape that the first edge E1 extends along the straight lines L1 and L3 so as to pass through the point P1, and the second edge E2 extends along the straight lines L2 and L4 so as to pass through the point P2. It is extremely difficult to form the first surface 16C having such an ideal shape through the use of photolithography. In the embodiment, in the first surface 16C, each of the distances H1 and H2 falls within a range of 10 to 50 nm inclusive, where H1 is the distance from the straight line L5 to the connecting point P3 between the first curved portion C1 and the first straight portion S1, and H2 is the distance from the straight line L5 to the connecting point P4 between the second curved portion C2 and the second straight portion S2.

If the pole layer 16 is formed by photolithography, the distance H3 is nearly equal to the distance H1 while the distance H4 is nearly equal to the distance H2. In the case of forming the pole layer 16 by photolithography, the fact that each of the distances H1 and H2 falls within a range of 10 to 50 nm inclusive as previously described means that the length of each of the curved portions C1 and C2 is very short and the shape of the pole layer 16 of the embodiment is close to the above-mentioned ideal shape. Therefore, according to the embodiment, it is possible to implement a magnetic head incorporating the pole layer 16 shaped with high precision in which the first surface 16C has a nearly ideal shape.

In the embodiment the neck height NH falls within a range of 10 to 200 nm inclusive, for example, and the distances H5 and H6 each fall within a range of 10 to 190 nm inclusive, for example. This indicates that the neck height NH is small although there exist the straight portions S3 and S4 in the edges E1 and E2, the straight portions S3 and S4 extending from the medium facing surface 30 in the direction orthogonal or nearly orthogonal to the medium facing surface 30.

Although it is difficult to implement such a shape of the first surface 16C of the embodiment by patterning using typical photolithography as will be described in detail later, it is possible to implement the shape of the first surface 16C by a method of forming the pole layer 16 in the method of manufacturing the magnetic head of the embodiment.

Figure 19:
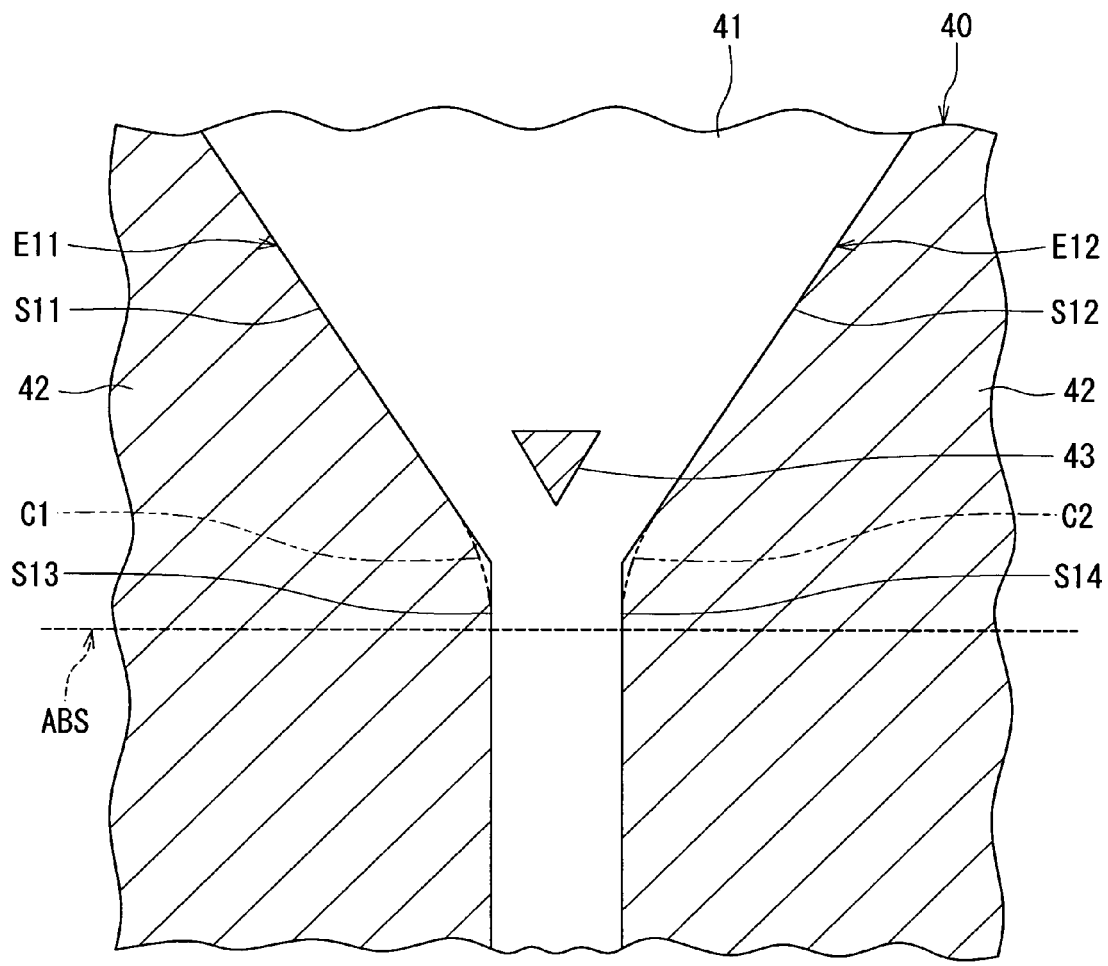
FIG. 19 is a top view illustrating a portion of the photomask of the first embodiment of the invention.
Figure 20:
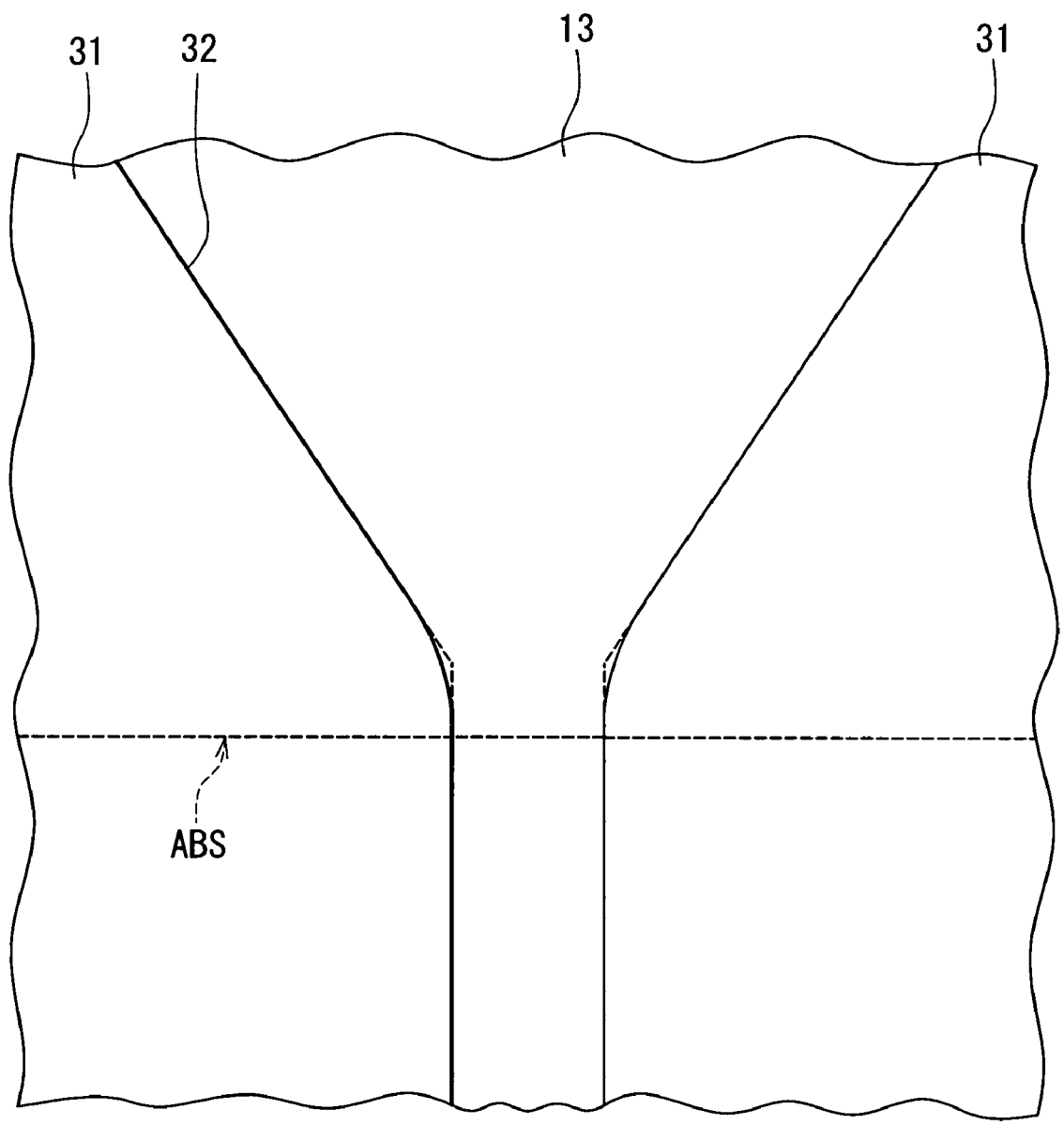
FIG. 20 is a top view illustrating a portion of a pattern used in the first embodiment of the invention.

Reference is now made to FIG. 19 and FIG. 20 to describe the method of forming the pole layer 16 of the embodiment in detail. The pole layer 16 of the embodiment corresponds to the patterned layer of the invention while the method of forming the pole layer 16 of the embodiment corresponds to the method of forming the patterned layer of the invention. As described with reference to FIG. 6, the photoresist layer 31b unpatterned is selectively exposed using the photomask 40 in the embodiment. The photomask 40 includes the first region 41, the second region 42 and the third region 43.

Reference is now made to FIG. 19 to describe the shapes of the regions 41 to 43 in detail. FIG. 19 is a top view illustrating a portion of the photomask 40. In FIG. 19 the broken line with 'ABS' indicates a region on the photomask 40 whose projection image is to be located in the region ABS. The perimeter of the first region 41 has such a shape that a projection image of the perimeter is shaped along the perimeter of the ideal shape of the first surface 16C of the pole layer 16. The ideal shape of the first surface 16C is such that, as previously described, the first edge E1 extends along the straight lines L1 and L3 so as to pass through the point P1, and the second edge E2 extends along the straight lines L2 and L4 so as to pass through the point P2. Therefore, the first region 41 has such a perimeter that a portion of the projection image of the perimeter is shaped along the first straight portion S1 and the second straight portion S2 of the first surface 16C of the pole layer 16 to be formed. To be specific, as shown in FIG. 19, the first region 41 has outer edges E11 and E12. The outer edge E11 includes a straight portion S11 corresponding to the straight portion S1 of FIG. 1, and a straight portion S13 corresponding to the straight portion S3 of FIG. 1. The outer edge E12 includes a straight portion S12 corresponding to the straight portion S2 of FIG. 1, and a straight portion S14 corresponding to the straight portion S4 of FIG. 1.

The third region 43 is placed at such a location that the projection image thereof is located near points corresponding to the points P1 and P2 of FIG. 1. The third region 43 has a portion whose projection image is to be located in a region between the first straight portion S1 and the second straight portion S2 of the first surface 16C of the pole layer 16 to be formed. In the example shown in FIG. 6, the third region 43 has such a shape that a projection image thereof is a triangle having a side located nearly parallel to the first straight portion S1 and a side located nearly parallel to the second straight portion S2. The maximum width of the third region 43 may be equal to the distance between the straight portions S13 and S14 or may be greater or smaller than this distance.

In the following step of the method of forming the pole layer 16 of the embodiment, the photoresist layer 31b is developed and a portion of the lower layer 31a is dissolved using a developer to thereby form the pattern 31 made of the developed two-layer resist layer 31P. FIG. 20 is a top view illustrating a portion of the pattern 31. The pattern 31 has the opening 32 having a shape corresponding to the groove 12a that will be formed later.

In the following step of the method of forming the pole layer 16 of the embodiment, as shown in FIG. 9, FIG. 10A and FIG. 10B, the nonmagnetic metal layer 13 is selectively etched through the use of the pattern 31. The opening 13a that penetrates is thereby formed in the nonmagnetic metal layer 13. Furthermore, a portion of the nonmagnetic layer 12P exposed from the opening 13a of the nonmagnetic metal layer 13 is selectively etched to form the groove 12a in the nonmagnetic layer 12P. The pattern 31 is then removed.

In the following step of the method of forming the pole layer 16 of the embodiment, as shown in FIG. 11, FIG. 12A and FIG. 13A, and FIG. 12B and FIG. 13B, the nonmagnetic film 14, the polishing stopper layer 15 and the pole layer 16 are formed in the opening 13a of the nonmagnetic metal layer 13 and in the groove 12a of the encasing layer 12. The pole layer 16 having the first surface 16C that has the shape of FIG. 1 is thereby formed.

Figure 21:
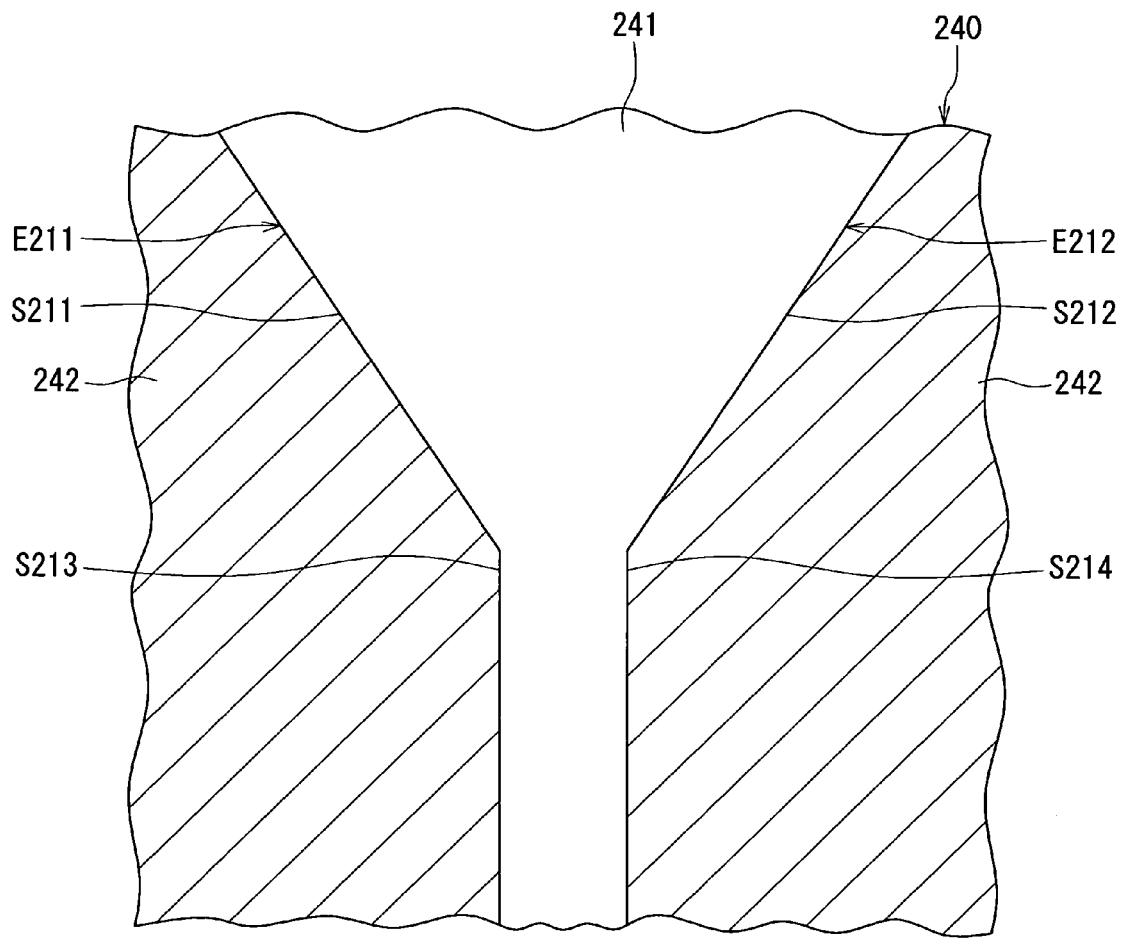
FIG. 21 is a top view illustrating a portion of a photomask of a comparative example compared with the first embodiment of the invention.
Figure 22:
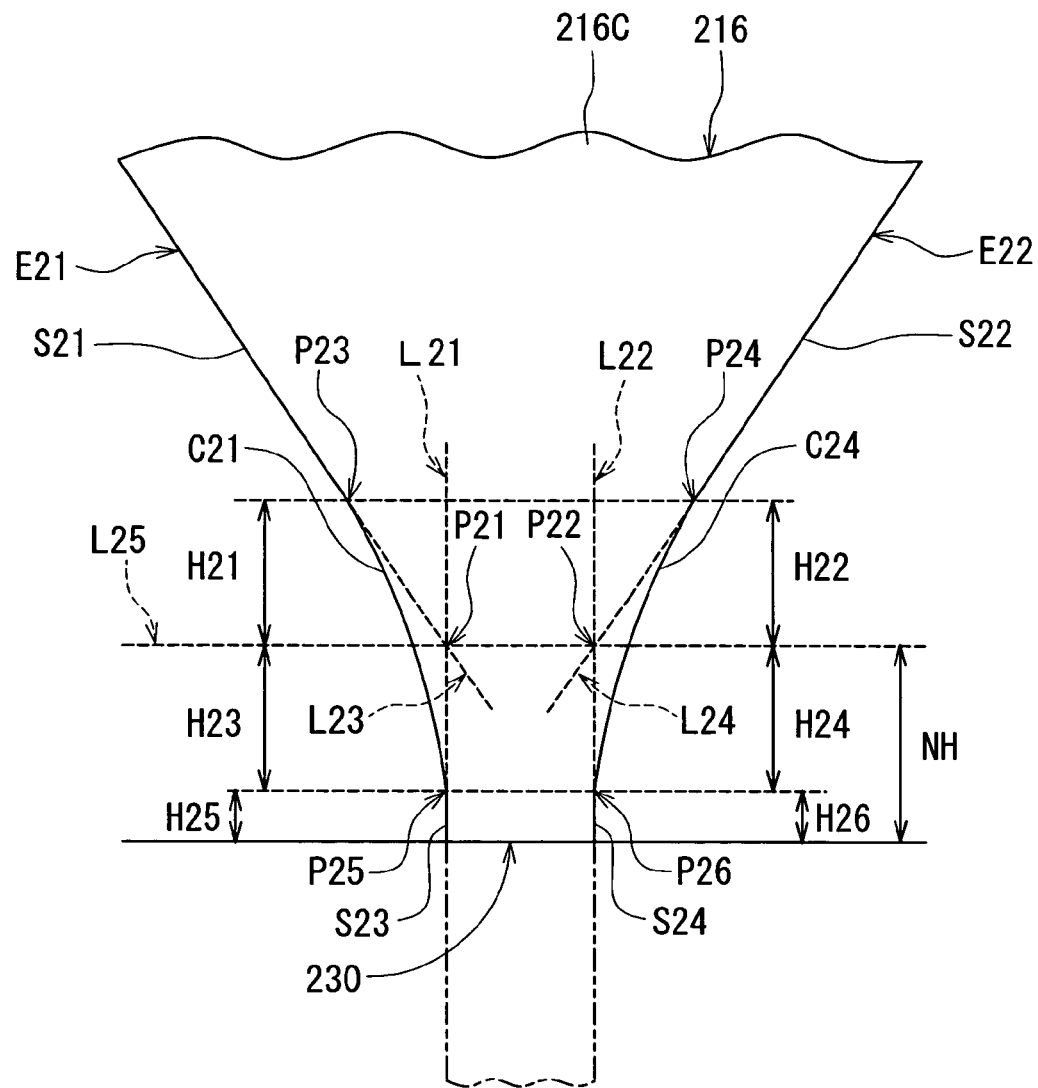
FIG. 22 is a top view illustrating a portion of a pole layer of the comparative example.

Reference is now made to FIG. 21 and FIG. 22 to describe a comparative example to be compared with the method of forming the pole layer 16 of the embodiment. The method of forming the pole layer of this comparative example is the same as the method of forming the pole layer 16 of the embodiment except that a photomask 240 of FIG. 21 is used in place of the photomask 40 of FIG. 19.

FIG. 21 is a top view illustrating a portion of the photomask 240 of the comparative example. The photomask 240 includes a first region 241 and a second region 242. The perimeter of the first region 241 has the same shape as that of the first region 41 of the photomask 40 of the embodiment. That is, the first region 241 has outer edges E211 and E212 the same as the outer edges E11 and E12 of the first region 41 of the photomask 40. The outer edge E211 includes straight portions S211 and S213 the same as the straight portions S11 and S13 of the outer edge E11. The outer edge E212 includes straight portions S212 and S214 the same as the straight portions S12 and S14 of the outer edge E12. The second region 242 touches the perimeter of the first region 241 and is located outside the first region 241. The photomask 240 does not include the third region.

FIG. 22 is a top view illustrating a portion of the pole layer 216 of the comparative example formed through the use of the photomask 240 of FIG. 21. The pole layer 216 has a first surface (top surface) 216C and a second surface (not shown) that face toward opposite directions. The first surface 216C has a first edge E21 and a second edge E22 that extend in the direction intersecting the medium facing surface 230. The space between the first edge E21 and the second edge E22 in the medium facing surface 230 defines the track width. The first edge E21 includes a first curved portion C21 and a first straight portion S21 that is contiguous to the first curved portion C21 and located farther from the medium facing surface 230 than the first curved portion C21. The second edge E22 includes a second curved portion C22 and a second straight portion S22 that is contiguous to the second curved portion C22 and located farther from the medium facing surface 230 than the second curved portion C22. The space between the first curved portion C21 and the second curved portion C22 and the space between the first straight portion S21 and the second straight portion S22 each increase as the distance from the medium facing surface 230 increases.

Here, an imaginary straight line that passes through the intersection point of the first edge E1 and the medium facing surface 230 and extends in the direction orthogonal to the medium facing surface 230 is defined as L21. An imaginary straight line that passes through the intersection point of the second edge E22 and the medium facing surface 230 and extends in the direction orthogonal to the medium facing surface 230 is defined as L22. An imaginary straight line that extends from the first straight portion S21 toward the medium facing surface 230 in the direction along the first straight portion S21 is defined as L23. An imaginary straight line that extends from the second straight portion S22 toward the medium facing surface 230 in the direction along the second straight portion S22 is defined as L24. The intersection point of the straight lines L21 and L23 is defined as P21. The intersection point of the straight lines L22 and L24 is defined as P22. An imaginary straight line that passes through the points P21 and P22 is defined as L25. The straight line L25 is located parallel to the medium facing surface 230 on the first surface 216C.

The first curved portion C21 is off the straight lines L21 and L23 so as to intersect the straight line L25 at a point along an extension of the line segment connecting the point P21 to the point P22. The second curved portion C22 is off the straight lines L22 and L24 so as to intersect the straight line L25 at a point along the extension of the line segment connecting the point P21 to the point P22. Each of distances H21 and H22 is about 0.1 to 0.16 μm, where H21 is the distance from the straight line L25 to a connecting point P23 between the first curved portion C21 and the first straight portion S21, and H22 is the distance from the straight line L25 to a connecting point P24 between the second curved portion C22 and the second straight portion S22.

The first edge E1 further includes a third straight portion S23 that connects the first curved portion C21 to the medium facing surface 230. The second edge E22 further includes a fourth straight portion S24 that connects the second curved portion C22 to the medium facing surface 230. Each of distances H23 and H24 is around 0.1 to 0.16 μm, where H23 is the distance from the straight line L25 to a connecting point P25 between the first curved portion C21 and the third straight portion S23, and H24 is the distance from the straight line L25 to a connecting point P26 between the second curved portion C22 and the fourth straight portion S24.

Here, the distance from the point P25 to the medium facing surface 230 is defined as H25, the distance from the point P26 to the medium facing surface 230 is defined as H26, and the distance from the straight line L25 to the medium facing surface 230 is defined as the neck height NH. As shown in FIG. 22, the neck height NH is greater than the distance H23 or H24 by the distance H25 or H26. Therefore, the neck height NH is greater than 0.1 μm.

According to the comparative example, the length of each of the curved portions C21 and C22 becomes greater than each of the curved portions C1 and C2 of the embodiment. The reason is that, if the photoresist layer 31b is exposed using the photomask 240 of FIG. 21, the patterned resist layer 31 goes out of a desired shape because of, for example, the effect of reflection of light off the nonmagnetic metal layer 13 that is a base of the resist layer 31. When the photoresist layer 31b is exposed using the photomask 240 of FIG. 21, in particular, overexposure occurs at a portion of the photoresist layer 31b that is located near a portion corresponding to the corner formed by the straight portions S211 and S213, and at a portion that is located near a portion corresponding to the corner formed by the straight portions S212 and S214, due to the effect of light that has passed through the large first region 241 and has been reflected off the nonmagnetic metal layer 13. As a result, in the patterned resist layer 31, corners corresponding to the above-mentioned two corners are not formed but smoothly curved surfaces are formed instead. Consequently, smoothly curved portions C21 and C24 are also formed in the pole layer 216 formed through the use of the patterned resist layer 31.

According to the embodiment, in contrast, the photomask 40 includes the third region 43 that intercepts light. The third region 43 is placed at such a location that a projection image thereof is to be located near points corresponding to the points P1 and P2 of FIG. 1. In addition, the third region 43 has the portion whose projection image is to be located in the region between the first straight portion S1 and the second straight portion S2 of the first surface 16C of the pole layer 16 to be formed. As a result, if the photoresist layer 31b is exposed using the photomask 40, overexposure due to the effect of light that has passed through the first region 241 and has been reflected off the nonmagnetic metal layer 13 is suppressed at a portion of the photoresist layer 31b that is located near a portion corresponding to the corner formed by the straight portions S11 and S13 and at a portion that is located near a portion corresponding to the corner formed by the straight portions S12 and S14. As a result, in the pole layer 16 of the embodiment, the length of each of the curved sections C1 and C2 is much smaller than that of each of the curved sections C21 and C22 of the comparative example. As thus described, according to the method of forming the pole layer 16 of the embodiment, it is possible to form the pole layer 16 wherein the curved portions C1 and C2 are very small in length and the first surface 16C has a nearly ideal shape. Therefore, according to the embodiment, the photomask 40 including the third region 43 makes it possible to precisely form the pattern for forming the pole layer 16 and it is thereby possible to manufacture magnetic heads each having the pole layer 16 shaped with higher precision.

According to the embodiment, since it is possible to reduce the length of each of the curved portions C1 and C2, it is also possible to reduce the neck height NH. It is thereby possible to improve the overwrite property.

According to the embodiment, it is possible to reduce the neck height NH while there exist the straight portions S3 and S4 in the edges E1 and E2, the straight portions S3 and S4 extending from the medium facing surface 30 in the direction orthogonal or nearly orthogonal to the medium facing surface 30. As a result, the physical track width will not greatly vary even if the level at which polishing is stopped slightly deviates when the medium facing surface 30 is formed by polishing. It is therefore possible to improve yields of magnetic heads, according to the embodiment.

According to the embodiment, since the length of each of the curved portions C1 and C2 is short, it is possible to reduce the difference between the effective track width and the physical track width. It is thereby possible to improve the SN ratio obtained when magnetic signals are written on a plurality of adjacent tracks.

Figure 23:
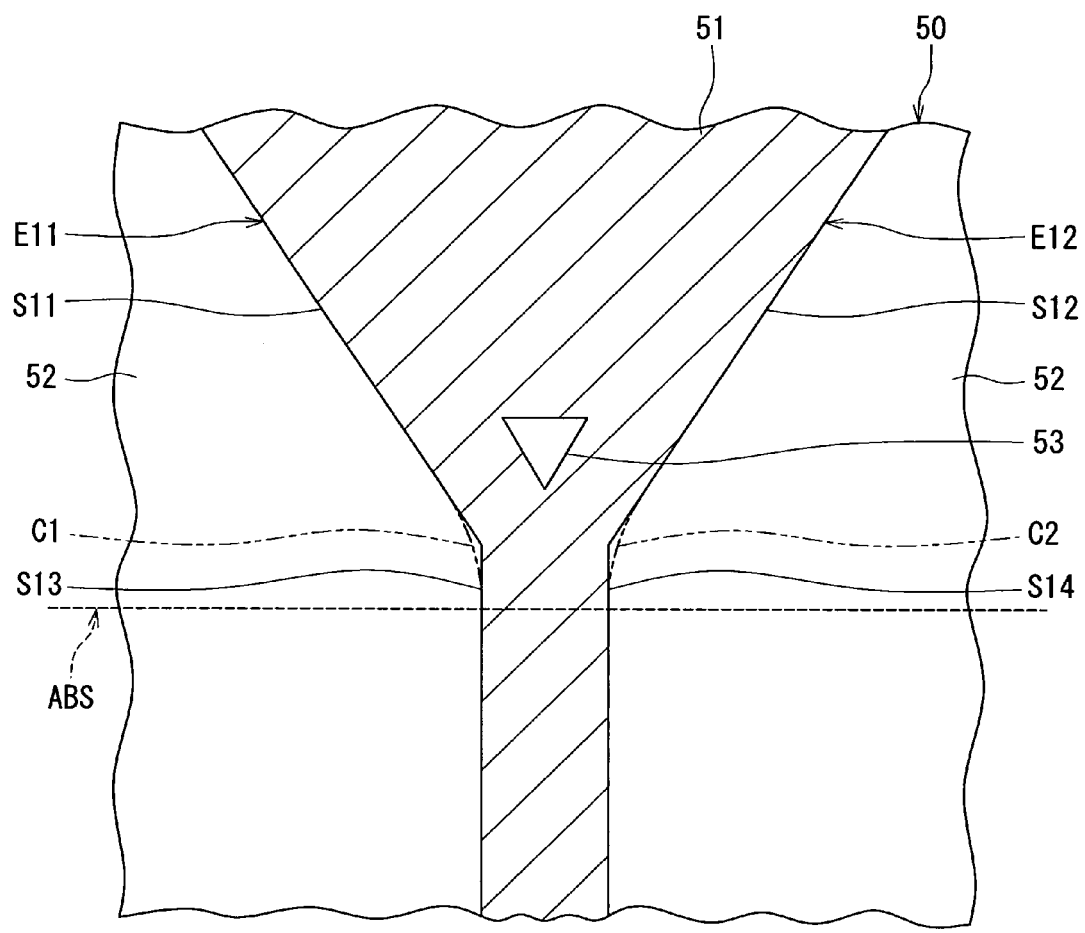
FIG. 23 is a top view illustrating a portion of a photomask of a first modification example of the first embodiment of the invention.

First to fourth modification examples of the photomask of the embodiment will now be described. FIG. 23 is a top view illustrating a portion of a photomask 50 of the first modification example. In FIG. 23 the broken line with 'ABS' indicates a region on the photomask 50 whose projection image is to be located in the region ABS. The photomask 50 of the first modification example is used in place of the photomask 40 if the photoresist layer 31b is of negative type. The photomask 50 includes a first region 51, a second region 52 and a third region 53. The first region 51 has a perimeter whose shape is the same as that of the perimeter of the first region 41 of the photomask 40. That is, the first region 41 has outer edges E11 and E12. The outer edge E11 includes a straight portion S11 corresponding to the straight portion S1 of FIG. 1, and a straight portion S13 corresponding to the straight portion S3 of FIG. 1. The outer edge E12 includes a straight portion S12 corresponding to the straight portion S2 of FIG. 1, and a straight portion S14 corresponding to the straight portion S4 of FIG. 1. The second region 52 touches the perimeter of the first region 51 and is located outside the first region 51. The third region 53 is located inside the first region 51 without touching the perimeter of the first region 51. The shape and location of the third region 53 are the same as those of the third region 43 of the photomask 40. The first region 51 has a property of intercepting light for exposure while each of the second region 52 and the third region 53 has a property of allowing light for exposure to pass.

In the first modification example, the entire photoresist layer 31b before exposure is soluble in a developer. After exposure, a portion of the photoresist layer 31b at which light having passed through the second region 52 or the third region 53 of the photomask 50 was applied during exposure becomes insoluble or solution-resistant in the developer while the other portion remains soluble in the developer. The photoresist layer 31b after exposure is developed to form an opening in the photoresist layer 31b. Furthermore, a portion of the lower layer 31a exposed from the opening of the photoresist layer 31b is dissolved in the developer to form the pattern 31.

Consideration will now be given to a case as a comparative example in which the pole layer 16 is formed using a photomask that does not include the third region 53 but only includes the first region 51 and the second region 52. If the photoresist layer 31b is exposed using the photomask without the third region 53 but including only the first region 51 and the second region 52, underexposure tends to occur at portions of the part of the photoresist layer 31b irradiated with light having passed through the second region 52, the portions being near a portion corresponding to the corner formed by the straight portions S11 and S13, and near a portion corresponding to the corner formed by the straight portions S12 and S14. As a result, in the patterned resist layer 31, corners corresponding to the above-mentioned two corners are not formed but smoothly curved surfaces are formed instead. Consequently, smoothly curved sections C21 and C24 are also formed in the pole layer 16 formed through the use of the patterned resist layer 31.

According to the first modification example, in contrast, the photomask 50 includes the third region 53 that allows light to pass. The third region 53 is placed at such a location that a projection image thereof is to be located near points corresponding to the points P1 and P2 of FIG. 1. In addition, the third region 53 has a portion whose projection image is to be located in a region between the first straight portion S1 and the second straight portion S2 of the first surface 16C of the pole layer 16 to be formed. As a result, if the photoresist layer 31b is exposed using the photomask 50, underexposure due to the effect of light that has passed through the third region 53 and has been reflected off the nonmagnetic metal layer 13 is suppressed in the above-mentioned regions likely to be underexposed. As a result, it is possible to form the pole layer 16 wherein the curved portions C1 and C2 are very small in length and the first surface 16C has a nearly ideal shape.

Figure 24:
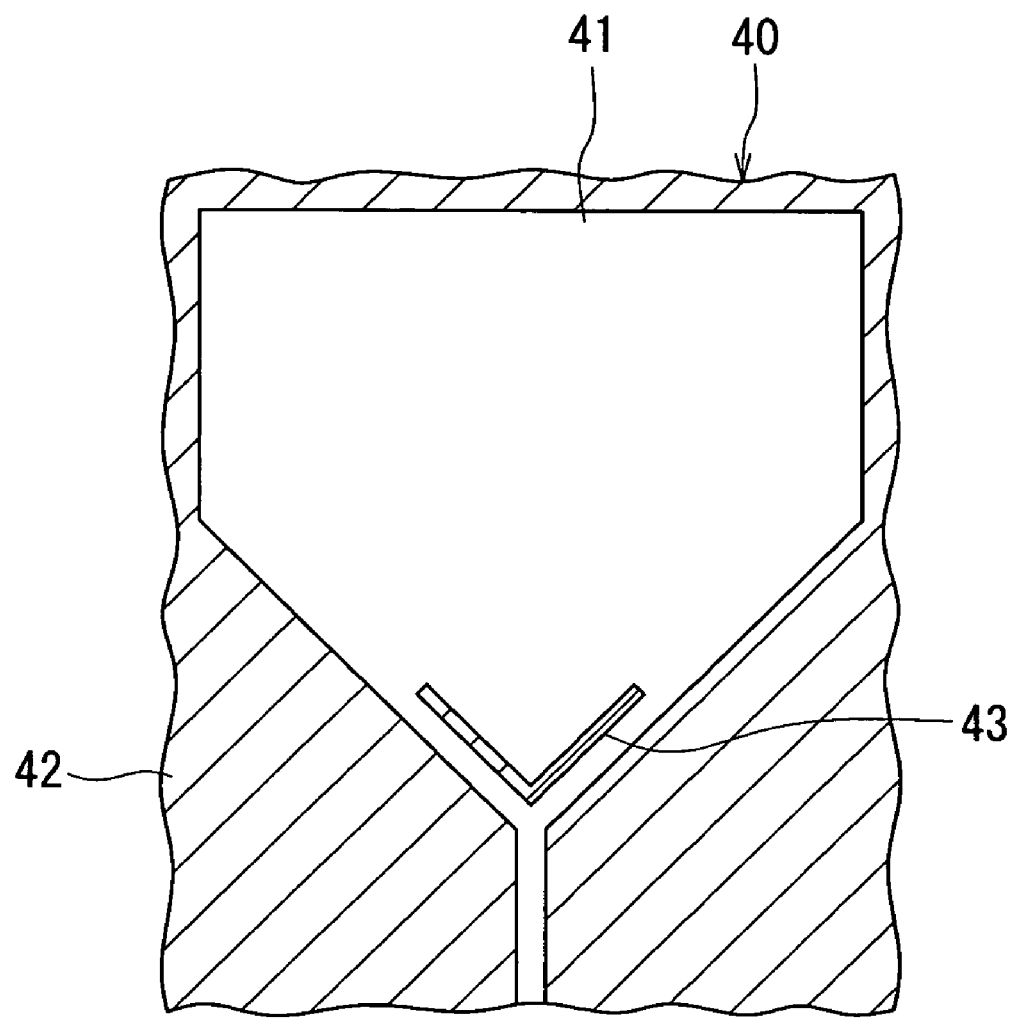
FIG. 24 is a top view illustrating a photomask of a second modification example of the first embodiment of the invention.
Figure 25:
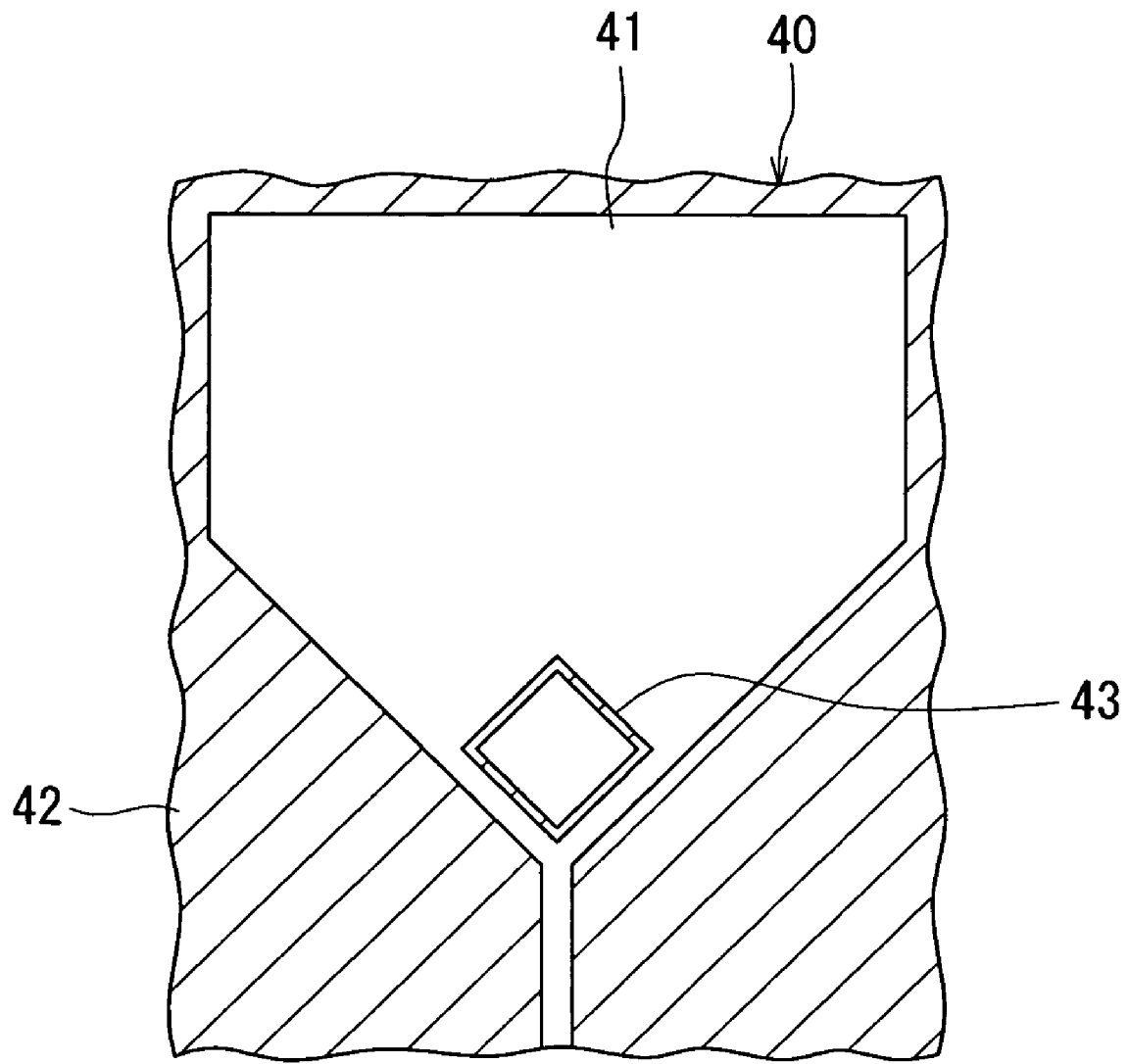
FIG. 25 is a top view illustrating a photomask of a third modification example of the first embodiment of the invention.
Figure 26:
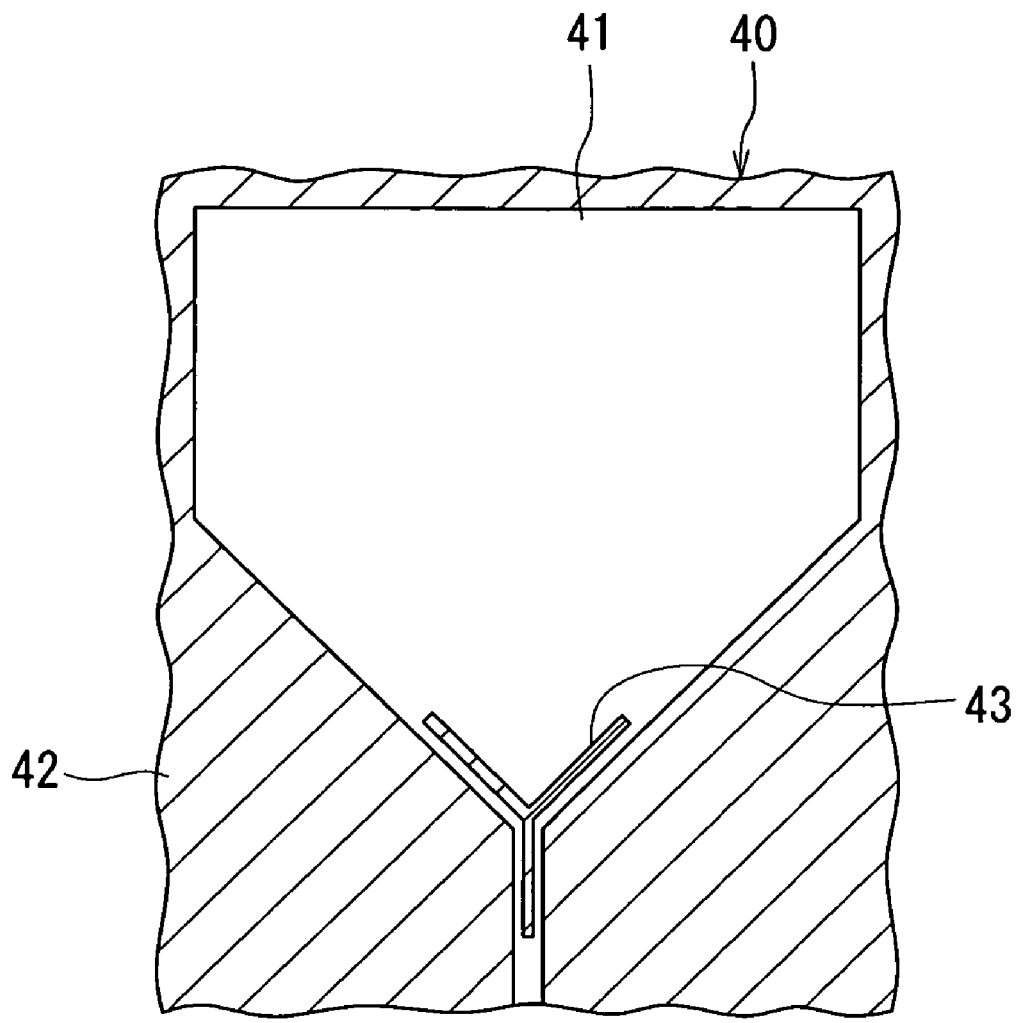
FIG. 26 is a top view illustrating a photomask of a fourth modification example of the first embodiment of the invention.

FIG. 24 is a top view illustrating the photomask 40 of the second modification example. FIG. 25 is a top view illustrating the photomask 40 of the third modification example. FIG. 26 is a top view illustrating the photomask 40 of the fourth modification example. The photomask 40 of each of the second to fourth modification examples is different from the photomask 40 shown in each of FIG. 6 and FIG. 19 only in the shape of the third region 43.

In the second modification example shown in FIG. 24, the third region 43 has such a shape that the projection image thereof has a shape of V including a portion located to be parallel to the first straight portion S1 and a portion located to be parallel to the second straight portion S2.

In the third modification example shown in FIG. 25, the third region 43 has such a shape that a projection image thereof is rectangular-frame-shaped. The projection image of the third region 43 includes a portion located to be parallel to the first straight portion S1 and a portion located to be parallel to the second straight portion S2.

In the fourth modification example shown in FIG. 26, the third region 43 has such a shape that a projection image thereof has a shape of Y including a portion located to be parallel to the first straight portion S1, a portion located to be parallel to the second straight portion S2, and a portion located between the third straight portion S3 and the fourth straight portion S4.

Second Embodiment

A magnetic head and a method of manufacturing the same of a second embodiment of the invention will now be described. In the method of the second embodiment, the photomask 40 has a shape different from that of the first embodiment. Consequently, the pole layer 16 of the magnetic head of the second embodiment has a shape different from that of the first embodiment.

Figure 27:
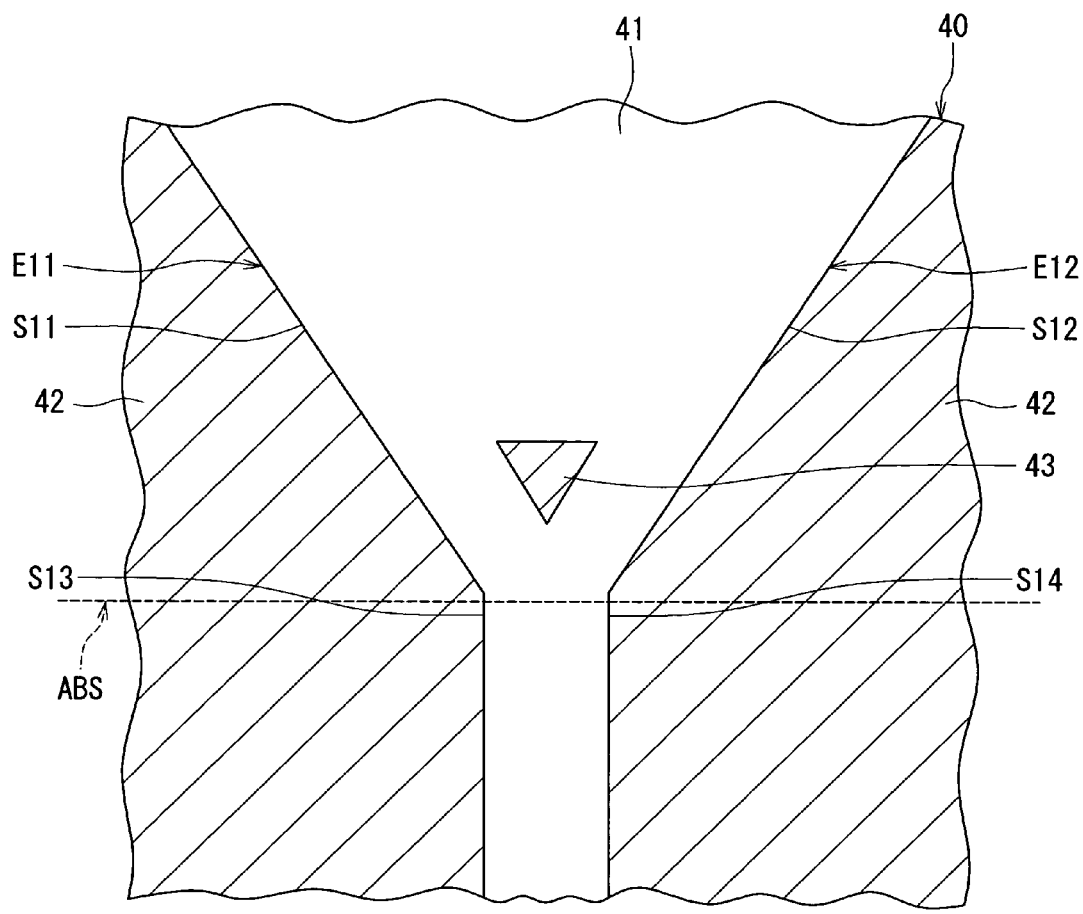
FIG. 27 is a top view illustrating a portion of a photomask of a second embodiment of the invention.

FIG. 27 is a top view illustrating a portion of the photomask 40 of the second embodiment. The photomask 40 of the second embodiment includes the first region 41, the second region 42 and the third region 43 as does the photomask 40 of the first embodiment. The third region 43 of the second embodiment has an area greater than that of the third region 43 of the first embodiment. In FIG. 27 the broken line with 'ABS' indicates a region on the photomask 40 whose projection image is to be located in the region ABS.

Figure 28:
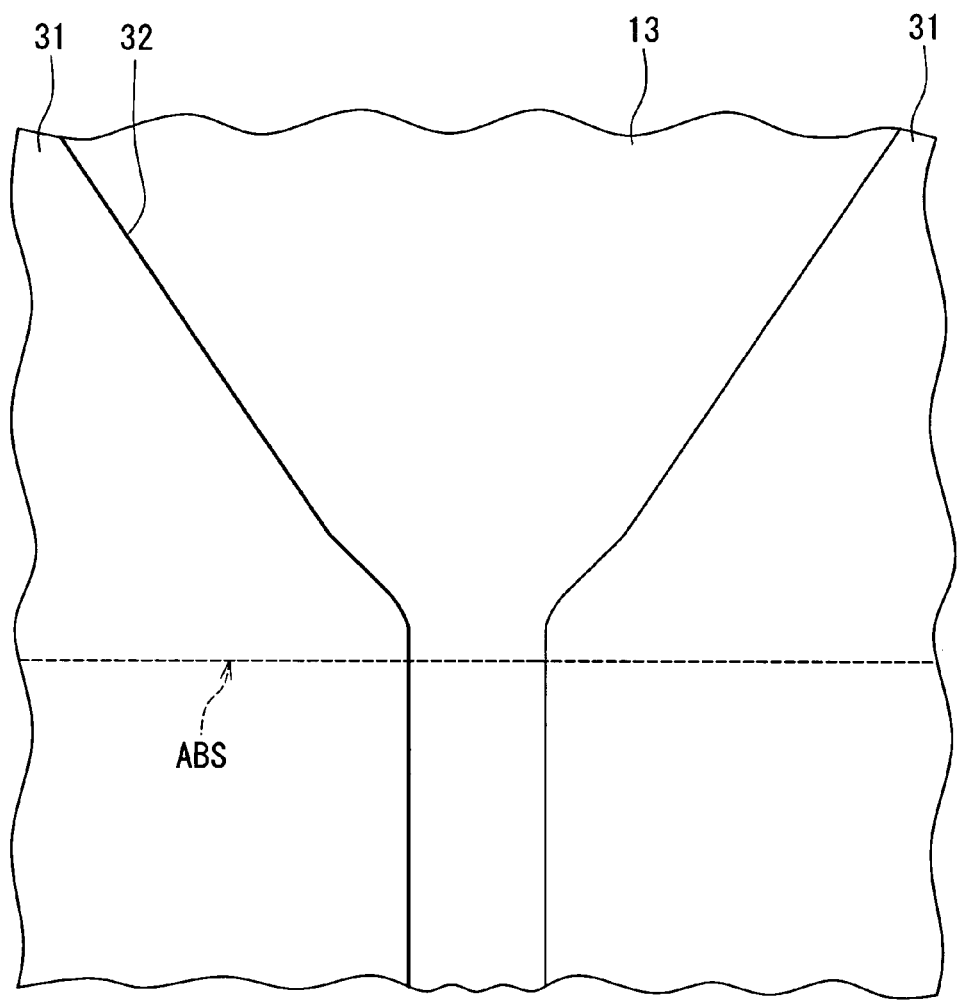
FIG. 28 is a top view illustrating a portion of a pattern used in the second embodiment of the invention.

FIG. 28 is a top view illustrating a portion of the pattern 31 formed through the use of the photomask 40 of FIG. 27. The pattern 31 has the opening 32 having a shape corresponding to the groove 12a that will be formed later.

Figure 29:
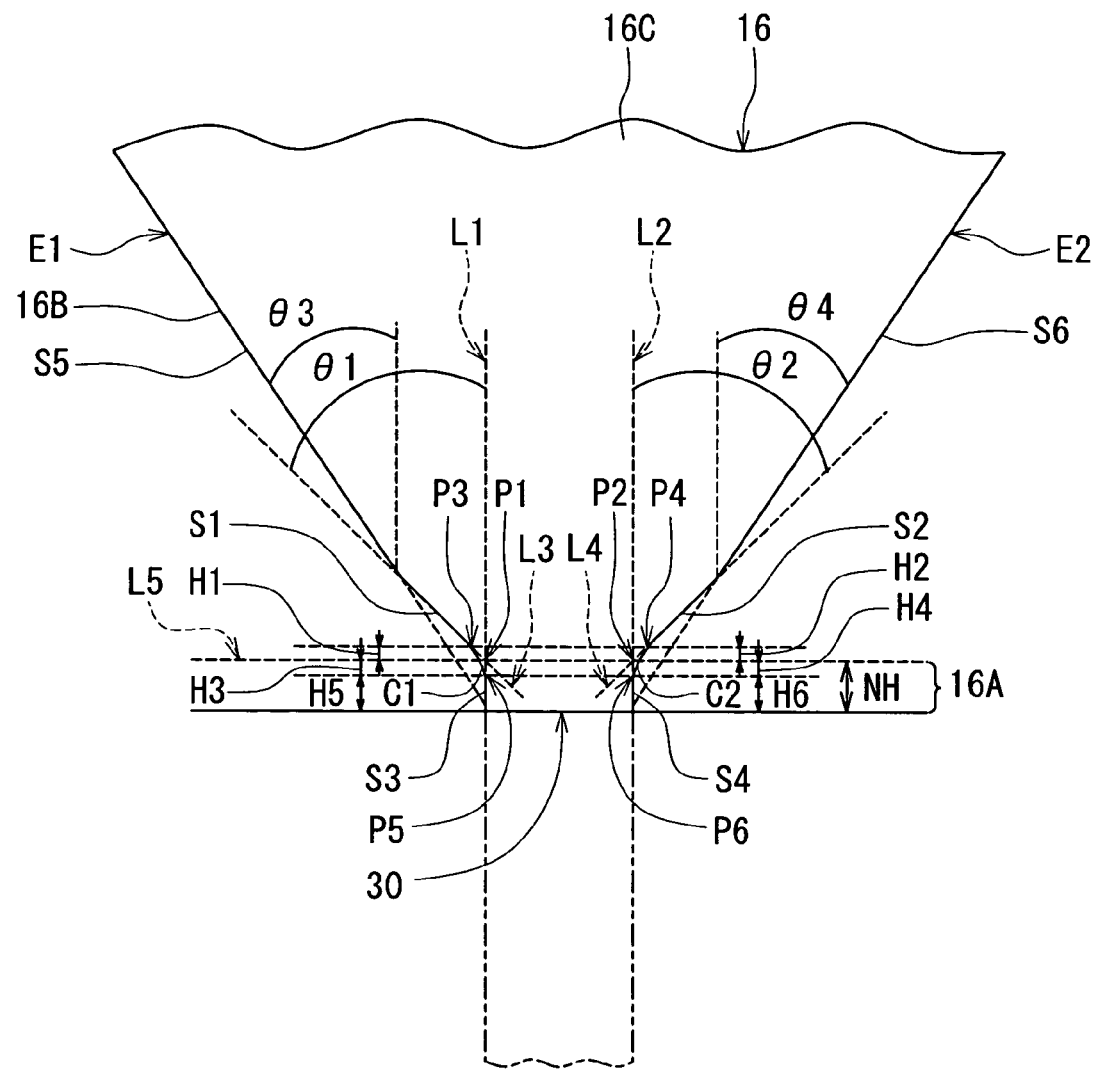
FIG. 29 is a top view illustrating a portion of a pole layer of the second embodiment of the invention.

FIG. 29 is a top view illustrating a portion of the pole layer 16 of the magnetic head of the embodiment. The pole layer 16 of the embodiment has the first surface (top surface) 16C and the second surface (not shown) that face toward opposite directions, as does the pole layer 16 of the first embodiment. The first surface 16C has the first edge E1 and the second edge E2 that extend in the direction intersecting the medium facing surface 30. The space between the first edge E1 and the second edge E2 in the medium facing surface 30 defines the track width. As in the first embodiment, the first edge E1 includes the first curved portion C1 and the first straight portion S1, and the second edge E2 includes the second curved portion C2 and the second straight portion S2. The space between the first curved portion C1 and the second curved portion C2 and the space between the first straight portion S1 and the second straight portion S2 each increase as the distance from the medium facing surface 30 increases.

It is preferred that the first edge E1 further include the third straight portion S3 that connects the first curved portion C1 to the medium facing surface 30. Similarly, it is preferred that the second edge E2 further include the fourth straight portion S4 that connects the second curved portion C2 to the medium facing surface 30. Each of the angle formed by the third straight portion S3 with respect to the straight line L1 (wherein the angle is acute one) and the angle formed by the fourth straight portion S4 with respect to the straight line L2 (wherein the angle is acute one) is 5 degrees or smaller. This means that the straight portions S3 and S4 are orthogonal or nearly orthogonal to the medium facing surface 30.

In the second embodiment the first edge E1 further includes a fifth straight portion S5 that is contiguous to the first straight portion S1 and located farther from the medium facing surface 30 than the first straight portion S1. In addition, the second edge E2 further includes a sixth straight portion S6 that is contiguous to the second straight portion S2 and located farther from the medium facing surface 30 than the second straight portion S2. The angle θ1 formed by the first straight portion S1 with respect to the direction orthogonal to the medium facing surface 30 (wherein the angle is acute one) is greater than the angle θ3 formed by the fifth straight portion S5 with respect to the direction orthogonal to the medium facing surface 30 (wherein the angle is acute one). Similarly, the angle θ2 formed by the second straight portion S2 with respect to the direction orthogonal to the medium facing surface 30 (wherein the angle is acute one) is greater than the angle θ4 formed by the sixth straight portion S6 with respect to the direction orthogonal to the medium facing surface 30 (wherein the angle is acute one).

Each of the angles θ3 and θ4 preferably falls within a range of 25 to 60 degrees inclusive, and more preferably 30 to 45 degrees inclusive. It is preferred that the angles θ3 and θ4 be equal. Each of the angles θ1 and θ2 preferably falls within a range of 25 to 60 degrees inclusive, and more preferably 30 to 45 degrees inclusive. It is preferred that the angles θ1 and θ2 be equal. Each of the angles θ3 and θ4 may be 30 degrees and each of the angles θ1 and θ2 may be 45 degrees, for example.

An angle formed by a tangent to the first curved portion C1 with respect to the direction orthogonal to the medium facing surface 30 (wherein the angle is acute one) is equal to or smaller than the angle θ1, and decreases as the distance from the medium facing surface 30 to the location of the contact point of the first curved portion C1 and the tangent decreases. Similarly, an angle formed by a tangent to the second curved portion C2 with respect to the direction orthogonal to the medium facing surface 30 (wherein the angle is acute one) is equal to or smaller than the angle θ2, and decreases as the distance from the medium facing surface 30 to the location of the contact point of the second curved portion C2 and the tangent decreases.

Here, definitions of the straight lines L1 to L5, the points P1 to P6, the distances H1 to H6, and the neck height NH are the same as those of the first embodiment.

As in the first embodiment, the first curved portion C1 is off the straight lines L1 and L3 so as to intersect the straight line L5 at a point along the extension of the line segment connecting the point P1 to the point P2. The second curved portion C2 is off the straight lines L2 and L4 so as to intersect the straight line L5 at a point along the extension of the line segment connecting the point P1 to the point P2. The distances H1 and H2 each fall within a range of 10 to 50 nm inclusive.

In the embodiment the neck height NH preferably falls within a range of 10 to 200 nm inclusive. It is preferred that each of the distances H5 and H6 fall within a range of 10 to 190 nm inclusive. In the embodiment such a configuration is possible that the third straight portion S3 and the fourth straight portion S4 are not provided while the first curved portion C1 and the second curved portion C2 extend from the medium facing surface 30. In this case, the neck height NH is equal to each of the distances H3 and H4.

It is possible to implement the shape of the first surface 16C of the pole layer 16 of the embodiment through the use of the photomask 40 of FIG. 27. In the photomask 40 of FIG. 27, the third region 43 is placed at such a location that the projection image thereof is to be located near points corresponding to the points P1 and P2 of FIG. 29. The third region 43 has a portion whose projection image is to be located in a region between the first straight portion S1 and the second straight portion S2 of the first surface 16C of the pole layer 16 to be formed. In the example shown in FIG. 27, the third region 42 has such a shape that a projection image thereof is a triangle having a side that extends in the direction nearly parallel to the fifth straight portion S5 and that is placed at a location opposed to the first straight portion S1, and a side that extends in the direction nearly parallel to the sixth straight portion S6 and that is placed at a location opposed to the second straight portion S2.

The third region 43 of the second embodiment has an area greater than that of the third region 43 of the first embodiment. As a result, if the photoresist layer 31b is exposed using the photomask 40 of the second embodiment, the amount of exposure is smaller than in the first embodiment at a portion of the photoresist layer 31b that is located near a portion corresponding to the corner formed by the straight portions S11 and S13, and at a portion that is located near a portion corresponding to the corner formed by the straight portions S12 and S14. As a result, in the second embodiment, as shown in FIG. 28, the shape of the edge of the opening 32 of the pattern 31 becomes a shape corresponding to the edges E1 and E2 of the pole layer 16 of FIG. 29. The pole layer 16 having the shape shown in FIG. 29 is then formed by using the pattern 31.

According to the second embodiment, it is possible to make the angles θ1 and θ2 greater than those of the first embodiment. Furthermore, it is possible to reduce the length of each of the curved portions C1 and C2 by making the angles θ1 and θ2 greater. Therefore, according to the second embodiment, it is possible to achieve at least one of a reduction in the neck height NH and an increase in the distances H5 and H6 as compared with the first embodiment. If the neck height NH is reduced, it is possible to further improve the overwrite property. If the distances H5 and H6 are made greater, it is possible to further reduce variation in physical track width. In addition, according to the second embodiment, since it is possible to make the length of each of the curved portions C1 and C2 smaller as compared with the first embodiment, it is possible to further reduce the difference between the effective track width and the physical track width. It is thereby possible to improve the SN ratio obtained when magnetic signals are written on a plurality of adjacent tracks.

In the second embodiment, instead of making the area of the third region 43 greater than that of the first embodiment, the location of the third region 43 may be made closer to the corner formed by the straight portions S11 and S13 of the outer edge E11 of the first region 41 and the corner formed by the straight portions S12 and S14 of the outer edge E12 of the first region 41, compared with the first embodiment. It is possible to form the pole layer 16 having the shape of FIG. 29 in this case, too.

In the second embodiment it is possible to control the shapes of the edges E1 and E2 of the first surface 16C of the pole layer 16 by controlling the area and location of the third region 43. The remainder of configuration, function and effects of the second embodiment are similar to those of the first embodiment.

Third Embodiment

A magnetic head and a method of manufacturing the same of a third embodiment of the invention will now be described. In the method of the third embodiment, the photomask 40 has a shape different from that of the first embodiment. Consequently, the pole layer 16 of the magnetic head of the third embodiment has a shape different from that of the first embodiment.

Figure 30:
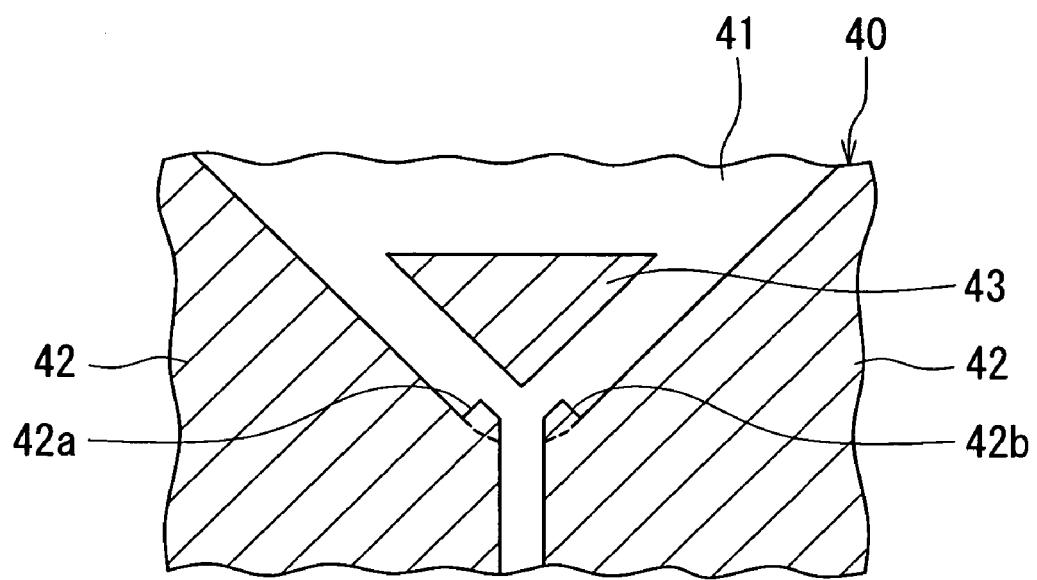
FIG. 30 is a top view illustrating a portion of a photomask of a third embodiment of the invention.
Figure 31:
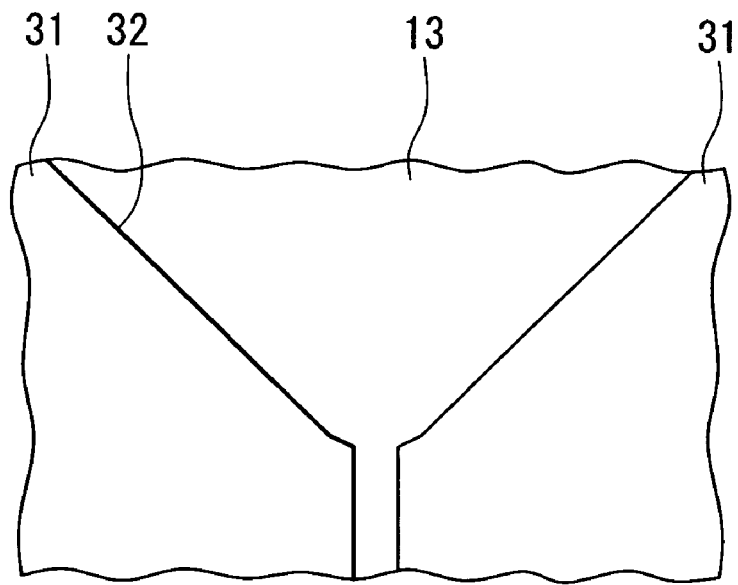
FIG. 31 is a top view illustrating a portion of a pattern used in the third embodiment of the invention.
Figure 32:
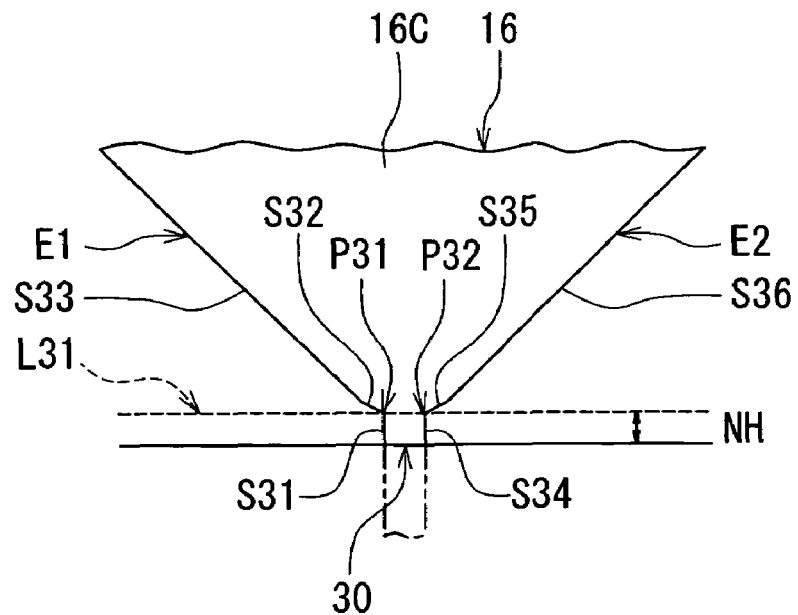
FIG. 32 is a top view illustrating a portion of a pole layer of the third embodiment of the invention.

FIG. 30 is a top view illustrating a portion of the photomask 40 of the third embodiment. FIG. 31 is a top view illustrating a portion of the pattern 31 formed through the use of the photomask 40 of FIG. 30. FIG. 32 is a top view illustrating a portion of the pole layer 16 of the magnetic head of the third embodiment.

As shown in FIG. 32, the pole layer 16 of the third embodiment has the first surface (top surface) 16C and the second surface (not shown) that face toward opposite directions, as does the pole layer 16 of the first embodiment. The first surface 16C has the first edge E1 and the second edge E2 that extend in the direction intersecting the medium facing surface 30. The space between the first edge E1 and the second edge E2 in the medium facing surface 30 defines the track width. The first edge E1 and the second edge E2 do not include curved portions, which is different from the first embodiment.

The first edge E1 includes: a straight portion S31 having an end located in the medium facing surface 30; a straight portion S32 having an end connected to the other end of the straight portion S31; and a straight portion S33 having an end connected to the other end of the straight portion S32. Similarly, the second edge E2 includes: a straight portion S34 having an end located in the medium facing surface 30; a straight portion S35 having an end connected to the other end of the straight portion S34; and a straight portion S36 having an end connected to the other end of the straight portion S35.

The angle formed by each of the straight portions S31 and S34 with respect to the direction orthogonal to the medium facing surface 30 (wherein the angle is acute one) is 5 degrees or smaller. The space between the straight portions S32 and S35 and the space between the straight portions S33 and S36 each increase as the distance from the medium facing surface 30 increases. The angle formed by each of the straight portions S33 and S36 with respect to the direction orthogonal to the medium facing surface 30 (wherein the angle is acute one) preferably falls within a range of 25 to 60 degrees inclusive, and more preferably 30 to 45 degrees inclusive. In addition, it is preferred that these angles be equal. The angle formed by each of the straight portions S32 and S35 with respect to the direction orthogonal to the medium facing surface 30 is greater than the angle formed by each of the straight portions S33 and S36 with respect to the direction orthogonal to the medium facing surface 30, and is equal to or smaller than 90 degrees.

Here, a connecting point between the straight portions S31 and S32 is defined as P31. A connecting point between the straight portions S34 and S35 is defined as P32. An imaginary straight line passing through the points P31 and P32 is defined as L31. The straight line L31 is parallel to the medium facing surface 30. In the third embodiment the distance from the straight line L31 to the medium facing surface 30 is defined as the neck height NH.

As shown in FIG. 30, the photomask 40 of the third embodiment includes the first region 41, the second region 42 and the third region 43. The first region 41 has such a perimeter that a portion of a projection image of the perimeter is shaped along the straight portions S31, S33, S34 and S36 of the first surface 16C of the pole layer 16 to be formed. The second region 42 touches the perimeter of the first region 41 and is located outside the first region 41. The third region 43 is located inside the first region 41 without touching the perimeter of the first region 41. The third region 43 is triangle-shaped as in the first and second embodiments. The first region 41 has a property of allowing light for exposure to pass while each of the second region 42 and the third region 43 has a property of intercepting light for exposure.

The second region 42 of the third embodiment has two portions 42a and 42b whose projection images are to protrude inward from the locations of the first edge E1 and the second edge E2 of the first surface 16C of the pole layer 16 to be formed. The two portions 42*a* and 42*b* are placed at such locations that the projection images thereof are to be placed near locations corresponding to the straight portions S32 and S35. The pattern 31 of FIG. 31 is formed by using the photomask 40 of FIG. 30. The pattern 31 has the opening 32 having a shape corresponding to the groove 12*a* that will be formed later.

In the third embodiment, when the photoresist layer 31*b* is exposed through the use of the photomask 40, the amount of exposure is smaller in portions of the photoresist layer 31*b* corresponding to the portions 42*a* and 42*b*, compared with a case in which the second region 42 does not include the portions 42*a* and 42*b*. Furthermore, in these portions, exposure under the influence of light having passed through the first region 41 and having been reflected off the nonmagnetic metal layer 13 is suppressed by the function of the third region 43. Because of these functions, according to the third embodiment, the pole layer 16 is formed such that the edges E1 and E2 of the first surface 16C include the straight portions S32 and S35, respectively, as shown in FIG. 32.

The pole layer 16 of the third embodiment has a shape similar to that of the pole layer 16 of the second embodiment. That is, the shapes of the edges E1 and E2 of the third embodiment can be regarded as such shapes that the curved portions C1 and C2 are eliminated from the edges E1 and E2 of the second embodiment to connect the straight portions S1 and S3 to each other and the straight portions S2 and S4 to each other. Therefore, the third embodiment is capable of providing effects the same those of the second embodiment.

Figure 33:
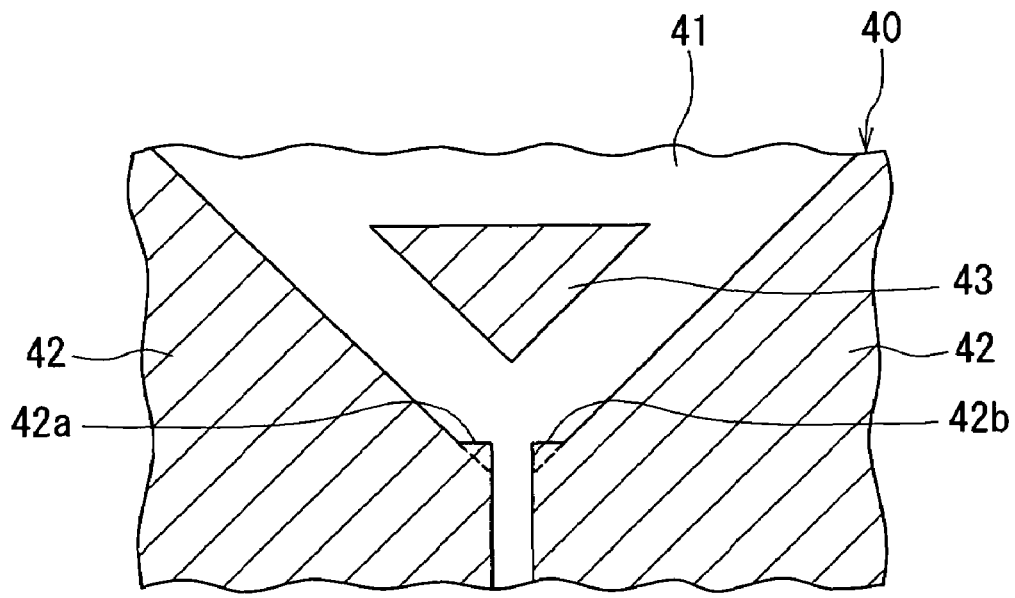
FIG. 33 is a top view illustrating a portion of a photomask of a first modification example of the third embodiment of the invention.
Figure 34:
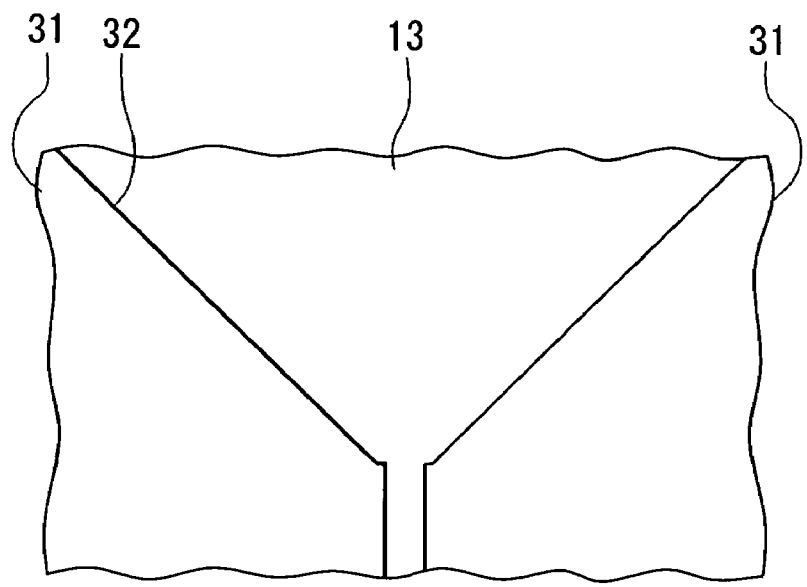
FIG. 34 is a top view illustrating a portion of a pattern used in the first modification example of the third embodiment of the invention.
Figure 35:
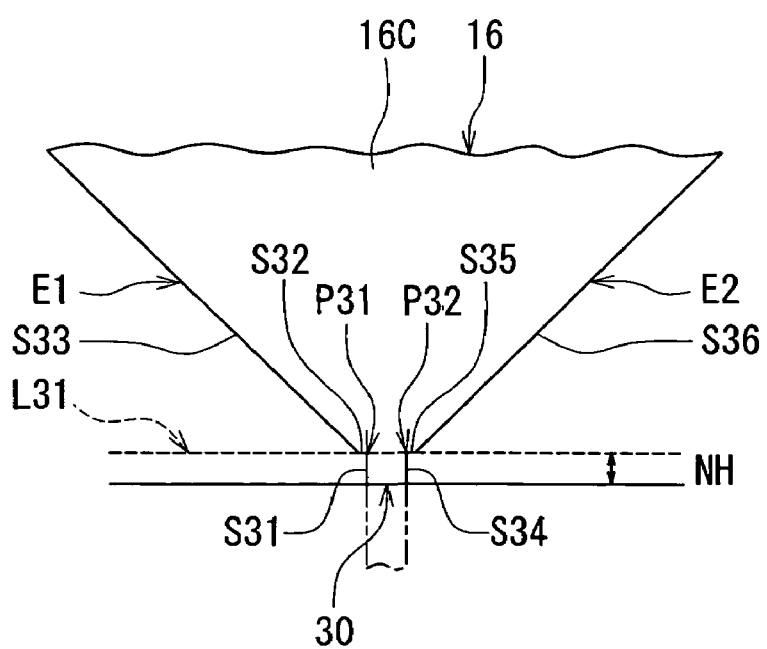
FIG. 35 is a top view illustrating a portion of a pole layer of the first modification example of the third embodiment of the invention.
Figure 36:
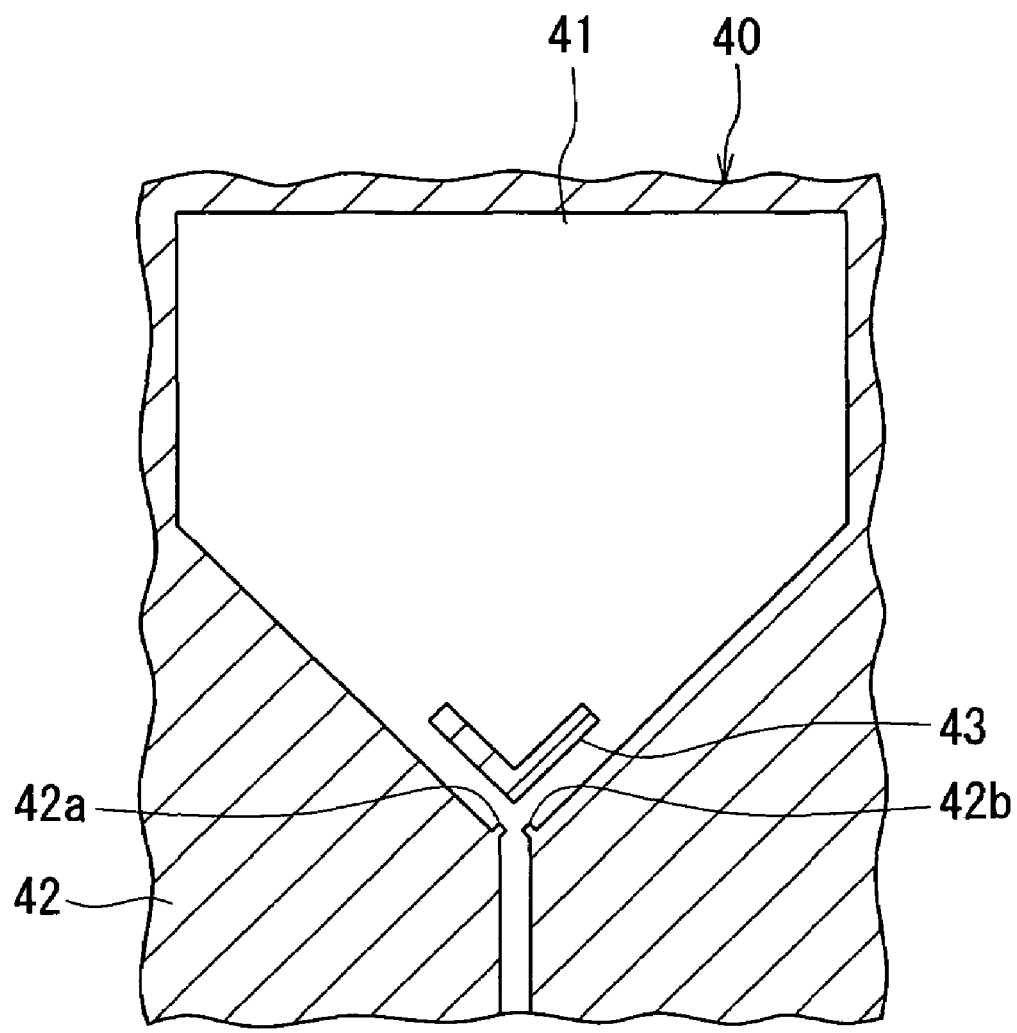
FIG. 36 is a top view illustrating a photomask of a second modification example of the third embodiment of the invention.
Figure 37:
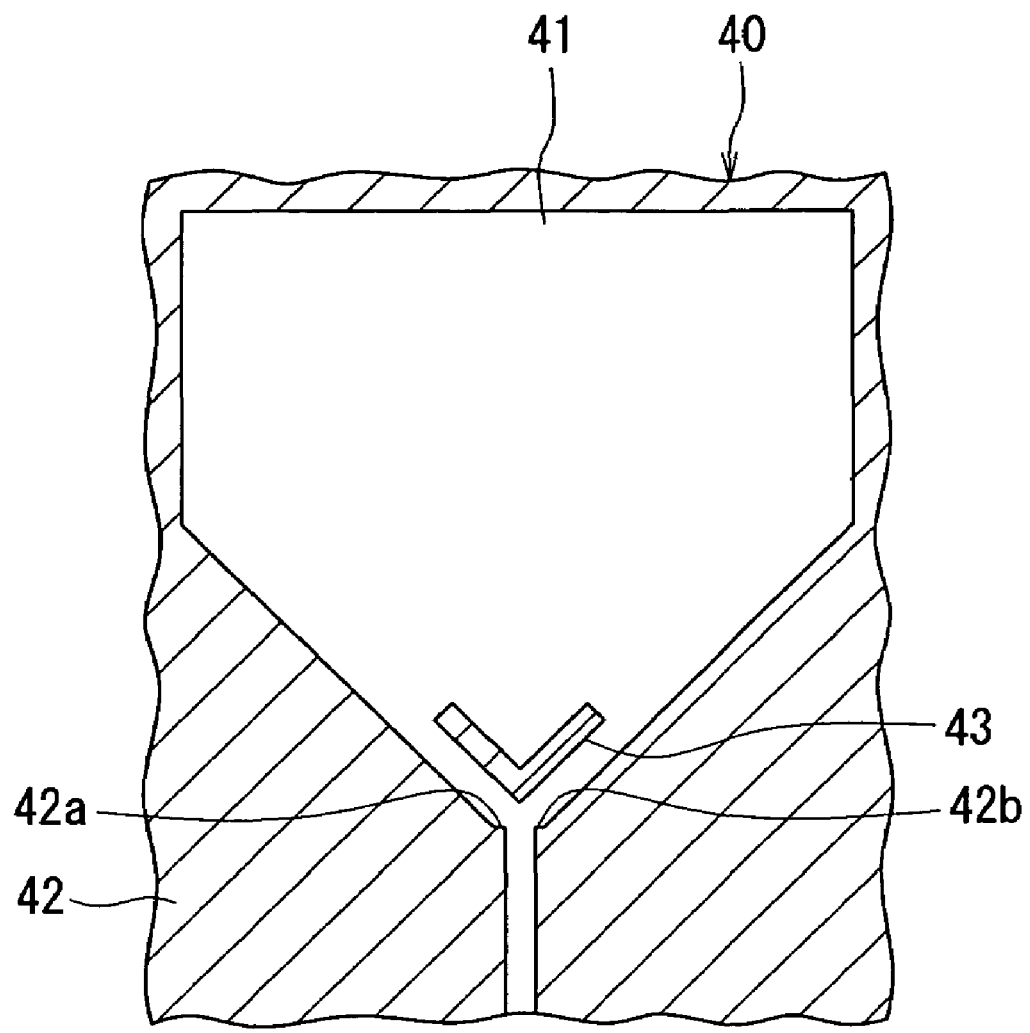
FIG. 37 is a top view illustrating a photomask of a third modification example of the third embodiment of the invention.
Figure 38:
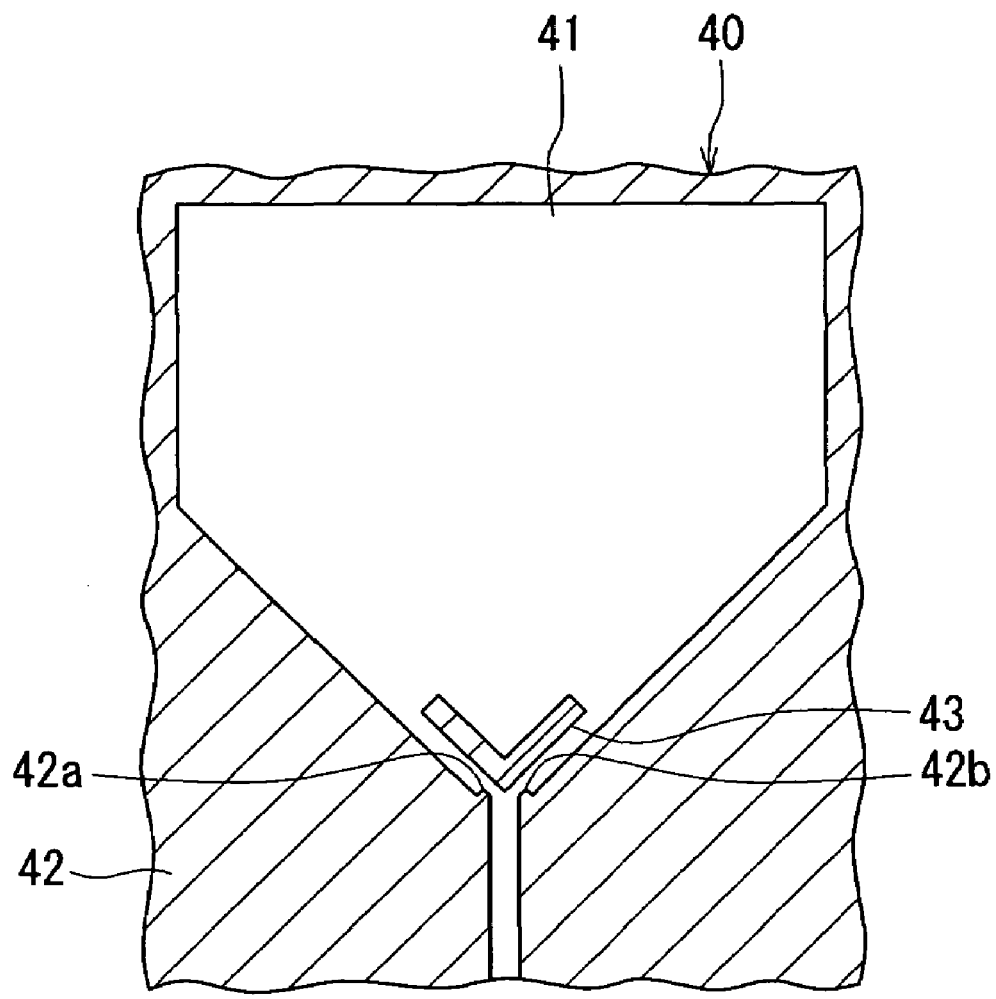
FIG. 38 is a top view illustrating a photomask of a fourth modification example of the third embodiment of the invention.
Figure 39:
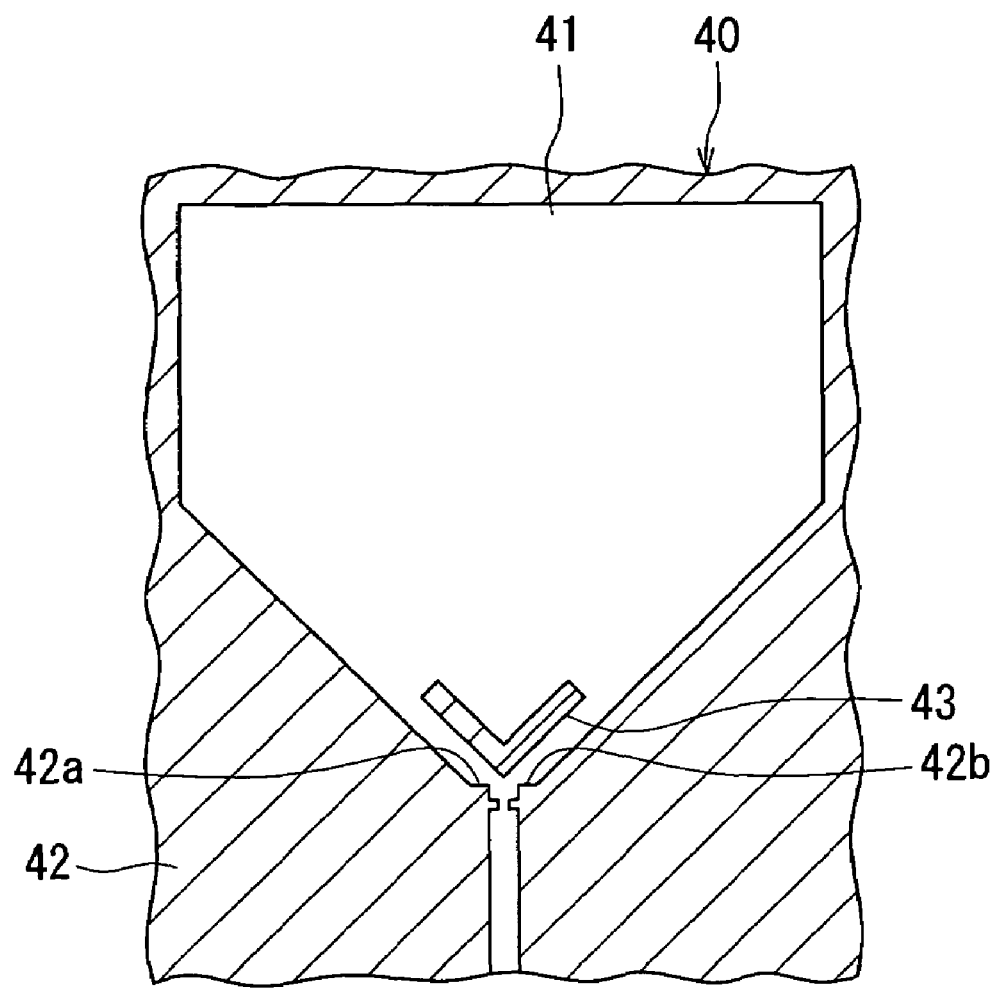
FIG. 39 is a top view illustrating a photomask of a fifth modification example of the third embodiment of the invention.

FIG. 33 to FIG. 35 illustrate a first modification example of the third embodiment. FIG. 33 is a top view illustrating a portion of the photomask 40 of the first modification example. FIG. 34 is a top view illustrating a portion of the pattern 31 formed through the use of the photomask 40 of FIG. 33. FIG. 35 is a top view illustrating a portion of the pole layer 16 of the first modification example.

As shown in FIG. 33, in the first modification example, the portions 42*a* and 42*b* of the second region 42 have shapes different from those of the example shown in FIG. 30. The pattern 31 of FIG. 34 is formed by using the photomask 40 of FIG. 33. The pattern 31 has the opening 32 having a shape corresponding to the groove 12*a* that will be formed later. Furthermore, the pole layer 16 of FIG. 35 is formed by using the pattern 31. In the pole layer 16 an angle of 90 degrees is formed by each of the straight portions S32 and S35 with respect to the direction orthogonal to the medium facing surface 30.

Each of FIG. 36 to FIG. 39 is a top view illustrating the photomask 40 of second to fifth modification examples of the third embodiment. In the second to fifth modification examples, the third region 43 is V-shaped as in the second modification example of the first embodiment. In the second to fifth modification examples, the portions 42*a* and 42*b* of the second region 42 are different in shape from each other.

In the third embodiment, it is possible to control the shapes of the edges E1 and E2 of the first surface 16C of the pole layer 16 by controlling the shapes of the portions 42*a* and 42*b* of the second region 42 and the shape of the third region 43. The remainder of configuration, function and effects of the third embodiment are similar to those of the first embodiment.

Fourth Embodiment

Figure 40:
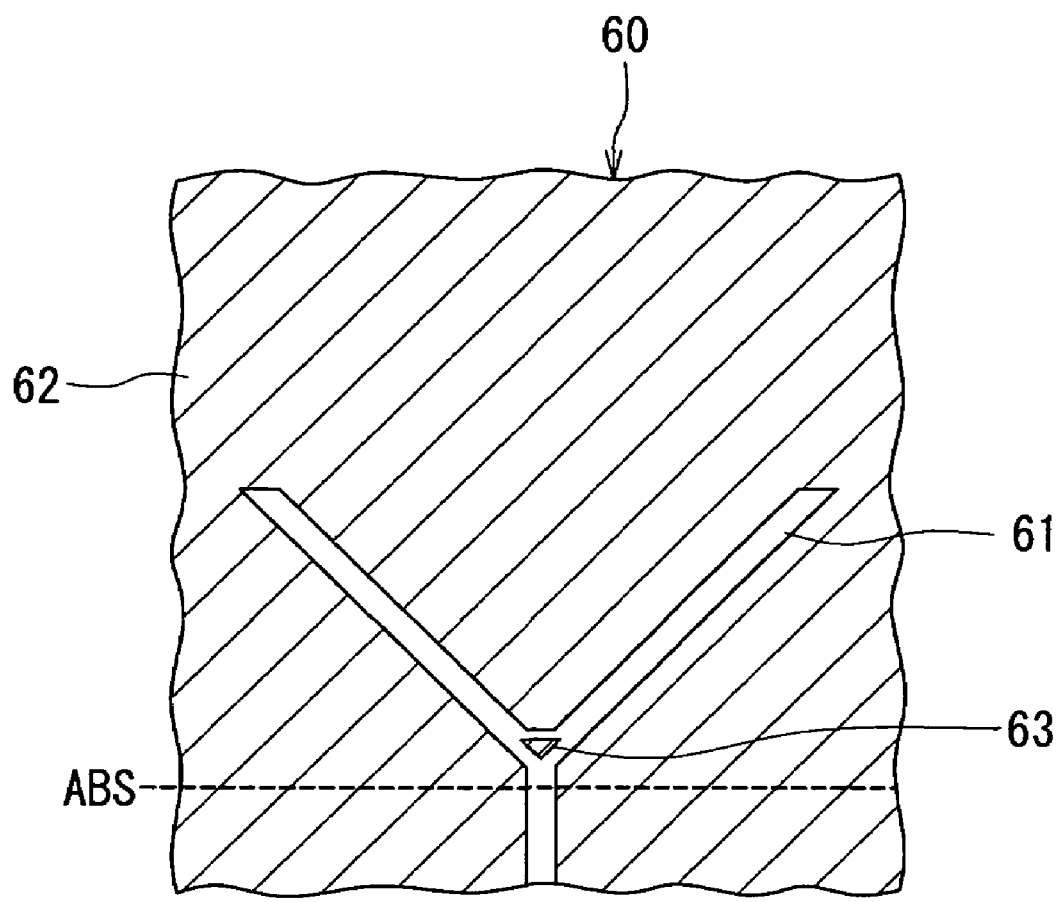
FIG. 40 is a top view illustrating a photomask used in a first exposure step of a fourth embodiment of the invention.
Figure 41:
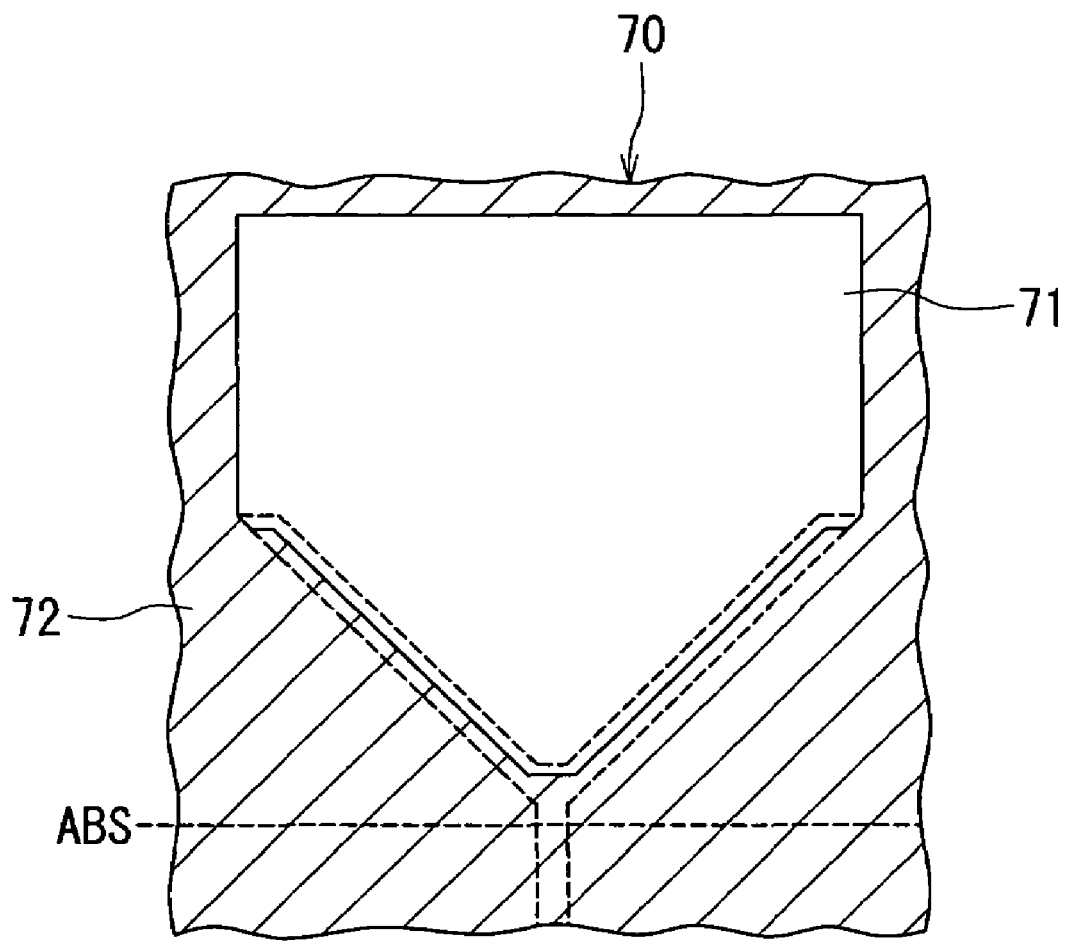
FIG. 41 is a top view illustrating a photomask used in a second exposure step of the fourth embodiment of the invention.
Figure 42:
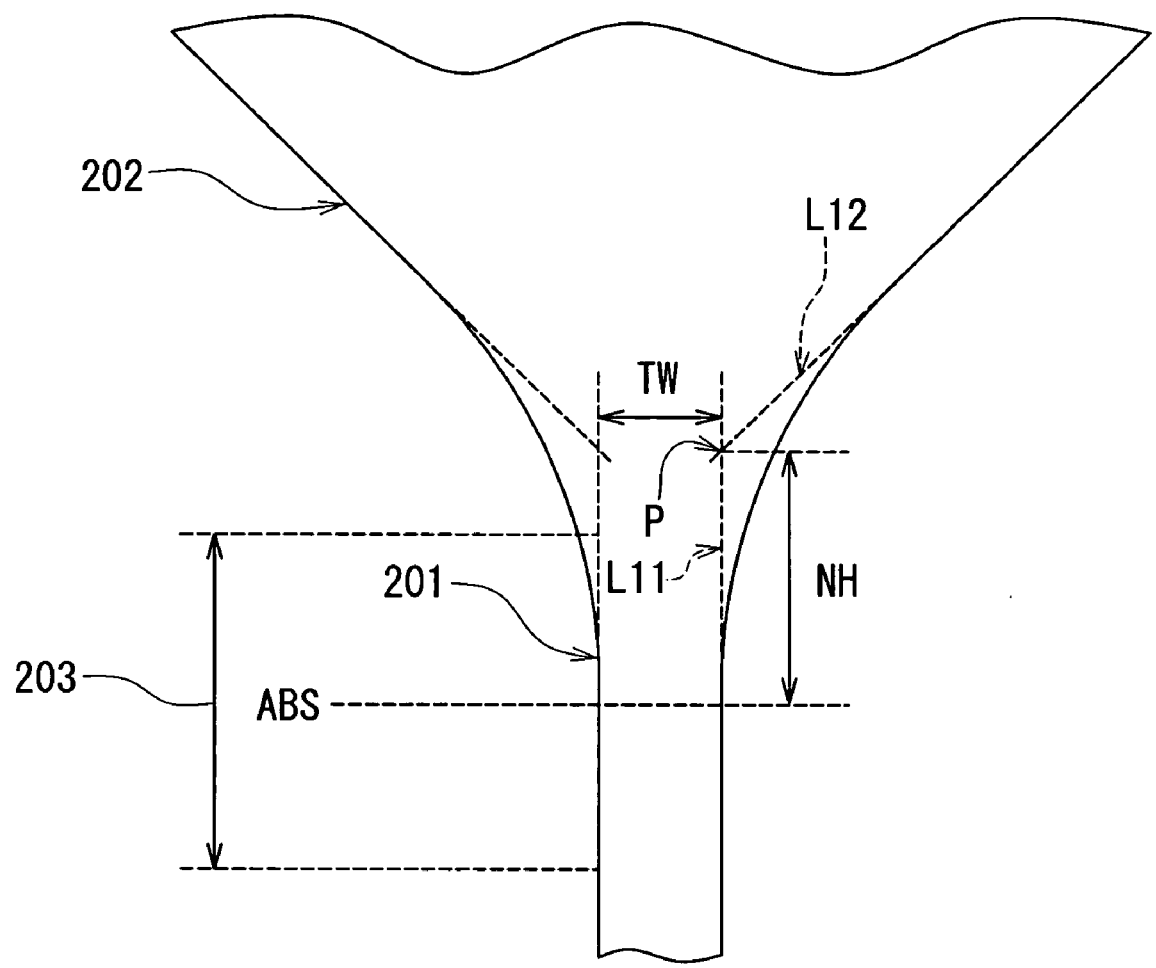
FIG. 42 is a view for illustrating an example of shape of a top surface of a pole layer of a magnetic head.

A fourth embodiment of the invention will now be described. In a method of manufacturing a magnetic head of the fourth embodiment, the step of exposing the photoresist layer 31*b* unpatterned includes a first exposure step and a second exposure step. FIG. 40 is a top view illustrating a photomask 60 used in the first exposure step. FIG. 41 is a top view illustrating a photomask 70 used in the second exposure step. In FIG. 40 and FIG. 41 the broken lines with 'ABS' indicate regions on the photomasks 60 and 70 whose projection images are to be located in the region ABS.

The photomask 60 includes a first region 61, a second region 62 and a third region 63. The first region 61 of the fourth embodiment has such a shape that the projection image thereof has a shape of Y including a portion extending along the straight portion S1 of the first surface 16C of the pole layer 16, a portion extending along the straight portion S2 of the first surface 16C, and a portion corresponding to the track width defining portion 16A of the pole layer 16. The second region 62 touches the perimeter of the first region 61, and is located outside the first region 61. The third region 63 is located inside the first region 61 without touching the perimeter of the first region 61. The first region 61 has a property of allowing light for exposure to pass while each of the second region 62 and the third region 63 has a property of intercepting light for exposure.

The photomask 70 includes a first region 71 and a second region 72. The first region 71 has such a shape that a projection image thereof covers a portion of a region corresponding to the wide portion 16B of the pole layer 16 wherein the portion is not covered with the projection image of the first region 61 of the photomask 60. The second region 72 touches the perimeter of the first region 71, and is located outside the first region 71. The first region 71 has a property of allowing light for exposure to pass while the second region 72 has a property of intercepting light for exposure.

In the fourth embodiment, the first exposure step using the photomask 60 of FIG. 40 and the second exposure step using the photomask 70 of FIG. 41 are performed to expose the photoresist layer 31*b* unpatterned. The shapes of portions of the first surface 16C of the pole layer 16 that is required to be formed with precision are defined mainly in the first exposure step. The first region 61 of the photomask 60 has an area smaller than that of the first region 41 of the photomask 40 of the first embodiment. As a result, in the first exposure step, effects of reflection of light, for example, reflected off the nonmagnetic metal layer 13 as the base of the resist layer 31 are reduced, compared with the case in which exposure is performed using the photomask 40. Therefore, according to the fourth embodiment, it is possible to make the shape of the first surface 16C of the pole layer 16 closer to an ideal shape.

The order of the first and second exposure steps of the fourth embodiment is changeable. The remainder of configuration, function and effects of the fourth embodiment are similar to those of the first embodiment.

The present invention is not limited to the foregoing embodiments but may be practiced in still other ways. For example, in any of the second to fourth embodiments, a negative photoresist layer 31*b* may be used, and a photomask in which the portion allowing light to pass and the portion intercepting light are the reverse of the photomask used when the positive photoresist layer 31*b* is used may be employed, as in the first modification example of the photomask of the first embodiment.

A coil wound around the pole layer 16 in a helical manner may be provided in any of the embodiments in place of the flat-whorl-shaped coils 9 and 23.

In the foregoing embodiments, at least a portion of the pole layer 16 is formed in the groove 12*a* of the encasing layer 12. However, the pole layer of the invention is not limited to the one formed in such a manner but may be formed otherwise. For example, the pole layer may be formed by patterning a magnetic layer by etching, or may be formed by frame plating. To form the pole layer by frame plating, as in the first to fourth embodiments, it is possible to form a pattern having an opening and to form the pole layer in the opening by plating. To form the pole layer by patterning a magnetic layer through etching, a pattern having a shape corresponding to the shape of the first surface of the pole layer to be formed is first formed, and then a portion of the magnetic layer that is not covered with the pattern is removed by etching. It is thereby possible to form the pole layer. The pattern used in this case can also be formed by photolithography using the photomask shown in any of the first to fourth embodiments.

While the magnetic head disclosed in the embodiments has such a configuration that the read head is formed on the base body and the write head is stacked on the read head, it is also possible that the read head is stacked on the write head.

The magnetic head and the method of manufacturing the same of the invention are applicable not only to magnetic heads for perpendicular magnetic recording but also to magnetic heads for longitudinal magnetic recording.

The method of forming a patterned layer of the invention is applicable not only to the case of forming the pole layer of a magnetic head but also to cases of forming a variety of types of patterned layers other than the pole layer. The method of forming a patterned layer of the invention is characterized in that a pattern for forming the patterned layer is formed through the use of the photomask defined according to the invention. Therefore, in the method of forming a patterned layer of the invention, a variety of types of methods as will now be described may be employed as the method of forming a patterned layer through the use of a pattern for forming the patterned layer.

For example, to form a patterned layer by etching, a pattern is first formed on a layer unpatterned. Next, a portion of the layer unpatterned that is not covered with the pattern is removed by etching, and the patterned layer is thereby formed.

To form a patterned layer by lift-off, a pattern having an opening is first formed on a base layer. Next, a film to be the patterned layer is formed on entire surfaces of the base layer and the pattern by a method such as sputtering. Next, the pattern is lifted off, and the patterned layer is thereby formed.

To form a patterned layer by damascene, a pattern having an opening is first formed on a base layer. Next, a groove is formed by etching in a portion of the top surface of the base layer that is not covered with the pattern. Next, a film to be the patterned layer is formed on entire surfaces of the base layer and the pattern by a method such as sputtering. Next, the pattern is lifted off, and the patterned layer is thereby formed. To form a patterned layer by damascene, a groove may be formed in the top surface of a base layer by using a pattern, and then the pattern may be lifted off. In this case, a film to be the patterned layer is then formed on the entire top surface of the base layer, which is followed by polishing of the top surface of this film, and the patterned layer is thereby formed.

Obviously many modifications and variations of the present invention are possible in the light of the above teachings. It is therefore to be understood that within the scope of the appended claims the invention may be practiced otherwise than as specifically described.

What is claimed is:

1. A magnetic head comprising:
a medium facing surface that faces toward a recording medium;
a coil for generating a magnetic field corresponding to data to be written on the recording medium; and
a pole layer having an end face located in the medium facing surface, allowing a magnetic flux corresponding to the field generated by the coil to pass therethrough, and generating a write magnetic field for writing the data on the recording medium, wherein:
the pole layer has a first surface and a second surface that face toward opposite directions;
the first surface has a first edge and a second edge that extend in a direction intersecting the medium facing surface;
a space between the first and second edges in the medium facing surface defines a track width;
the first edge includes: a first curved portion; and a first straight portion that is contiguous to the first curved portion and is located farther from the medium facing surface than the first curved portion;
the second edge includes: a second curved portion; and a second straight portion that is contiguous to the second curved portion and is located farther from the medium facing surface than the second curved portion; and
a space between the first and second curved portions and a space between the first and second straight portions increase as a distance from the medium facing surface increases;
assuming that: an imaginary straight line that passes through an intersection point of the first edge and the medium facing surface and extends in a direction orthogonal to the medium facing surface is defined as L1; an imaginary straight line that passes through an intersection point of the second edge and the medium facing surface and extends in the direction orthogonal to the medium facing surface is defined as L2; an imaginary straight line that extends from the first straight portion toward the medium facing surface in a direction along the first straight portion is defined as L3; an imaginary straight line that extends from the second straight portion toward the medium facing surface in a direction along the second straight portion is defined as L4; an intersection point of the straight lines L1 and L3 is defined as P1; an intersection point of the straight lines L2 and L4 is defined as P2; and an imaginary straight line that passes through the points P1 and P2 is defined as L5,
the straight line L5 is located parallel to the medium facing surface on the first surface;
the first curved portion is off the straight lines L1 and L3 so as to intersect the straight line L5 at a point along an extension of a line segment connecting the point P1 to the point P2;
the second curved portion is off the straight lines L2 and L4 so as to intersect the straight line L5 at a point along the extension of the line segment connecting the point P1 to the point P2; and
a distance from the straight line L5 to a connecting point between the first curved portion and the first straight portion and a distance from the straight line L5 to a connecting point between the second curved portion and the second straight portion each fall within a range of 10 to 50 nm inclusive.

2. The magnetic head according to claim 1, wherein:
the first edge further includes a third straight portion that connects the first curved portion to the medium facing surface;
the second edge further includes a fourth straight portion that connects the second curved portion to the medium facing surface;

each of an angle formed by the third straight portion with respect to the straight line L1 and an angle formed by the fourth straight portion with respect to the straight line L2 is 5 degrees or smaller;

a distance from the straight line L5 to the medium facing surface falls within a range of 10 to 200 nm inclusive; and a distance from the medium facing surface to a connecting point between the first curved portion and the third straight portion and a distance from the medium facing surface to a connecting point between the second curved portion and the fourth straight portion each fall within a range of 10 to 190 nm inclusive.

3. The magnetic head according to claim 1, wherein:

the first edge further includes a fifth straight portion that is contiguous to the first straight portion and located farther from the medium facing surface than the first straight portion;

the second edge further includes a sixth straight portion that is contiguous to the second straight portion and located farther from the medium facing surface than the second straight portion;

an angle formed by the first straight portion with respect to the direction orthogonal to the medium facing surface is greater than an angle formed by the fifth straight portion with respect to the direction orthogonal to the medium facing surface; and an angle formed by the second straight portion with respect to the direction orthogonal to the medium facing surface is greater than an angle formed by the sixth straight portion with respect to the direction orthogonal to the medium facing surface.

4. The magnetic head according to claim 1, wherein the write magnetic field generated by the pole layer is one used for writing data on the recording medium by means of a perpendicular magnetic recording system.

* * * * *

UNITED STATES PATENT AND TRADEMARK OFFICE
CERTIFICATE OF CORRECTION

PATENT NO.       : 7,656,612 B2                              Page 1 of 1
APPLICATION NO.  : 11/443048
DATED            : February 2, 2010
INVENTOR(S)      : Sasaki et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 830 days.

Signed and Sealed this

Thirtieth Day of November, 2010

David J. Kappos
*Director of the United States Patent and Trademark Office*